(12) United States Patent
Ueno

(10) Patent No.: US 7,358,592 B2
(45) Date of Patent: Apr. 15, 2008

(54) SEMICONDUCTOR DEVICE

(75) Inventor: Tohru Ueno, Hyogo (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 11/069,594

(22) Filed: Mar. 2, 2005

(65) Prior Publication Data

US 2005/0236676 A1    Oct. 27, 2005

(30) Foreign Application Priority Data

Mar. 2, 2004    (JP) ............................. 2004-057115

(51) Int. Cl.
*H01L 27/08* (2006.01)

(52) U.S. Cl. ...................... 257/536; 257/577; 257/379; 257/363; 257/359; 257/E27.047

(58) Field of Classification Search ................ 257/359, 257/363, 379, 536, 577, E27.047
See application file for complete search history.

(56) References Cited

U.S. PATENT DOCUMENTS 6,140,236 A * 10/2000 Restaino et al. ............ 438/687
6,272,736 B1 * 8/2001 Lee ............................. 29/620
7,053,454 B1 * 5/2006 Cappellani et al. ......... 257/408

FOREIGN PATENT DOCUMENTS

| JP | 58-170 | 1/1983 |
|---|---|---|
| JP | 58-148443 | 9/1983 |
| JP | 61-100956 | 5/1986 |
| JP | 62-45701 | 9/1987 |
| JP | 63-174336 | 7/1988 |
| JP | 01-239956 | 9/1989 |
| JP | 01-244649 | 9/1989 |
| JP | 02-012859 | 1/1990 |
| JP | 02-027727 | 1/1990 |
| JP | 02-181919 | 7/1990 |
| JP | 04-061360 | 1/1992 |
| JP | 04-044259 | 2/1992 |
| JP | 04-064235 | 2/1992 |
| JP | 04-065823 | 3/1992 |
| JP | 05-094990 | 4/1993 |
| JP | 07-078747 | 3/1995 |
| JP | 8-124729 | 5/1996 |
| JP | 09-092648 | 4/1997 |
| JP | 2699559 | 9/1997 |
| JP | 2932940 | 5/1999 |
| JP | 11-195711 | 7/1999 |
| JP | 3185677 | 5/2001 |
| JP | 2002-124639 | 4/2002 |
| JP | 2002-261237 | 9/2002 |

* cited by examiner

*Primary Examiner*—Evan Pert
*Assistant Examiner*—Victor A. Mandala, Jr.
(74) *Attorney, Agent, or Firm*—Dickstein Shapiro LLP

(57) ABSTRACT

A semiconductor integrated circuit device having a metal thin-film resistance includes a lower insulation film formed over a semiconductor substrate via another lawyer, a metal interconnection pattern formed on the lower insulation film, an underlying insulation film formed on the lower insulation film and the metal interconnection pattern, and a contact hole formed in said underlying insulation film on the metal interconnection pattern, wherein the metal thin-film resistance is formed so as to extend from a top surface of the underlying insulation film to the contact hole in electrical contact with the metal interconnection pattern in the contact hole, at least a part of constituting elements of the semiconductor integrated circuit other than the metal thin-film resistance is disposed in a region underneath the metal thin-film resistance.

11 Claims, 38 Drawing Sheets

SEMICONDUCTOR DEVICE

BACKGROUND OF THE INVENTION

The Present invention relates to semiconductor devices and more particularly to a semiconductor device having an integrated circuit including therein a metal film resistance.

Resistance elements constitute an important part of analog integrated circuit.

Particularly, a resistance element of a metal thin-film (called hereinafter as metal thin-film resistance) attracts attention in view of its small temperature dependence of the resistance value (TCR).

For the material of such metal thin-film resistance, chromium-silicon (CrSi), nickel chromium (NiCr), tantalum nitride (TaN), chromium silicide (CrSi$_2$), chromium silicide nitride (CrSiN), chromium silicon oxy (CrSiO), and the like, are used.

With a semiconductor device having such a metal thin-film resistance, it is generally practiced to form the metal thin-film resistance with very small thickness of 1000 Angstroms or less in order to meet for the demand of high integration density and for higher sheet resistance.

Conventionally, following methods are known for achieving electrical connection with a metal thin-film resistance:

1) Directly connecting a metal interconnection pattern to the metal thin-film resistance (Patent Reference 1);

2) Forming an interlayer insulation film after formation of the metal thin-film resistance; forming a contact hole in the interlayer insulation film; and connect a metal interconnection via the foregoing contact hole (Patent Reference 2 and Patent Reference 3).

3) Forming a barrier layer on the metal thin-film resistance and connecting a metal interconnection to such a barrier film (Patent Reference 4 and Patent Reference 5); and 4) Forming an electrode in a contact hole formed in an insulation film, forming a resistance film on the insulation film, and forming a pattern of the resistance body by applying an anisotropic etching process to the resistance film such that the resistance pattern makes a contact with the electrode (Patent Reference 1).

Hereinafter, the method of achieving electrical connection to the metal thin-film resistance of the prior art 1)-4) above will be explained with reference to FIG. 42.

1) Referring to FIG. 42, the method of forming a metal interconnection directly on the metal thin-film resistance will be explained.

First, a first interlayer insulation film 5 is formed on a silicon substrate 1 still in the form of wafer but already formed with a device isolation oxide 3 and transistors (not illustrated), and a metal thin-film resistance 101 is formed on the first layer interlayer insulation film 5. Further, a metal film is formed on the entire surface of the first layer interlayer insulation film 5 including the metal thin-film resistance 101 for the purpose of interconnection, and a first layer metal interconnection pattern 103 is formed by patterning the metal film by using a wet etching process.

Here, it should be noted that, in the general fabrication process of semiconductor devices, a dry etching process is used for etching a metal film for formation of interconnection pattern, while in the present case, there exists a metal thin film resistance 101 of small film thickness right underneath the metal film to be patterned, and thus, it is not possible to use the dry etching process, as such a dry etching process causes etching of the metal thin film resistance 101 at the time of the overetching process. Thus, there is a need of forming the first layer metal interconnection pattern 103 by patterning the metal film for interconnection by using a wet etching process.

2) Next, with reference to FIG. 43, the method of forming an interlayer insulation film after formation of the metal thin-film resistance and connecting a metal interconnection by forming a contact hole in such an interlayer insulation film will be explained.

In this process, the device isolation oxide 3 the first interlayer insulation film 5 and the metal thin-film resistance 101 are formed on a silicon substrate 1, and a CVD (chemical vapor deposition) oxide film 105 is formed on the first layer interlayer insulation film 5 including the metal thin-film resistance 101 as an interlayer insulation film to the metal interconnection. Further, a resist pattern having a resist opening in correspondence to both end parts of the metal thin-film resistance 101 is formed on the CVD oxide film 105 for formation of the contact hole used for connection to metal interconnection patterns, and the CVD oxide film 105 is removed selectively by a wet etching process while using the resist pattern as a mask, to form a contact hole 107. After removal of the resist pattern, a metal film of AlSiCu for interconnection is formed on the CVD oxide film 105 so as to include the contact hole 107. By patterning the metal film, a first layer metal interconnection pattern 109 is formed.

In general fabrication process of semiconductor devices, a dry etching process is used generally for formation of such a contact hole 107. In the case in which the thickness of the metal thin-film resistance 101 is smaller than 1000 Angstroms, however, it is difficult to prevent the contact hole 107 to penetrate through the thin metal thin-film resistance 107, and thus, it is necessary to use a wet etching process for the formation of the contact hole 107.

3) Next, the method of forming a barrier film on a metal thin-film resistance and connect a metal interconnection so such a barrier film will be explained with reference to FIG. 44.

Referring to FIG. 44, the device isolation oxide 3, the first layer interlayer insulation film 5 and the metal thin-film resistance 101 are formed on the silicon substrate 1, and a refractory metal film such as TiW is formed on the first interlayer insulation film 5 including the metal thin-film resistance 101 as a barrier film to the metal interconnection pattern. Thereafter, a metal film for interconnection is formed thereon, and the first layer metal interconnection pattern 111 is formed by patterning the metal film for interconnection by using a dry etching process. Because of the existence of the refractory metal film underneath the interconnection metal film, there arises no problem that the metal thin-film resistance 101 undergoes etching even when a dry etching process is used for the patterning of the metal interconnection pattern 111.

Thereafter, a wet etching process is used to remove the refractory metal film selectively by using the first layer metal interconnection pattern 111 as a mask, and there is formed a refractory metal film pattern 113. In this step of patterning of the foregoing refractory metal film, it should be noted that the use of dry etching process is difficult in view of the existence of the refractory metal film immediately on the metal thin-film resistance 101.

4) Next, the process of forming electrode in a contact hole in an insulation film and forming a resistance pattern by forming a resistance film on the insulation film and patterning the same by a dry etching process in contact with the electrode will be explained with reference to FIG. 45. In the example explained with reference to FIG. 45, a metal interconnection pattern is formed further on the metal interconnection pattern formed underneath the contact hole.

Referring to FIG. 45, the first layer interlayer insulation film 5 is formed on the silicon substrate 1 and a first layer metal interconnection pattern 115 is formed on the first layer metal interlayer insulation film 5.

After formation of an insulation film 117 on the first interlayer insulation film 5, a first contact hole 119 is formed in the insulation film 117 formed on the first layer metal interconnection pattern 115 in correspondence to both ends of the metal thin-film resistance, and a conductive plug (electrode) 121 is formed by filling the first contact hole 119 with a conductive material. In this step, it should be noted that no contact hole is formed for electrical connection with a second layer metal interconnection pattern to be formed later.

Next, a metal film for metal thin-film resistance is formed on the entire surface of the insulation film 117, and the metal thin-film resistance 101 is formed on the conductive plug 121 and the insulation film 117 by patterning the metal film.

Further, an insulation film 123 is formed on the entire surface of the insulation film 117 so as to prevent etching of the metal thin-film resistance 101 at the time of patterning the second metal interconnection pattern to be later by using a dry etching process. Further, a second contact hole 125 is formed in the insulation films 117 and 123 on the first layer metal interconnection pattern in an area different from the area where the metal thin-film resistance 101 is formed for electrical connection with the second layer metal interconnection pattern. Further, a second conductive plug 127 is formed by filling the second contact hole with a conductive material. Further, a metal film for the second layer metal interconnection is formed on the insulation film 123 so as to include the region where the second conductive plug 127 is formed, and the metal film is patterned by a photolithographic process and dry etching process to form a second layer metal interconnection pattern 129 on the second conductive plug 127 and the insulation film 123.

Further, there is disclosed a semiconductor integrated circuit device equipped with a resistance, although not a thin-film resistance, formed on the uppermost interconnection electrode via an insulation film in electrical connection with the foregoing uppermost interconnection electrode (reference should be made to Patent Reference 6, for example).

Referring to FIG. 46, a hypothetical case in which such a structure is applied to a metal thin-film resistance is explained.

Referring to FIG. 46, the first interlayer insulation film 5 is formed on the silicon substrate 1 carrying the device isolation oxide 3, and after formation of the first layer metal interconnection pattern 115 on the first layer interlayer insulation film 5, an underlying insulation film 131 is formed on the entire surface of the first interlayer insulation film 5 including the first layer metal interconnection pattern 115. Further, a contact hole 133 is formed in the underlying insulation film 131 on the first metal interconnection pattern 115 by using a photolithographic process and a dry etching process. Further, a metal thin-film for the metal thin-film resistance is formed on the entire surface of the underlying insulation film 131 including the region where the contact hole 133 is formed, and the metal thin-film resistance 101 is formed by patterning the metal thin-film in a predetermined shape.

Further, there is a disclosure of a semiconductor integrated circuit carrying a metal thin-film resistance on an insulation film, wherein the contact between the metal thin film resistance and the metal interconnection in the electrode part of the metal thin-film resistance is achieved in an end part and at least a top part of the terminal region of the metal interconnection (reference should be made to Patent Reference 7).

Referring to FIG. 47, the method of achieving electrical contact between the metal thin-film resistance and the metal interconnection at the end part and at least a part of the top surface of the metal interconnection will be explained.

Referring to FIG. 47, the first interlayer insulation film 5 is formed on the silicon substrate 1 carrying the device isolation oxide film 3, and the first metal interconnection pattern 115 is formed on the first interlayer insulation film 5. Further, a plasma nitride film 135 is formed on the entire surface of the first interlayer insulation film 5 including the first layer metal interconnection pattern 115, and the end part and a part of the to surface of the first layer metal interconnection pattern are exposed by removing a part of the plasma nitride film 135. Thereafter, a metal thin film for the metal thin-film resistance is deposited by evaporation deposition process, and the metal thin-resistance 101 is formed by patterning the metal thin-film thus formed.

Further, a laser trimming process is conducted generally in semiconductor devices after completion of the physical structure thereof for trimming of performance thereof, by irradiating a laser beam to fuse or resistance elements therein for disconnection or modification (reference should be made to Patent Reference 8).

However, with such a laser trimming process, there has been a problem, upon irradiation of the semiconductor substrate such as a silicon substrate via an insulation film such as a silicon oxide film with the laser beam, in that the irradiated laser beam causes damages in the insulation film or silicon substrate and the reliability of the semiconductor device is degraded. Further, there has been a problem, in the trimming process called on-line trimming in which trimming is conducted while measuring the performance of the semiconductor device, in that electron-hole pairs are induced in the silicon substrate as a result of irradiation of the laser beam upon the silicon substrate. Such electron-hole pairs cause noise at the time of performance measurement, and it has been difficult to carry out precise trimming.

In order to minimize such problems there have been various proposals such as disposing a film opaque to the laser beam around the resistance element (reference should be made to Patent Reference 9) or disposing a laser beam shield of polysilicon, refractory metal or refractory metal silicide between a fuse of polysilicon and a silicon substrate (reference should be made to Patent Reference 10).

Further, Patent Reference 1 discloses a structure in which at least a part of the resistance is formed in the region where the semiconductor device is formed.

REFERENCES

Patent Reference 1 Japanese Laid-Open Patent Application 2002-124639 official gazette
Patent Reference 2 Japanese Laid-Open Patent Application 2002-261237 official gazette
Patent Reference 3 Japanese Patent 2,699,559
Patent Reference 4 Japanese Patent 2,932,940
Patent Reference 5 Japanese Patent 3,185,677
Patent Reference 6 Japanese Laid Open Patent Application 58-148443 official gazette
Patent Reference 7 Japanese Laid-Open Patent Application 61-100956 official gazette
Patent Reference 8 Japanese Laid-Open Patent Application 8-124729 official gazette Patent Reference 9 Japanese Laid-Open Patent Application 56-58256 official gazette Patent Reference 10 Japanese Laid-Open Patent Application 58-170 official gazette

SUMMARY OF THE INVENTION

It is the object of the present invention to reduce the chip area in a semiconductor integrated circuit device that includes a metal thin-film resistance.

According to a first mode of the present invention, there is provided a semiconductor integrated circuit having a thin-film resistance, comprising:

a lower insulation film formed over a semiconductor substrate via another layer;

a metal interconnection pattern formed on said lower insulation film;

an underlying insulation film formed on said lower insulation film and said metal interconnection pattern; and a contact hole formed in said underlying insulation film on said metal interconnection pattern, said metal thin-film resistance being formed so as to extend from said underlying insulation film through said contact hole and connected to said metal interconnection pattern in said contact hole electrically, at least a part of said semiconductor integrated circuit other than said metal thin-film resistance being formed in a region underneath said metal thin-film resistance.

In the present invention as set forth above, the underlying insulation film constituting an underlying film of said metal thin-film resistance may be any of a single-layer insulation film or a laminated film in which plural insulation films are laminated.

Meanwhile, with the method 1) of forming electrical connection with the metal thin-film resistance explained with reference to FIG. 42, it is not possible to carry out the patterning of the first layer metal interconnection pattern 103 in view of the fact that the first layer metal interconnection pattern 103 is formed directly on the metal thin-film resistance 101. Thus, there has been a problem that formation of minute patterns is difficult and increase of integration density is difficult.

Further, the metal thin-film resistance 101 easily undergoes oxidation, and there has been a problem that good electrical contact is not attained between the metal thin-film resistance 101 and the first layer metal interconnection pattern 103 even when the metal film for the first layer metal interconnection pattern 103 is formed in the state that the surface of the metal thin-film resistance 101 is oxidized.

In generally used fabrication process of semiconductor devices, good electrical contact to a metal interconnection is achieved by removing the native oxide film on the surface of silicon substrate, or the like, by using a hydrofluoric acid solution. However, the metal thin-film resistance 101 undergoes substantial etching when applied with a fluoric acid, and thus, there has been a problem that the resistance value of the metal thin-film resistance 101 may change variously when an oxide film removal process is applied before formation of the metal film for the first layer metal interconnection pattern 103 by using a hydrofluoric acid.

In the method 2) explained with reference to FIG. 43, on the other hand, it is possible to carry out the patterning of the metal film for forming the first layer metal interconnection pattern 109 by forming the interlayer insulation film 85 on the metal thin-film resistance 101.

However, with regard to the formation of the contact hole 107 for connecting the metal thin-film resistance 101 and the first layer metal interconnection pattern 109 electrically, there is a need of using a wet etching process as explained before, while the use of wet etching process is contradictory to the increase of integration density by way of device miniaturization. Further, in relation to the use of hydrofluoric acid solution at the time of the wet etching process for formation of the contact hole 107, there has been a need of providing additional steps such as formation of a barrier film on the metal thin-film resistance 101 and patterning of such a barrier film in order to prevent the problem of the metal thin-film resistance 101 being etched by the hydrofluoric acid solution, while such additional steps increases the fabrication cost of the semiconductor integrated circuit.

Further, with the method 3) explained with reference to FIG. 44, it is possible to carry out the etching process of the first layer metal interconnection pattern 111 by using a dry etching process. Further, formation of contact hole can be eliminated. However, this conventional process requires the use of a wet etching process for patterning of the refractory metal film at the time of formation of the refractory metal pattern 113 that determines the length of the metal thin-film resistance substantially, and there arises a problem that the refractory metal pattern 113 may be etched beyond the desired etching region, while this leads to the problem of increased variation in the length of the metal thin-film resistance 101 and hence the increased variation of the resistance. Associated with this, there arises a difficulty that miniaturization becomes difficult.

Further, the surface of the metal thin-film is oxidized at the time of formation of the refractory metal film for the refractory metal pattern 113, and thus, it becomes necessary to conduct removal of the oxide film from the surface of the metal thin-film resistance 101 by using a hydrofluoric acid for ensuring good electrical contact with the refractory metal pattern 113. However, such oxide removal process by hydrofluoric acid causes the problem of variation of resistance of the metal thin-film resistance 101 when it is conducted before formation of the refractory metal pattern 113.

As explained heretofore, any of the methods 1)-3) explained with reference to FIGS. 42-44 has necessitated a wet etching process in any of the process steps therein in view of the very small thickness of the metal thin-film resistance, while the use of such a wet etching process has caused the problem of increased variation of the resistance value and places obstacles in the device miniaturization.

Further, the metal thin-film resistance easily undergoes oxidation and it is difficult to achieve good electrical contact with a metal interconnection. Thus, it has been necessary to provide additional steps of forming a barrier film dedicated for the metal thin-film resistance or removal of the surface oxide film by using a hydrofluoric acid solution. However, such additional process steps increases the number of process steps at the time of fabrication of a semiconductor integrated circuit and also causes increased of variation of the resistance value.

The first mode of the semiconductor device of the present invention eliminates such a problem.

Further, in the case of forming the metal thin-film resistance such that a part of the metal thin-film resistance is located inside the contact hole formed in the insulation film on the metal interconnection pattern, there arises a problem as shown in FIG. 46 that the step coverage of the metal thin film resistance 101 is deteriorated at the inner sidewall surface of the contact hole 133, particularly at the part close to the bottom of the contact hole 133, and there tends to appear the problem of large contact resistance between the metal thin-film resistance 101 and the first layer metal interconnection pattern 115. Associated with this, there arises large variation of contact resistance.

Thus, with the first mode of the present invention, at least the top edge part of the contact hole may be configured to form a tapered shape. Further, a residue of reverse sputtering containing at least the material of the metal interconnection pattern, the material of the underlying insulation film and Ar as the constituent elements thereof may be formed on the inner wall surface of such a contact hole. It should be noted that such a reverse sputtering residue and the tapered shape at the top edge part of the contact hole can be formed by applying, after formation of the contact hole in the underlying insulation film, a reverse sputtering process while using an Ar gas (referred to hereinafter as Ar reverse sputtering).

According to a second mode of the present invention, there is provided a semiconductor integrated circuit device, comprising:

a semiconductor substrate;

an underlying insulation film formed over said semiconductor substrate via another layer;

a metal interconnection pattern formed on said underlying insulation film; and a sidewall insulation film formed on a sidewall surface of said metal interconnection pattern, said metal thin-film resistance being formed over said metal interconnection pattern from said underlying insulation film via a surface of said sidewall insulation film, at least a part of said semiconductor integrated circuit other than said metal thin-film resistance being formed in a region underneath said metal thin-film resistance.

In the second embodiment, it is also possible to construct the semiconductor device such that there is formed a reverse sputtering residue on the surface of the sidewall insulation film close to the underlying insulation film such that the reverse sputtering residue contains at least the material of the sidewall insulation film and Ar as the constituent elements. It should be noted that such a reverse sputtering residue can be formed by applying an Ar reverse sputtering to the underlying insulation film after formation of the metal interconnection pattern and the sidewall insulation film.

According to a third aspect of the present invention, there is provided a semiconductor integrated circuit device, comprising:

a semiconductor substrate;

a lower insulation film formed on said semiconductor substrate via another layer;

a metal interconnection pattern formed on said lower insulation film; and an underlying insulation film formed on said lower insulation film with a thickness exposing a top surface of said metal interconnection pattern, said metal thin-film resistance being formed so as to extend from said underlying insulation film to said metal interconnection pattern, at least a part of said semiconductor integrated circuit other than said metal thin-film resistance being formed in a region underneath said metal thin-film resistance.

In the foregoing second and third modes of the present invention, it is possible that the metal thin-film resistance is formed so as to intersect the metal interconnection pattern. Here, the phrase "the metal thin-film resistance intersects the metal interconnection pattern" means that a part of the metal thin-film resistance is formed so as to extend over the metal interconnection pattern from the sidewall insulation film at a first side of the metal interconnection pattern to the sidewall insulation film at a second, opposite side of the metal interconnection pattern.

Further, with the foregoing third mode, a part of the metal thin-film resistance extends over the metal interconnection pattern from the surface of the underlying insulation film in the vicinity of a first side surface of the metal interconnection pattern to the underlying insulation film located at the opposite side of the foregoing first side surface.

In any of the first mode, second mode and third mode noted above, the metal interconnection pattern may be formed of a metal material pattern and a refractory metal film formed at least on the top surface of the metal material pattern.

In a fourth mode of the present invention, there is provided a semiconductor integrated circuit, comprising:

a semiconductor substrate;

an underlying insulation film formed on said semiconductor substrate via another layer;

first and second contact holes formed in said underlying insulation film;

a first conductive plug formed in said first contact hole;

a second conductive plug formed simultaneously to said first conductive plug in said second contact hole; and a metal interconnection pattern formed on said second conductive plug and on said underlying insulation film, said metal thin-film resistance being formed over said first conductive plug and said underlying insulation film, at least a part of said semiconductor integrated circuit other than said metal thin-film resistance being formed in a region underneath said metal thin-film resistance.

In the fourth mode of the invention, it is possible to form the first conductive plug and the second conductive plug from a first conductive material formed on an inner wall surface of each of the first and second contact holes and a second conductive material formed on the first conductive material, wherein the upper end of the first conductive material is formed with a separation from the upper edge of the first contact hole and further from the upper end of the second conductive material in the first contact hole, the outer periphery of the upper surface of the second conductive material and further the upper edge of the first contact hole having a tapered shape, and a reverse sputtering residue containing at least the material of the underlying insulation film, the first conductive material and Ar as the constituent elements thereof may be formed in the gap existing between the inner wall of the first contact hole and the second conductive material.

It should be noted that the foregoing tapered shape and the reverse sputtering residue may be formed at the time of removing the metal film of the metal interconnection pattern formed on the first conductive plug selectively, by applying an Ar reverse sputtering process to the underlying insulation film in the state in which the top part of the first conductive material is removed and there is formed a depression around the first conductive plug.

Throughout the first to fourth modes, it is possible to form a metal nitride film so as to cover the top surface of the metal thin-film resistance such that there is formed no metal oxide film between the top surface of the metal thin-film resistance and the metal nitride film.

Further, throughout the first to fourth modes noted above, it is possible to construct the semiconductor integrated circuit device such that the metal interconnection pattern is the uppermost metal interconnection pattern.

Further, with the conventional semiconductor device explained with reference to FIGS. 42 through 47, there has been a problem in that, upon irradiation of the semiconductor substrate such as a silicon substrate via an insulation film such as a silicon oxide film with the laser beam, the irradiated laser beam causes damages in the insulation film or silicon substrate and the reliability of the semiconductor device is degraded. Further, there has been a problem at the time of on-line trimming process in that electron-hole pairs are induced in the silicon substrate as a result of irradiation of the laser beam upon the silicon substrate. Such electron-hole pairs cause noise at the time of performance measurement, and it has been difficult to carry out precise trimming.

In order to avoid such problems, it is necessary to set the laser power to the range between a minimum power capable of disconnecting or modifying the metal thin-film resistance and the maximum power in which the semiconductor substrate undergoes modification, while it should be noted that such a range is narrow and stable trimming is difficult.

Thus, in any of the first through fourth mode of the present invention noted before, it is possible to provide a laser beam interruption film of a metal material in the region of the metal thin-film resistance between the underlying insulation film and the constituting elements of the semiconductor integrated circuit other than the metal thin-film resistance.

According to a fifth mode of the present invention, there is provided a semiconductor integrated circuit, comprising:
a semiconductor substrate;
an underlying insulation film formed over said semiconductor substrate via another layer;
a metal thin-film resistance formed on said underlying insulation film; and
a laser beam interruption film of a metal material disposed in a region underneath said metal thin-film resistance between said semiconductor substrate and said underlying insulation film.

In the fifth mode of the present invention, it is possible to provide a metal nitride film covering the top surface of the metal thin-film resistance such that no metal oxide film is formed between the top surface of the metal thin-film resistance and the metal nitride film.

In the semiconductor device of the present invention, any of transistors, capacitors, metal interconnection patterns, polysilicon interconnection patterns and impurity diffusion regions can be used as the constituting elements of the semiconductor integrated circuit disposed in the region underneath the metal thin-film resistance.

Thereby, the metal thin-film resistance has a thickness of 5-1000 Angstroms, preferably 20-500 Angstroms.

The foregoing underlying insulation film may be applied with a planarization processing.

In one example, the semiconductor integrated circuit of the present invention may be applied to a semiconductor device having a voltage divider providing a divided voltage output by using two or more resistance elements and capable of adjusting the voltage output by disconnection of fuse elements. Thereby, the resistance elements constituting the voltage divider is formed of the metal thin-film resistance of the present invention.

In another example, the semiconductor integrated circuit device of the present invention may be applied to a semiconductor device having a voltage divider providing a divided voltage output by using two or more resistance elements and capable of adjusting the voltage output by laser beam irradiation to the resistance elements. Thereby, the resistance elements constituting the voltage divider is formed of the metal thin-film resistance of the present invention.

In a further example, the semiconductor integrated circuit device of the present invention may be applied to a semiconductor device having a voltage detection circuit including therein a voltage divider dividing an input voltage and producing a divided voltage; a reference voltage generator producing a reference voltage; and a comparator comparing the divided voltage from the voltage divider and the reference voltage from the reference voltage generator. Thereby, the voltage divider constituting the voltage detection circuit uses the metal thin-film resistance of the present invention for the resistance elements.

In a further example, the semiconductor integrated circuit device of the present invention may be applied to a semiconductor device having a constant voltage generator including therein: an output driver for controlling an output of an input voltage; a voltage divider dividing the output voltage to provide a divided voltage; a reference voltage generator providing a reference voltage; and a comparator circuit comparing the divided voltage from the voltage divider and the reference voltage from the reference voltage generator and controlling the operation of the output driver in response to the result of the comparison. Thereby, the voltage divider constituting the constant voltage generator uses the metal thin-film resistance of the present invention for the resistance elements thereof.

According to the first mode of the present invention, in which at least a part of the constituting elements of the semiconductor integrated circuit other than the metal thin-film resistance is provided in the region underneath the metal thin-film resistance, it becomes possible to reduce the chip area of the semiconductor integrated circuit in view of the location of the constituent elements of the semiconductor integrated circuit disposed in the region underneath the metal thin-film resistance.

Further, the metal thin-film resistance is formed in the first mode of the present invention so as to extend from the surface of the underlying insulation film to the interior of the contact hole formed in the underlying insulation film such that electrical connection is achieved with a metal interconnection pattern formed on the lower insulation film. Thus, there is no need of carrying out a patterning process after formation of the metal thin-film resistance by using a wet etching process, contrary to the conventional technology explained with reference to FIGS. 42-44.

Further, because the contact surface of the metal thin-film resistance to the metal interconnection pattern is not exposed to the air, good electrical contact is guaranteed between the thin-film resistance and the metal interconnection pattern without applying a surface oxide removal process or forming an etching stop barrier film to the metal thin-film resistance. With this, it becomes possible to achieve miniaturization of the metal thin-film resistance and simultaneously stabilization of the resistance value irrespective of the thickness of the metal thin-film resistance, without increasing the number of fabrication steps.

Further, by forming a tapered shape in at least the top edge part of the contact hole and forming the reverse sputtering residue, containing the material of the metal interconnection pattern, the material of the underlying insulation film and Ar as the constituent elements thereof, on the inner wall of the contact hole, the step coverage of the metal thin-film resistance in the contact hole is improved as a result of existence of the reverse sputtering residue, and stabilization of contact resistance is achieved between the metal thin-film resistance and the metal interconnection pattern. Further, as a result of the tapered shape formed at least in the top edge part of the contact hole, formation of overhang structure by the metal thin film deposited in the vicinity of the top edge part of the contact hole is prevented, and adversary effect of such an overhang structure on the deposition of the metal film inside the contact hole is reduced. Thereby, step coverage of the metal thin film and hence the step coverage of the metal thin-film resistance is improved.

Conventionally, there has been a problem that the metal thin-film resistance is affected by the underlying film such as the resistance value thereof is changed depending on the composition of the underlying film or with the time elapsed after formation of the underlying film.

As noted already, the present invention preferably uses the Ar reverse sputtering process after formation of the contact hole in the underlying insulation film for formation of the tapered shape at the top edge part of the contact hole and for formation of the deposits of the reverse sputtering residue, while the use of such Ar reverse sputtering process to the underlying insulation film in advance of formation of the metal thin-film for the metal thin-film resistance reduces at the same time the problem of dependence of the sheet resistance of the metal thin-film resistance on the underlying film and the problem of aging of the metal thin-film resistance.

The effect achieved by applying an Ar reverse sputtering process to the underlying film of the metal thin-film resistance will be explained in detail in later.

With the second mode of the present invention, the constituting elements of the semiconductor integrated circuit are disposed such that at least a part of the constituting elements are disposed in the region underneath the metal thin-film resistance, and it becomes possible to reduce the chip area similarly to the first mode of the present invention noted before.

Further, with the second mode of the present invention, in which the semiconductor integrated circuit comprises a semiconductor substrate, an underlying insulation film formed on the semiconductor substrate via another layer, a metal interconnection pattern formed on the underlying insulation film, and a sidewall insulation film formed on the sidewall surface of the metal interconnection pattern, the metal thin-film resistance being formed so as to extend from the surface of the underlying insulation film to the metal interconnection pattern over the sidewall insulation film surface, it becomes possible to eliminate the patterning process after formation of the metal thin-film resistance by using a wet etching process. Further, because there is no chance that the contact surface of the metal thin-film resistance to the metal interconnection pattern is exposed to the air, it is possible to achieve good electrical contact between the metal thin-film resistance and the metal interconnection pattern without conducting a surface oxide removal process or forming an etching top barrier film to the metal thin-film resistance. With this, it becomes possible with the second mode of the present invention to miniaturize the metal thin-film resistance and simultaneously stabilize the resistance value irrespective of the thickness of the metal thin-film resistance, without increasing the number to the fabrication steps.

Further, because the metal thin-film resistance is formed so as to extend from the surface of the underlying insulation film to the metal interconnection patter over the surface of the sidewall insulation film, it is possible to avoid the problem of poor step coverage caused by the sharp step formed at the sidewall surface of the metal interconnection pattern. Thereby, the resistance value of the metal thin-film is stabilized.

Further, because the metal thin-film resistance is formed from the surface of the underlying insulation film to the metal interconnection pattern over the surface of the sidewall insulation film, there is no need of carrying out a series of process steps for forming a contact hole as compared with the case of achieving electrical connection between the metal thin-film resistance and the interconnection pattern via a contact hole formed on the interconnection pattern, and it is possible to reduce the number of the process steps and simplify the process. Further, with the present invention, there arises no problem of variation of the resistance value of the metal thin-film resistance or increase of contact resistance to the electrode caused by the poor step coverage of the metal thin-film resistance at the edge of such a contact hole.

Further, when forming a reverse sputtering residue containing at least the material of the sidewall insulation film and Ar as the constituent elements thereof on the surface of the sidewall insulation film at the side of the foregoing insulation film, it should be noted t that such a reverse sputtering residue can be formed by applying an Ar reverse sputtering process to the underlying insulation film after formation of the metal interconnection pattern and the sidewall insulation film.

Because there is applied an Ar reverse sputtering process to the underlying insulation film before formation of the metal thin-film for the metal thin-film resistance, it becomes possible to reduce the problem of dependence of the sheet resistance of the metal thin-film resistance on the underlying film and the problem of aging of the metal thin-film resistance.

The effect achieved by applying an Ar reverse sputtering process to the underlying film of the metal thin-film resistance will be explained in detail in later.

According to the third mode of the present invention, in which the constituting elements of the semiconductor integrated circuit are disposed such that at least a part of the constituting elements are located in the region underneath the metal thin-film resistance, it is possible to reduce the chip area similarly to the foregoing first and second modes of the invention.

Further, with the third mode of the present invention in which the semiconductor device comprises a semiconductor substrate, a lower insulation film formed over the semiconductor substrate via another layer, a metal interconnection pattern formed on the lower insulation film; and an underlying insulation film formed on the lower insulation film with a thickness exposing the top surface of the metal interconnection pattern, the metal thin-film resistance being formed so as to extend from said underlying insulation film to said metal interconnection pattern, it is possible to eliminate the patterning step by a wet etching process after formation of the metal thin-film resistance. Further, there is no chance that the contact surface of the metal thin-film resistance to the metal interconnection pattern is exposed to the air, and it is possible to achieve good electrical contact between the metal thin-film resistance and the metal interconnection pattern without conducting a surface oxide removal process or forming an etching stop barrier film to the metal thin-film resistance. With this, it is possible with the third mode of the present invention to achieve miniaturization of the metal thin-film resistance and stabilization of the resistance value irrespective of the thickness of the metal thin-film resistance, without increasing the number of the process steps.

Further, because the metal thin-film resistance is formed so as to extend from the top surface of the metal interconnection pattern to the underlying insulation film, it is possible to reduce the number of the fabrication steps as compared with the case of connecting the metal thin film resistance and the interconnection pattern electrically via a contact hole formed on the interconnection pattern, and the fabrication process of the semiconductor device is simplified. Thereby, increase of variation of resistance value or increase of contact resistance is also avoided.

Further, because the sidewall surface of the metal interconnection pattern is covered with the underlying insulation film, it is possible to avoid deterioration of step coverage of the metal thin-film resistance caused by the sharp step at the sidewall surface of the metal interconnection pattern is successfully avoided.

Further, in the second and third modes of the present invention, it is possible to eliminate the variation of the contact region between the electrode and the metal thin-film resistance caused by relative displacement of the metal interconnection pattern and the metal thin-film resistance and rounding of the end part of the metal thin-film resistance is eliminated by forming the metal thin-film resistance to intersect with the metal interconnection pattern, and it becomes possible realize more stabilized contact resistance.

Further, by forming the metal interconnection pattern in the form of lamination of at least a metal material pattern and a refractory metal film formed on such a metal material pattern, it becomes possible interpose the refractory metal film between the metal thin-film resistance and the metal material pattern in any of the first, second and third modes of the present invention, and variation of contact resistance between the metal thin-film resistance and the metal interconnection pattern can be reduced. Thereby, the precision of the resistance value is improved together with the yield of production of the semiconductor device. Further, it becomes possible to eliminate the problem caused in the structure in which a metal thin-film resistance and a metal material make a direct contact, in that the contact resistance changes significantly when a thermal annealing process is applied at a relatively low temperature of 300-400° C.

According to the fourth mode of the present invention, in which at least a part of the constituting elements of the semiconductor integrated circuit device are disposed in the region underneath the metal thin-film resistance, it is possible to reduce the chip area similarly to the first, second and third modes of the present invention noted above.

Further, with the fourth mode of the present invention in which the semiconductor integrated circuit device comprises: a semiconductor substrate; an underlying insulation film formed on the semiconductor substrate via another layer; first and second contact holes formed in the underlying insulation film; a first conductive plug formed in the first contact hole; a second conductive plug formed simultaneously to the first conductive plug in the second contact hole; and a metal interconnection pattern formed on the second conductive plug and the underlying insulation film, the metal thin-film resistance being formed over the first conductive plug and the underlying insulation film, it is possible to eliminate the patterning process conducted by a wet etching process after formation of the metal thin-film resistance. Further, the contact surface of the metal thin-film resistance for contacting with the first conductive plug is not exposed to the air, and it is possible to obtain good electrical contact between the metal thin-film resistance and the first conductive plug without applying a surface oxide removal process to the metal thin-film resistance or forming an etching stop barrier film to the metal thin-film resistance. Thereby, it becomes possible to achieve miniaturization of the metal thin film resistance and stabilization of the resistance value irrespective of the thickness of the metal thin-film resistance, without increasing the number of the process steps.

Further, because the metal thin-film resistance is formed on the first conductive plug in the first contact hole and on the underlying insulation film, there arises no problem of variation of the resistance value of the metal thin-film resistance or increase of contact resistance to the electrode caused as a result of poor step coverage of the metal thin-film resistance, contrary to the conventional case of achieving electrical connection between the metal thin-film resistance and the metal interconnection pattern via a contact hole formed on the metal interconnection pattern as explained with reference to FIG. 46.

Further, because the second conductive plug used for connecting the upper layer and lower layer metal interconnection patterns is formed simultaneously to the first conductive plug for achieving electrical connection to the metal thin-film resistance, it is possible to eliminate the formation step of the insulation film 123 and the dedicated steps for forming the second contact hole 125 and the second conductive plug 127 explained with reference to FIG. 45. Thereby, it is possible to form the metal thin-film resistance with low cost and with short processing time, without increasing the number of the process steps.

Thus, with the fourth mode of the present invention, it is possible to stabilize the resistance value of the metal thin-film resistance without inviting substantial increase in the number of the manufacturing steps.

Further, it is possible to construct the semiconductor integrate circuit device such that the first and second conductive plugs are formed of a first conductive material formed on the inner wall surface of the first contact hole and the second contact hole and a second conductive material formed on the first conductive material. Thereby, it is possible to form the top end part of the first conductive material with separation from the top edge part of the first contact hole and the top surface of the second conductive material, and it is possible to form the outer periphery of the second conductive material and the top edge part of the first contact hole to have a tapered shape. Thereby, it is possible to form a reverse sputtering residue containing at least the material of the underlying insulation film, the first conductive material and Ar as the constituent elements thereof, in the space between the inner wall of the first contact hole and the second conductive material.

As noted above, the foregoing tapered shape and the reverse sputtering residue can be formed by applying an Ar reverse sputtering process in the state there is formed a depression around the first conductive plug as a result of removal of the top part of the first conductive material constituting the first conductive plug.

As a result of formation of the tapered shape the top surface of the second conductive material along the peripheral part thereof and the top end part of the first contact hole, and further as a result of formation of the material filling the space formed on the first conductive material between the inner wall of the first contact hole and the second conductive material, the step coverage of the metal thin-film resistance in the vicinity of the first contact hole is improved, and the resistance value of the metal thin-film resistance is improved. With this, the resistance value of the metal thin-film resistance is also improved.

Further, as a result of applying an Ar reverse sputtering process to the underlying insulation film in advance of formation of the metal thin-film resistance, the dependence of the sheet resistance of the metal thin-film resistance on the underlying layer is reduced and further the aging of the sheet resistance is also reduced. With this, stabilization of resistance value of the metal thin-film resistance is achieved. With regard to the effect attained by applying such an Ar reverse sputtering process to the underlying film of the metal thin-film resistance will be explained later in detail.

In the foregoing first through fourth mode of the present invention, it is possible to eliminate the oxidation of the top surface of the metal thin-film resistance by providing a metal nitride film so as to cover the top surface of the metal thin-film resistance and prevent formation of metal oxide film between the top surface of the metal thin-film resistance and the metal nitride film. Thereby, stabilization of resistance value is attained for the metal thin-film resistance, and the precision of the resistance value is improved.

Further, throughout the first to fourth modes of the present invention, it is possible to increase the degree of freedom of design by using the metal interconnection pattern for the uppermost metal interconnection pattern. Thereby, it becomes possible to achieve layout change of the metal thin-film resistance easily by changing the layout of the metal thin-film resistance and further the uppermost metal interconnection pattern.

Further by forming the metal thin-film resistance at the upper level of the insulation film on which the uppermost metal interconnection pattern is formed, the metal thin-film resistance is covered with the insulative final passivation film, and it becomes possible to reduce the variation of such a passivation film by reducing the thickness of the insulation film formed on the metal thin-film resistance as compared with the case in which other insulation films are formed on the metal thin-film resistance in addition to the final passivation film.

With this, variation of leaser beam interference caused by the insulation material on the metal thin-film resistance is reduced at the time of conducting a trimming process by applying a laser beam to the metal thin-film resistance, and the variation of laser beam energy provided to the metal thin-film resistance is reduced. Thereby, the precision of trimming is improved. Further, by reducing the thickness of the insulating material on the metal thin-film resistance, it is possible to improve the efficiency of heat radiation caused by temperature rise at the time of the trimming processing, which in turn is caused by the laser beam irradiation.

Further, throughout the first to fourth mode of the present invention, it is possible to reflect the laser beam passed through the underlying insulation film, in the case a laser beam of sufficient energy for causing disconnection or modification of the metal thin-film resistance is irradiated to the metal thin-film resistance at the time of the laser trimming process, in the direction away from the semiconductor substrate by providing a laser beam interruption film of a metal material between the underlying film and the constituting elements of the semiconductor integrated circuit in the region right underneath the metal thin-film resistance. With this, it is possible to prevent damaging or variation of characteristics of the constituting elements of the semiconductor integrated circuit device even in the case the constituting elements of the semiconductor circuit device are disposed in the region underneath the metal thin-film resistance. Further, with such a construction, it becomes possible to prevent degradation of reliability of the semiconductor device originating from the laser beam irradiation to the semiconductor substrate at the time of the trimming process. Further, formation of electron-hole pairs associated with laser beam irradiation to the semiconductor substrate is suppressed at the time of the on-line trimming processing, and it becomes possible to conduct high precision trimming.

With the fifth mode of the present invention, at least a part of the constituting elements of the semiconductor integrated circuit are located in the region underneath the metal thin-film resistance, and it becomes possible to reduce the chip area similarly to the first through fourth modes of the invention.

Further, by constructing the semiconductor integrated circuit device such that the semiconductor integrated circuit device includes an underlying insulation film formed on a semiconductor substrate via other layer, a metal thin-film resistance formed on the underlying insulation film, and a laser beam interruption film of a metal material disposed between the semiconductor substrate and the underlying insulation film in the region underneath the metal thin-film resistance, it is possible to prevent the laser beam to be irradiated upon the semiconductor substrate and the constituting elements of the semiconductor integrated circuit device, similarly to other embodiments that uses such a laser beam interruption film.

In the semiconductor integrated circuit device of the present invention, it is possible to reduce the chip area by disposing the constituting elements of the semiconductor integrated circuit device such as transistors, capacitances, metal interconnection patterns, polysilicon interconnection patterns, impurity diffusion regions, and the like, in the region underneath the metal thin-film resistance.

Thereby, it should be noted that the metal thin-film resistance may be formed to have a thickness of 5-1000 Angstroms, preferable 20-500 Angstroms. In the first through fourth mode of the present invention, there is no need of conducting a patterning process by using a wet etching process after formation of the metal thin-film resistance, and there occurs no problem of the contact surface of the metal thin-film resistance for contacting with the metal interconnection pattern being exposed to the air. Because it becomes possible to attain stable electrical contact between the metal thin-film resistance and the metal interconnection pattern without conducting removal process of surface oxide or formation of etching stop barrier film to the metal thin-film resistance, the present invention enables miniaturization of metal thin-film resistance and stabilization of the resistance value thereof when applied to a semiconductor device having the metal thin-film resistance of such a film thickness, without increasing the number of fabrication process steps.

Further, with the mode that uses the sputtering residue explained before, dependence of the sheet resistance value of the metal thin-film resistance on the underlying film is reduced, and it becomes possible to stabilize the resistance value of the metal thin-film resistance even when the present invention is applied to a semiconductor device having the metal thin-film resistance of the foregoing film thickness.

Further, according to the semiconductor device of the present invention, it is possible to suppress the problem of variation of the resistance value of the metal thin-film resistance caused by the steps in the underlying insulation film, by applying a planarization process to the underlying insulation film.

By using the metal thin-film resistance of the present invention in the semiconductor device that has a voltage divider including two or more resistance elements for obtaining a voltage output and capable of adjusting voltage output by disconnection of fuse elements, it is possible to reduce the chip area of such a semiconductor device having the voltage divider.

Also, in the semiconductor device having a voltage divider including two or more resistance elements for obtaining a voltage output and capable of adjusting the voltage output by irradiation of laser beam to such resistance elements, it is possible to reduce the chip area by using the metal thin-film resistance of the present invention for the resistance elements.

Also, in the semiconductor device having a voltage divider for producing a divided voltage by dividing an input voltage, a reference generator for producing a reference voltage, and a comparator circuit for comparing the divided voltage from the voltage divider and the reference voltage from the reference voltage generator, the chip area of the semiconductor device can be reduced including the voltage detection circuit, by using the thin-film resistance for the resistance elements of the voltage divider.

Also, in the semiconductor device including an output driver controlling an output of an input voltage, a voltage divider for producing a divided voltage by dividing the output voltage, a reference voltage generator for producing a reference voltage, and a comparator circuit comparing the divided voltage from the voltage divider and the reference voltage from the reference voltage generator and controlling the operation of the output driver in response to the result of comparison, it becomes possible to reduce the chip area by using the metal thin-film resistance of the present invention for the resistance elements of the voltage divider and by using the laser beam interruption film. Thereby, it becomes possible to reduce the chip area including the constant voltage generator.

BRIEF DESCRIPTION OF THE DRAWINGS

FIGS. 1A and 1B are cross-sectional diagrams showing an embodiment of the first mode of the present invention wherein FIG. 1A is a cross-sectional view showing a region where a metal thin-film resistance is formed while FIG. 1B is an enlarged cross-sectional diagram showing a part of FIG. 1A circled by a broken line;

FIGS. 6A and 6B are diagrams showing the relationship between the sheet resistance of a CrSi thin-film resistance and the time elapsed after formation of the underlying film of the metal thin-film resistance for the case an Ar reverse sputtering process is applied before formation of a metal thin-film for the metal thin-film resistance and for the case no such Ar reverse sputtering process has been conducted, wherein FIG. 6A shows the case in which the Ar reverse sputtering has been conducted while the FIG. 6B shows the case no such Ar reverse sputtering process has been conducted, the vertical axis representing the sheet resistance in terms of $\Omega/\square$, the horizontal axis representing the time elapsed after formation of the underlying film in terms of hours;

FIGS. 10A and 10B are cross-sectional diagrams showing another embodiment of the first mode of the present invention, in which FIG. 10A shows the cross-sectional diagram showing the region where the metal thin-film resistance is formed while FIG. 10B is an enlarged cross-sectional diagram showing the part circled by a broken line in FIG. 10A in enlarged scale;

FIGS. 11A and 11B are cross-sectional diagrams showing a further embodiment of the first mode of the present invention, in which FIG. 11A shows the cross-sectional diagram showing the region where the metal thin-film resistance is formed while FIG. 11B is an enlarged cross-sectional diagram showing the part circled by a broken line in FIG. 11A in enlarged scale;

FIGS. 12A and 12B are cross-sectional diagrams showing a further embodiment of the first mode of the present invention, in which FIG. 12A shows the cross-sectional diagram showing the region where the metal thin-film resistance is formed while FIG. 12B is an enlarged cross-sectional diagram showing the part circled by a broken line in FIG. 12A in enlarged scale;

FIGS. 13A and 13B are cross-sectional diagrams showing a further embodiment of the first mode of the present invention, in which FIG. 13A shows the cross-sectional diagram showing the region where the metal thin-film resistance is formed while FIG. 13B is an enlarged cross-sectional diagram showing the part circled by a broken line in FIG. 13A in enlarged scale;

FIGS. 15A and 15B are cross-sectional diagrams showing an embodiment of the first mode and fifth mode of the present invention, wherein FIG. 15A is a cross-sectional view showing the region where the metal thin-film resistance is formed while FIG. 15B shows the part of FIG. 15A surrounded by a broken line with enlarged scale;

FIGS. 16A and 16B are cross-sectional diagrams showing another embodiment of the first mode and fifth mode of the present invention, wherein FIG. 16A is a cross-sectional view showing the region where the metal thin-film resistance is formed while FIG. 16B shows the part of FIG. 16A surrounded by a broken line with enlarged scale;

FIGS. 17A and 17B are cross-sectional diagrams showing a further embodiment of the first mode and fifth mode of the present invention, wherein FIG. 17A is a cross-sectional view showing the region where the metal thin-film resistance is formed while FIG. 17B shows the part of FIG. 17A surrounded by a broken line with enlarged scale;

FIGS. 18A-18C are cross-sectional diagrams showing an embodiment of the second mode of the present invention, wherein FIG. 18A is a plan view, FIG. 18B is a cross-sectional view taken along a line A-A in FIG. 18A, while FIG. 18C shows the part of FIG. 18A surrounded by a broken line with enlarged scale;

FIGS. 20A-20C are cross-sectional diagrams showing another embodiment of the second mode of the present invention, wherein FIG. 20A is a plan view, FIG. 20B is a cross-sectional view taken along a line B-B in FIG. 20A, while FIG. 20C shows the part of FIG. 20A surrounded by a broken line with enlarged scale;

FIGS. 21A-21C are cross-sectional diagrams showing an embodiment of the second mode and fifth mode of the present invention, wherein FIG. 21A is a plan view, FIG. 21B is a cross-sectional view taken along a line C-C in FIG. 21A, while FIG. 21C shows the part of FIG. 21A surrounded by a broken line with enlarged scale;

FIGS. 22A-22C are cross-sectional diagrams showing another embodiment of the second mode of the present invention, wherein FIG. 22A is a plan view, FIG. 22B is a cross-sectional view taken along a line D-D in FIG. 22A, while FIG. 22C shows the part of FIG. 22A surrounded by a broken line with enlarged scale;

FIGS. 23A-23C are diagrams showing the region of a semiconductor device where a metal thin-film resistance according to an embodiment of the third mode of the present invention is formed, wherein FIG. 23A is a plan view, FIG. 23B is a cross-sectional view taken along a line E-E, and FIG. 23C is an enlarged cross-sectional view showing the part surrounded by a broken line in FIG. 23B with an enlarged scale;

FIGS. 25A-25C are cross-sectional diagrams showing an embodiment of the third mode of the present invention, wherein FIG. 25A is a plan view, FIG. 25B is a cross-sectional view taken along a line F-F in FIG. 25A, while FIG. 25C shows the part of FIG. 25A surrounded by a broken line with enlarged scale;

FIGS. 26A-26C are cross-sectional diagrams showing an embodiment of the third mode and fifth mode of the present invention, wherein FIG. 26A is a plan view, FIG. 26B is a cross-sectional view taken along a line G-G in FIG. 26A, while FIG. 26C shows the part of FIG. 26A surrounded by a broken line with enlarged scale;

FIGS. 27A-27C are cross-sectional diagrams showing another embodiment of the third mode and fifth of the present invention, wherein FIG. 27A is a plan view, FIG. 27B is a cross-sectional view taken along a line H-H in FIG. 27A, while FIG. 27C shows the part of FIG. 27A surrounded by a broken line with enlarged scale;

FIGS. 28A-28C are cross-sectional diagrams showing an embodiment of the semiconductor device according to the fourth mode of the present invention, wherein FIG. 28A is a cross-sectional view, FIG. 28B is a cross-sectional view showing the region of a first contact hole with enlarged scale, while FIG. 28C is a cross-sectional view showing the region of second contact hole with enlarged scale;

FIGS. 30A-30C are cross-sectional diagrams showing another embodiment of the semiconductor device according to the fourth mode of the present invention, wherein FIG. 30A is a cross-sectional view, FIG. 30B is a cross-sectional view showing the region of a first contact hole with enlarged scale, while FIG. 30C is a cross-sectional view showing the region of second contact hole with enlarged scale;

FIGS. 31A-31C are cross-sectional diagrams showing an embodiment of the semiconductor device according to the fourth mode and fifth mode of the present invention, wherein FIG. 31A is a cross-sectional view, FIG. 31B is a cross-sectional view showing the region of a first contact hole with enlarged scale, while FIG. 31C is a cross-sectional view showing the region of second contact hole with enlarged scale;

FIGS. 32A-32C are cross-sectional diagrams showing another embodiment of the semiconductor device according to the fourth mode and fifth mode of the present invention, wherein FIG. 32A is a cross-sectional view, FIG. 32B is a cross-sectional view showing the region of a first contact hole with enlarged scale, while FIG. 32C is a cross-sectional view showing the region of second contact hole with enlarged scale;

FIGS. 33A-33C are cross-sectional diagrams showing a further embodiment of the semiconductor device according to the fourth mode and fifth mode of the present invention, wherein FIG. 33A is a cross-sectional view, FIG. 33B is a cross-sectional view showing the region of a first contact hole with enlarged scale, while FIG. 33C is a cross-sectional view showing the region of second contact hole with enlarged scale;

FIGS. 34A-34C are cross-sectional diagrams showing a further embodiment of the semiconductor device according to the fourth mode and fifth mode of the present invention, wherein FIG. 34A is a cross-sectional view, FIG. 34B is a cross-sectional view showing the region of a first contact hole with enlarged scale, while FIG. 34C is a cross-sectional view showing the region of second contact hole with enlarged scale;

DETAILED DESCRIPTION OF THE PREFERRED EMBODIMENT

Figure 1A:
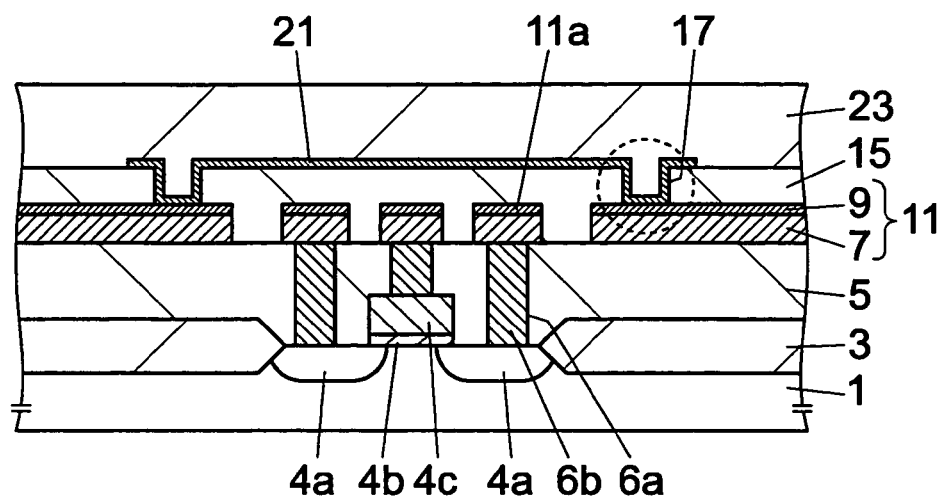
Figure 1B:
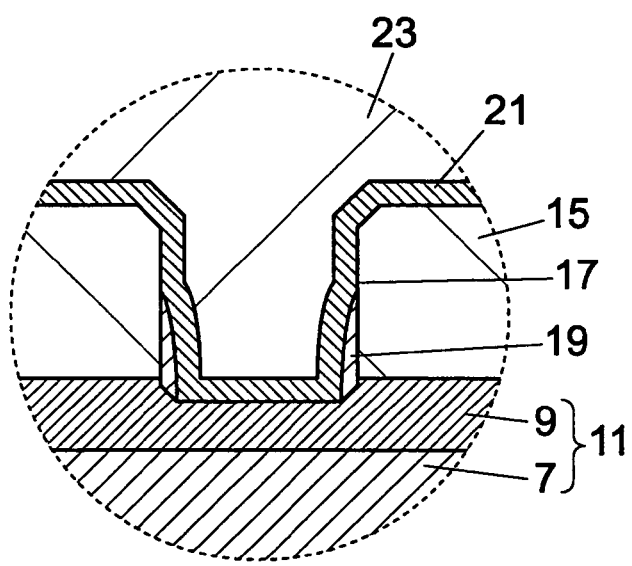

FIGS. 1A and 1B are cross-sectional diagrams showing an embodiment of the first mode of the present invention wherein FIG. 1A is a cross-sectional view showing a region where a metal thin-film resistance is formed while FIG. 1B is an enlarged cross-sectional diagram showing a part of FIG. 1A circled by a broken line.

Referring to FIG. 1, it will be noted that a device isolation oxide 3 is formed on a silicon substrate 1, and two impurity diffusion regions 4a are formed on the surface of the silicon substrate 1 surrounded by the device isolation oxide in correspondence to the region located underneath the metal thin-film resistance to be explained later. Further, a gate electrode 4c of polysilicon is formed on the silicon substrate 1 between the diffusion regions 4a via a gate insulation film 4b, wherein the gate electrode 4c forms a transistor together with the gate insulation film 4b and the diffusion regions 4a.

Further, there is formed a first layer interlayer insulation film (lower insulation film) 5 of BPSG (borophosphosilicate grass) or PSG (phosphosilicate glass) on the silicon substrate 1 so as to cover the region where the device isolation oxide 3 and the transistors are formed, wherein the first layer interlayer insulation film 5 is formed with contact holes 6a in correspondence to the impurity diffusion regions 4a and further in correspondence to the gate electrode 4c, wherein each contact hole 6a is filled with tungsten and there are formed conductive plugs 6b in the contact holes 6a.

On the first layer interlayer insulation film 5 and the conductive plugs 6b, there are formed first layer metal interconnection patterns 11 and 11a formed of a metal pattern 7 and a refractory metal film 9 formed on the metal pattern 7. For example, the metal pattern 7 is formed of an AlSiCu film. On the other hand, the refractory metal film 9 is formed of a TiN film, while it should be noted that the TiN film functions as an antireflection coating and also as a barrier film. Further, in the region underneath the metal thin-film resistance, the first layer metal interconnection pattern 11a is formed in correspondence to the conductive plug 6b such that the first layer metal interconnection pattern 11a extends perpendicularly to the plane of the sheet.

Further, there is formed a second layer interlayer insulation film (underlying insulation film) 15 on the first layer interlayer insulation film so as to cover the region where the first layer metal interconnection patterns 11 and 11a are formed, wherein the second layer interlayer insulation film 15, illustrated in FIG. 1A as if it is a single-layer film, is actually formed of consecutive lamination of a lowermost plasma CVD oxide film, an SOG film on the plasma CVD oxide film and a plasma CVD oxide film formed thereon. Further, the second layer interlayer insulation film 15 is formed with contact holes 17 in correspondence to both end parts of the metal thin-film resistance and the first layer interconnection pattern 11.

As shown in FIG. 1B, a surface part of the refractory metal film 9 is removed at the bottom part of the contact hole. Further, it will be noted that there is formed a tapered part at the top edge part of the contact hole 17. In addition, it should be noted that a reverse sputtering residue 19 is formed on the inner wall surface of the contact hole 17. It should be noted that illustration of the foregoing tapered part and the reverse sputtering residue 19 is omitted in FIG. 1A.

It should be noted that such a tapered part at the top edge part of the contact hole 17 or the reverse sputtering residue at the inner wall surface of the contact hole 17 is formed by applying an Ar reverse sputtering process to the second layer interlayer insulation film 15 in the state that the contact hole 17 is formed already in the interlayer insulation film 15. Thus, the reverse sputtering residue 19 contains the elements constituting the refractory metal film 9 and the elements constituting the second layer interlayer insulation film 15 in addition to Ar. In the present example, the reverse sputtering residue 19 contains the elements of Ti, N, Si, O and Ar.

On the second layer interlayer insulation film 15, there is formed a CrSi thin-film resistance (metal thin-film resistance) 21 so as to extend from the region between the contact holes 17 including the interior of the contact holes 17 and over the first layer metal interconnection pattern 11 exposed at the bottom of the contact holes 17. Thereby, it should be noted that both end parts of the CrSi thin-film resistance 21 are connected to the respective first layer metal interconnection patterns 11 in the corresponding contact holes 17. Further, there extend the first layer metal interconnection patterns 11a underneath the CrSi thin-film resistance 21 via the second layer interlayer insulation film 15.

Further, on the second layer interlayer insulation film 15, there is formed a final passivation film 23, wherein the passivation film 23, illustrated in FIG. 1A as if it is a single-layer film, is actually formed of lamination of a lower silicon oxide film and an upper silicon nitride film With this embodiment, the transistors constituting the semiconductor integrated circuit are disposed in the region underneath the CrSi thin-film resistance 21 together with the first layer metal interconnection pattern 11a, and it becomes possible to reduce the chip area of the semiconductor integrated circuit.

Further, because of the formation of the reverse sputtering residue on the inner wall surface of the contact hole 17 as shown in FIG. 1B, the step coverage of the CrSi thin-film resistance 21 inside the contact hole 17 is improved. With this, it is possible to reduce the contact resistance between the CrSi thin-film resistance 21 and the first layer metal interconnection pattern 11.

Further, because of formation of the tapered shape at the top edge part of the contact hole 17, formation of the overhang structure of CrSi thin film blocking the contact hole 17 at the top part thereof at the time of deposition of the Cr thin-film for the formation of the CrSi thin-film resistance is successfully prevented, and the adversary effect on the deposition of the CrSi thin film inside the contact hole 17 is reduced. Thereby, the step coverage of the CrSi thin-film is improved and hence the step coverage of the CrSi thin-film resistance 21.

Figure 2A:
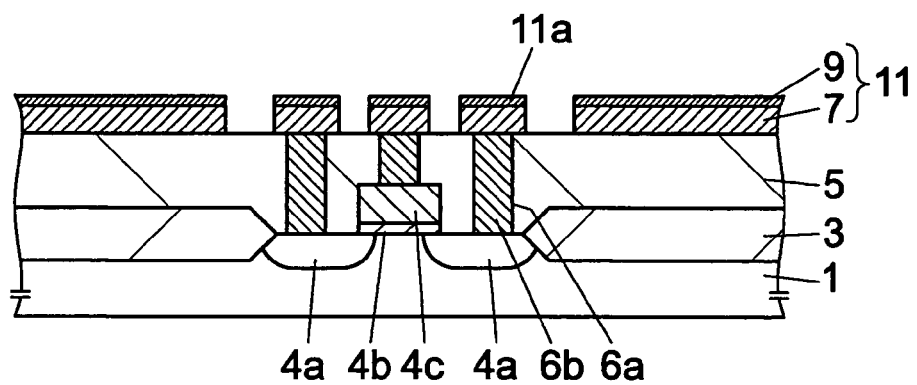
FIGS. 2A-2D are cross-sectional diagrams showing a fabrication process of the foregoing embodiment.
Figure 2B:
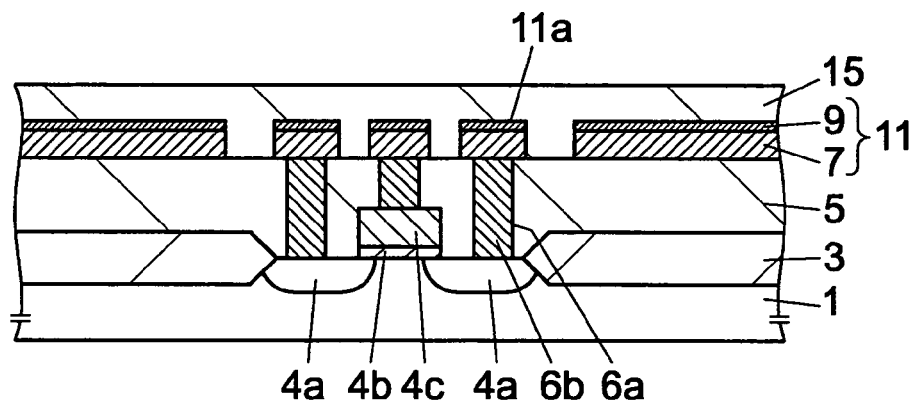
Figure 2C:
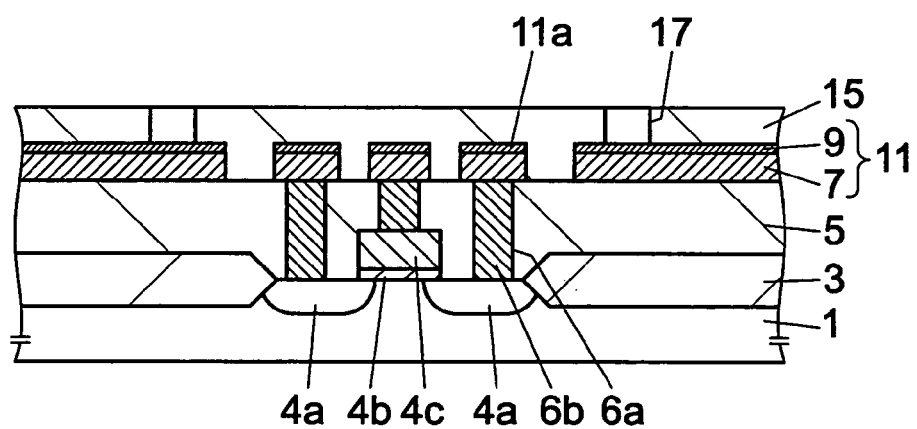
Figure 2D:
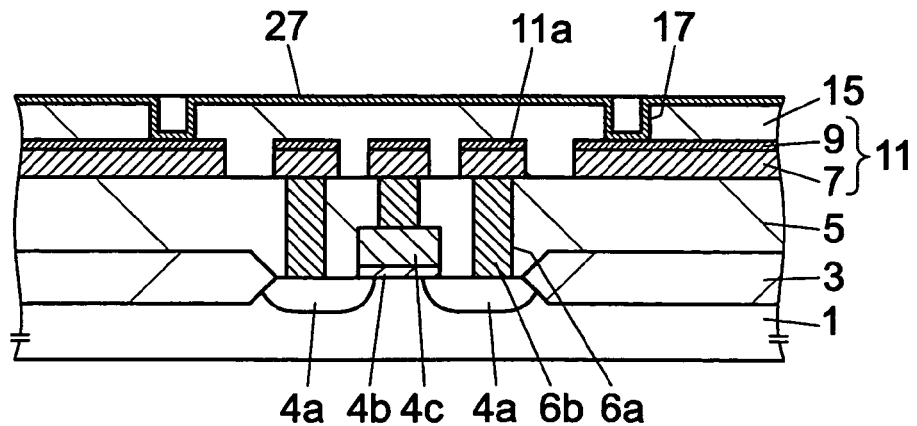
Figure 3:
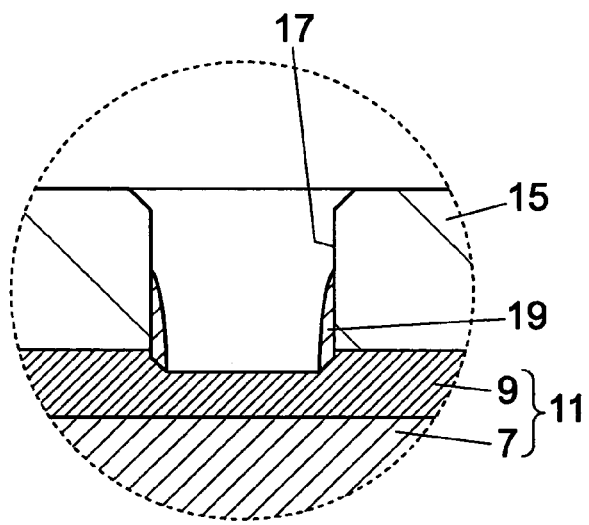
FIG. 3 is a cross-sectional diagram showing the state of a contact hole in the fabrication process of FIGS. 2A-2D after applying an AR reverse sputtering process.

FIGS. 2A-2D are cross-sectional diagrams explaining an example of the process steps for fabricating the embodiment of FIGS. 1A and 1B, while FIG. 3 is a cross-sectional diagram showing the state of the part including the contact hole after conducting the foregoing Ar reverse sputtering process with enlarged magnification. It should be noted that FIGS. 2A-2D omit the illustration of the sidewall film formed on the inner wall surface of the contact hole or the tapered shape formed at the top edge part of the contact hole.

Hereinafter, the fabrication process of the present embodiment will be explained.

(1) By using a known process, the device isolation oxide 3 is formed on the surface of the silicon substrate 1, and the transistors are formed in the region underneath the CrSi thin-film resistance by forming the impurity diffusion regions 4a and 4b, the gate insulation film 4b and the gate electrode 4c in correspondence to such a region.

Next, by using an atmospheric pressure CVD apparatus, the first layer interlayer insulation film 5 of BPSG or PSG is formed on the silicon substrate 1, on which the device isolation oxide 3 and the transistors are already formed, with the thickness of about 8000 Angstroms. Thereafter, the surface of the first layer interlayer insulation film 5 is planarized by conducting a thermal annealing process such as reflowing process.

Next, by using a photolithographic process and subsequent etching process, there are formed contact holes 6a in correspondence to the diffusion regions 4a and also in correspondence to the gate electrode 4c. Further, a conductive material is formed on the entire surface of the first layer interlayer insulation film 5 including the region where the contact holes 6a are formed by depositing a conductive material such as tungsten, and conductive plugs 6b are formed in the contact holes 6a by removing the unnecessary tungsten film by applying an etch back process or a CMP process.

For example, an interconnection metal film of AlSiCu alloy is formed on the first layer interlayer insulation film 5 by using a D.C. magnetron sputtering apparatus with the thickness of about 5000 Angstroms.

Thereafter, a refractory metal film such as a TiN film is formed in vacuum in continuation to the formation of the interconnection metal film with a thickness of about 800 Angstroms, wherein it is known that the refractory metal film thus formed functions as an antireflection coating. Here, it should be noted that the refractory metal film functions also as a barrier film for achieving improved contact between the interconnection pattern formed later from the interconnection metal film and the metal thin-film resistance to be formed. Thus, it is preferable to form the refractory metal film in continuation to the interconnection metal film without breaking the vacuum.

Next, in the step of FIG. 2A, the refractory metal film and the interconnection metal film are patterned by using a known photolithographic process and etching process, and as a result, there are formed first layer metal interconnection patterns 11 and 11a, each formed of lamination of a metal interconnection pattern 7 and a refractory metal film 9. Thereby, the refractory metal film functions as an antireflection coating, and thus, it becomes possible to minimize the variation of resist pattern width that defines the shape of the first layer interconnection pattern 11. It should be noted that the first layer metal interconnection pattern 11a is formed on the conductive plug 6b and on the first layer interlayer insulation film 5 in correspondence to the region located underneath the CrSi thin-film resistance to be formed.

In this step, it should be noted that the metal thin-film resistance is not yet formed, and the underlying film of the metal interconnection pattern 11 is provided by the first layer interlayer insulation film 5. Thus, it is possible to carry out the patterning of the first layer metal interconnection pattern 11 by using a dry etching process with sufficient overetching for ensuring the patterning. Here, there is no need of using a wet etching process, which has caused various problems in the conventional art, and there arises no problem in the miniaturization of the circuit pattern.

(2) Next, in the step of FIG. 2B, a plasma CVD oxide film is formed on the first layer interlayer insulation film by using a plasma CVD process so as to cover the region where the first layer metal interconnection patterns 11 and 11a are formed with the thickness of about 6000 Angstroms. Further, by applying a known planarization process by applying an SOG coating and subsequent etch-back process, a planarized structure is obtained in which an SOG film is laminated on the plasma CVD oxide film.

Further, a plasma CVD oxide film is formed thereon with a thickness of about 2000 Angstroms for preventing diffusion of the constituent elements from the SOG film. With this, there is formed a second layer interlayer insulation film 15 formed of the lowermost plasma CVD oxide film, the SOG film and the upper plasma CVD oxide film.

(3) Next, in the step of FIG. 2C, a resist pattern is formed by using a known photolithographic process in correspondence to the contact hole to be formed in the second layer interlayer insulation film 15 in correspondence to the both end parts of the metal thin-film resistance, and the second layer interlayer insulation film 15 is removed selectively by using a parallel-plate plasma etching apparatus, for example, while using the resist pattern as a mask, under the etching condition of: RF power set to 700 W; Ar flow rate set to 800 SCCM; CHF3 flow rate set to 500 SCCM; CF4 flow rate set to 500 SCCM; and process pressure set to 3.5 Torr. With this, contact holes 17 are formed in the second layer interlayer insulation film 15. Thereby, it should be noted that the contact hole 17 exposes the refractory metal film 9 used for the antireflection coating and simultaneously functioning as a barrier film at the bottom thereof with the thickness of about 600 Angstroms. Thereafter, the resist pattern is removed.

Here, it is possible to conduct, after formation of the contact hole 17, a process of removing the byproducts of etching adhered to the sidewall surface of the contact hole 17. Further, in order to improve the step coverage of the metal thin-film resistance inside the contact hole 17, it is possible to apply various improvements for the shape of the contact hole 17 such as taper etching by changing the etching condition during the etching process, or by combining a wet etching process and a dry etching process.

In the foregoing step (3), it is possible to suppress the etching rate of the refractory metal film 9 with regard to the etching rate of the second layer interlayer insulation film 15 by optimizing the condition of the plasma etching process. Thus, it is possible to increase the thickness of the refractory metal film 9 remaining at the bottom part of the contact hole 17 as compared with the thickness vale noted before. Further, it is possible to secure sufficient film thickness for the refractory metal film 9 after formation of the contact hole 17 while suppressing the thickness of the refractory metal film 9 at the time of formation thereof.

Because the formation of the contact hole 17 is thus conducted in the state in which the metal thin-film resistance is not formed yet, it is possible to carry out the formation of the contact hole 17 freely without being restrained by the small thickness of the metal thin-film resistance contrary to the conventional process, and it becomes possible to achieve miniaturization of the pattern by applying a dry etching process.

(4) Next, in the step of FIG. 2D, an Ar reverse sputtering process is applied to the surface of the second layer interlayer insulation film 15 including the contact hole 17 in an Ar sputter etching chamber of a multi-chamber sputtering apparatus in a vacuum environment under the condition of: DC bias set to 1250V; Ar flow rate set to 20 SCCM, process pressure set to 8.5 mTorr; and processing time of 20 seconds. This etching condition is equivalent to the case of etching a thermal oxide film formed at 1000° C. in a wet ambient with the depth of about 50 Angstroms. After this Ar reverse sputtering process, the refractory metal film 9 remaining at the bottom of the contact hole 17 had the thickness of about 500 Angstroms.

Next, upon completion of the Ar reverse sputtering process, formation of a CrSi thin-film (metal thin-film) 27 is conducted for formation of the metal thin-film resistance in continuation, without breaking the vacuum.

More specifically, the semiconductor wafer is transported from the Ar sputter etching chamber to a sputter chamber equipped with a CrSi target (Si/Cr=80/20 wt %), and deposition of the CrSi thin-film 27 is conducted on the entire surface of the second layer interlayer insulation film 15 including the contact hole 17 with the thickness of about 50 Angstroms under the condition of: DC power set to 0.7 kW; Ar flow rate set to 85 SCCM; process pressure set to 8.5 mTorr; and process duration of 9 seconds.

Thus, by applying an Ar reverse sputtering process to the second layer interlayer insulation film 15 including the contact hole 17 before formation of the CrSi thin film 27 for the metal thin-film resistance, the reverse sputtering residue 19 containing the material of the refractory metal film 9, the second layer interlayer insulation film 15 and Ar, is formed on the inner wall surface of the contact hole 17 as shown in FIG. 3. Further, the tapered shape is formed at the top edge part of the contact hole 17.

As a result of existence of the reverse sputtering residue 19, the step coverage of the CrSi thin film 27 in the contact hole 17 is improved, and formation of the overhang structure by the CrSi thin film 27 deposited at the top edge part of the contact hole 17 upon formation of the CrSi thin film 27 is successfully avoided with the tapered shape formed at the tope edge part of the contact hole 17. Thereby, the influence of such an overhang structure on the deposition of the CrSi thin-film 27 in the contact hole 17 is reduced and the step coverage of the CrSi thin-film 27 is improved.

Further, by applying the foregoing Ar reverse sputtering process, the native oxide film formed on the surface of the refractory metal film 9 at the bottom of the contact hole 17 can be removed, and it becomes possible to achieve good electrical contact between the first layer metal interconnection pattern 11 and the CrSi thin-film 27.

Further, as a result of the foregoing Ar reverse sputtering process, the dependence of the CrSi thin-film resistance, formed of the CrSi thin-film, on the underlying film can be improved. This effect will be explained later.

(5) Next, by using a photolithographic process, a resist pattern for defining the region of the metal thin-film resistance is formed on the CrSi thin film 27, and the CrSi thin film 27 is patterned in an RIE (reactive ion etching) apparatus for example while using the resist pattern as a mask. Thereby, a CrSi thin-film resistance 21 is formed. Thereafter, the resist pattern is removed.

Here, it should be noted that the Cr thin-film resistance 21 is connected electrically to the first layer metal interconnection pattern 11 in the contact hole 17, and thus, it is no longer necessary to apply a process for removing metal oxide from the surface of the CrSi thin-film resistance for electrical connection at the top surface of the metal thin-film resistance by using a hydrofluoric acid solution as in the conventional art.

For example, by using a plasma CVD process, a silicon oxide film and a silicon nitride film are formed consecutively on the second layer interlayer insulation film 15 including the region of the CrSi thin-film resistance 21 by a plasma CVD process, for example, as a passivation film 23. With this, fabrication of the semiconductor device (see FIGS. 1A and 1B) is completed.

According to the foregoing fabrication process, the CrSi thin-film resistance 21 is formed after formation of the first layer metal interconnection pattern 11 and the contact hole 17, so as to make electrical contact with the first layer metal interconnection pattern 11 in the contact hole 17, and thus, there is no longer the need of applying a pattering process, after patterning the CrSi thin-film resistance 21, by using a wet etching process.

Thereby, it should be noted that there is no possibility that the contact surface of the CrSi thin-film resistance 21 to the first metal interconnection pattern 11 is exposed to the air, and thus, it is possible to achieve stable electrical connection between the CrSi thin-film resistance 21 and the first layer metal interconnection pattern 11 without conducting surface oxide film removal process and formation of etching stop barrier film.

With this, it becomes possible to achieve miniaturization and stabilization of resistance value of the CrSi thin-film resistance 21 irrespective of the thickness of the CrSi thin-film resistance 21, without increasing the number of process steps.

Further, because of the existence of the refractory metal film 9 functioning also as a barrier film between the CrSi thin-film resistance and the metal pattern 7, variation of contact resistance between the CrSi thin-film resistance 21 and the first layer metal interconnection pattern 11 is reduced, and the precision of resistance value is improved together with yield of production.

Further, because the refractory metal film 9 functions as a barrier film and also an antireflection film, and because the refractory metal film 9 can be formed without increasing the number of fabrication process steps, it is possible to stabilize the contact resistance between the metal thin-film resistance and the metal interconnection pattern while avoiding increase of the fabrication cost.

Figure 4:
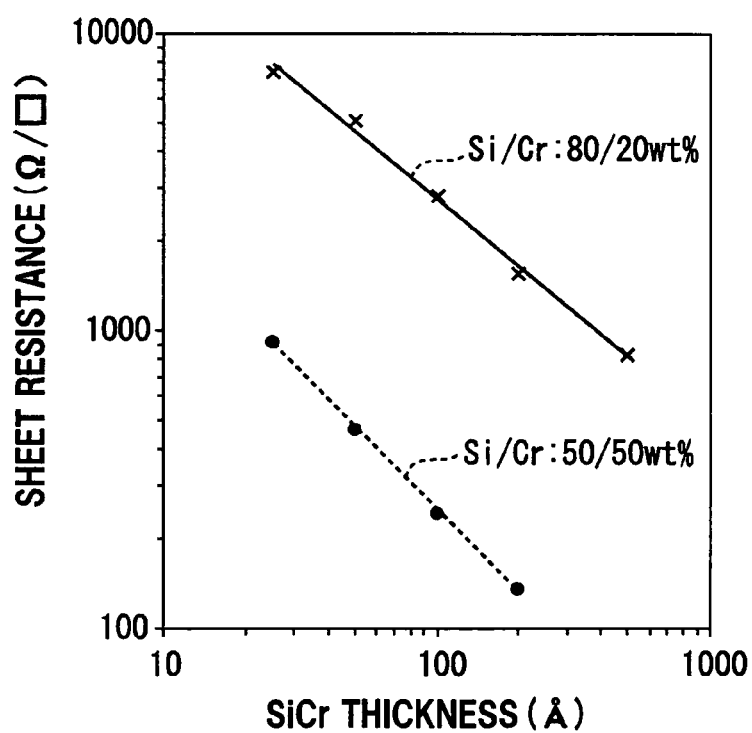
FIG. 4 is a diagram showing a relationship between a sheet resistance and film thickness of the metal thin-film resistance formed according to the present invention, wherein the vertical axis represents the sheet resistance in terms of $\Omega/\square$, while the horizontal axis represents the thickness of a CrSi film in terms of Angstroms.
Figure 5:
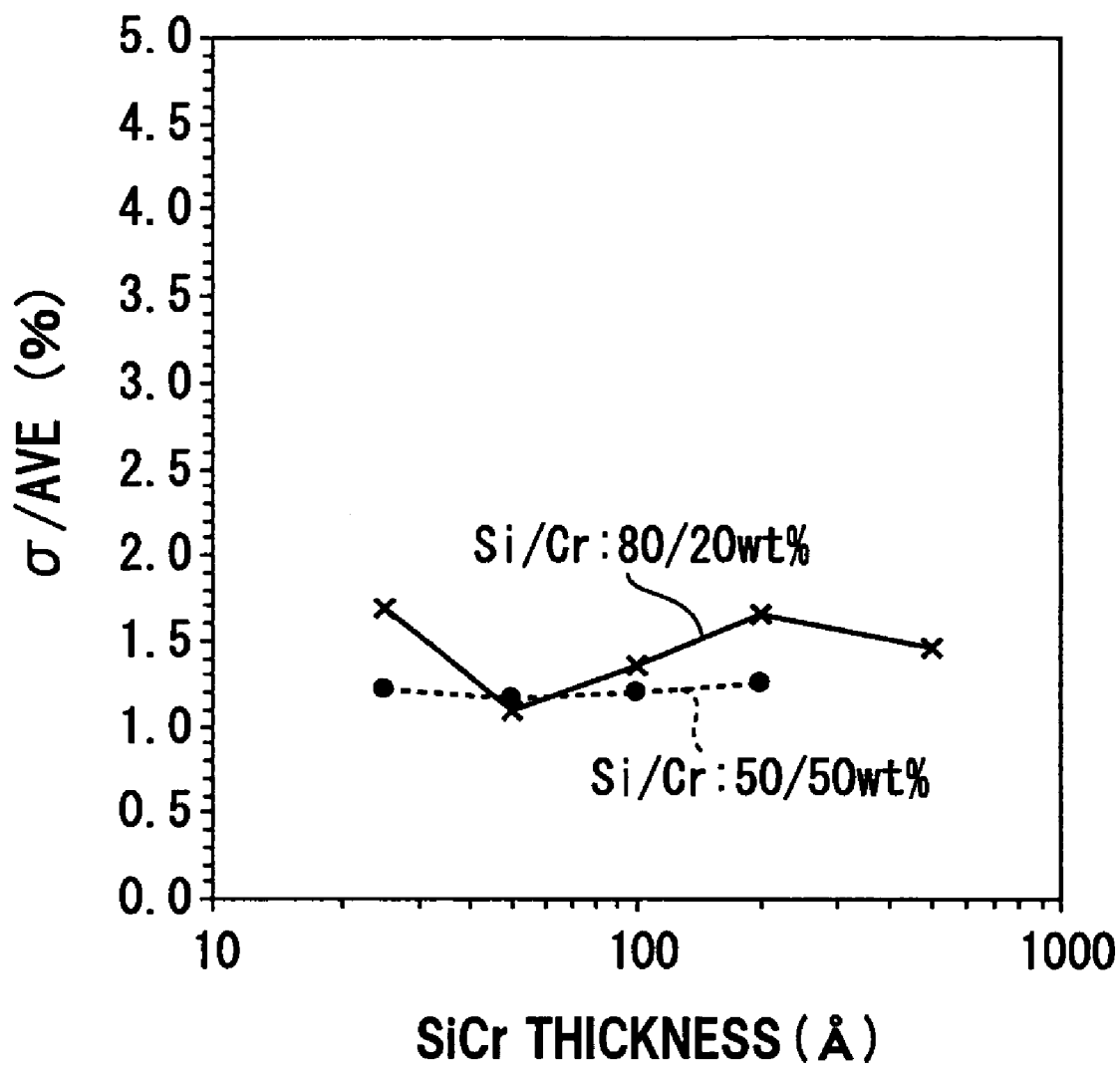
FIG. 5 is a diagram showing the relationship between a quantity $\sigma$/AVE representing the standard deviation $\sigma$ of the sheet resistance values of the metal thin-film resistance of the present invention measured at 63 points on the wafer surface as divided by the average AVE thereof and the film thickness, wherein the vertical axis represents the quantity $\sigma$/AVE in terms of percent, while the horizontal axis represents the film thickness of the CrSi film in terms of Angstroms.

Next, the characteristics of the metal thin-film resistance formed with the construction similar to that of the foregoing embodiment will be explained with reference to FIGS. 4 and 5, wherein FIG. 4 shows the relationship between the sheet resistance of the metal thin-film resistance and the film thickness, while FIG. 5 shows the relationship between the quantity σ/AVE, defined as a standard deviation σ of the sheet resistance values measured for the metal thin-film resistance at 63 points on the wafer surface divided by the average value thereof, and the CrSi film thickness, wherein the vertical axis of FIG. 4 shows the sheet resistance in terms of Ω/□ while the horizontal axis of FIG. 4 shows the CrSi thickness in terms of Angstroms. Further, the vertical axis of FIG. 5 shows the quantity σ/AVE (%), while the horizontal of FIG. 5 axis represents the CrSi film thickness in terms of Angstroms.

In the experiments, the metal thin-film resistance has been formed by using a multi-chamber sputtering apparatus with the condition of: DC power set to 0.7 kW; Ar flow rate set to 85 SCCM; and process pressure set to 8.5 mTorr, while using two kinds of targets, one having the composition Sr/Cr=50/50 wt % and the other having the composition 80/20 wt %, wherein the deposition has been made such that the CrSi thin-film has the thickness of 25-500 Angstroms by adjusting the duration of deposition. With regard to the experiment that uses the target composition of Si/Cr=50/50 wt %, the sample of the thickness of 500 Angstroms was not prepared.

Further, the Ar reverse sputtering process prior to the formation of the CrSi thin-film is conducted by using a multi-chamber sputtering apparatus under the condition of: DC bias set to 1250V; Ar flow rate set to 20 SCCM; and process pressure set to 8.5 mTorr, for the duration of 160 second. It should be noted that this process corresponds to the etching process of a thermal oxide film formed at the temperature of 1000° C. in a wet ambient with the depth of 400 Angstroms.

Further, in the present experiment, an AlSiCu film having the thickness of 5000 Angstroms is used for the metal interconnection underneath the metal thin-film resistance, wherein a structure has been used in which formation of the TiN film is suppressed from the top surface of the AlSiCu film in correspondence to the bottom part of the contact hole where the AlSiCu film and the CrSi thin film are contacted.

The measurement of the sheet resistance was conducted by two-terminal method in which a voltage of 1V is applied at both ends of one of the twenty metal thin-film resistances formed in the shape of strip each having a width of 0.5 82 m and a length of 50 μm for measurement of the current value. In this example, the contact hole used for connecting the metal interconnection pattern and the CrSi thin-film resistance was formed to have a size of 0.6 μm×0.6 μm.

As can be seen from FIG. 4, excellent linearity is maintained between the film thickness and sheet resistance from the large film thickness of 200 Angstroms or more to the very small film thickness of 25 Angstroms, irrespective of the composition of the target (Si/Cr=50/50 wt % and Sr/Cr=80/20 wt %). Thus, it becomes possible to form extremely fine metal thin-film resistance not possible with the conventional art with extremely small thickness.

Further, the variation of sheet resistance measured at the 63 points on the wafer surface in FIG. 5 indicates that the variation of the resistance value undergoes little influence of the film thickness in any of the cases of the target of the composition Si/Cr=50/50 wt % is used and the target of the composition of Si/Cr=80/20 wt % is used, and that the variation of the resistance is very small.

From this, it is concluded that, with the use of the Ar reverse sputtering process at the time of formation of the sidewall in the contact hole, it becomes possible to form extremely fine metal thin-film resistance patterns irrespective of the film thickness of the metal thin-film resistance.

Figure 6A:
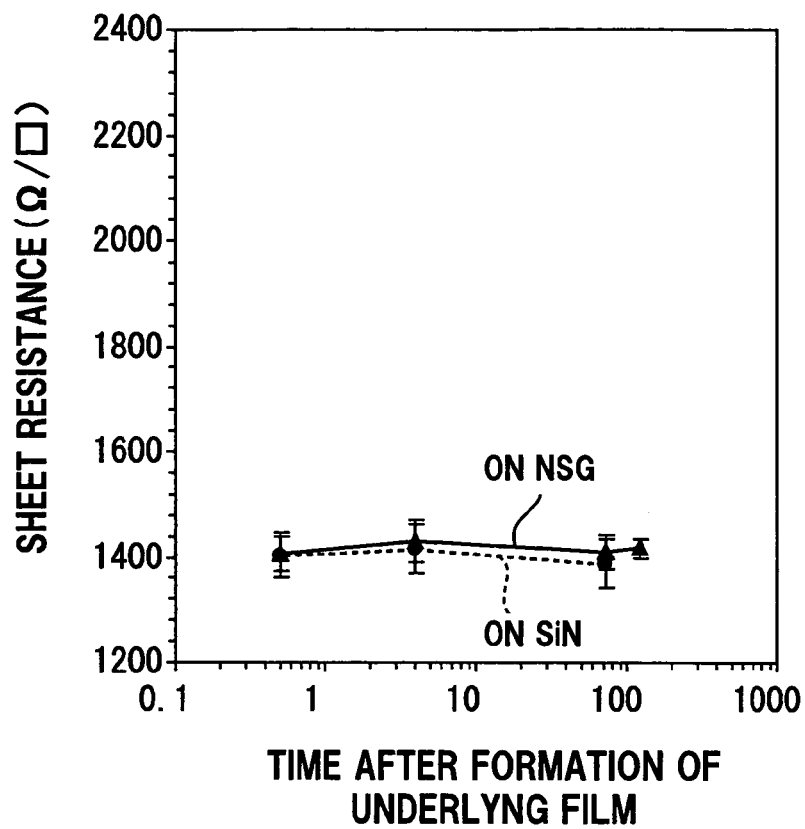
Figure 6B:
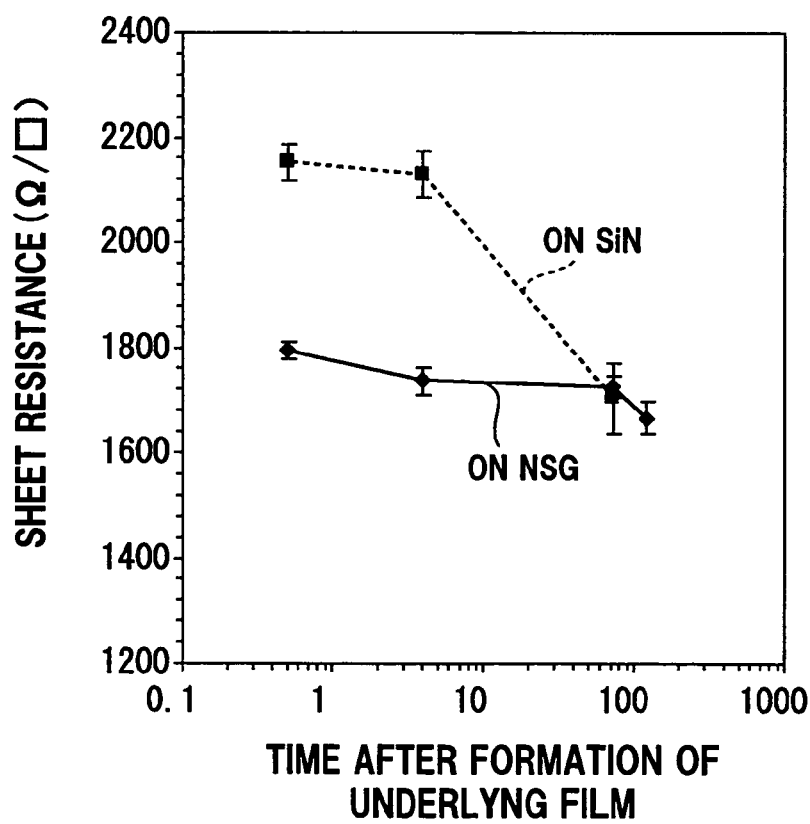

FIGS. 6A and 6B are diagrams showing the relationship between the sheet resistance of the CrSi thin-film resistance and the time elapsed after formation of the underlying film of the metal thin-film resistance for the case the Ar reverse sputtering process was not conducted before the formation of the metal thin-film for the metal thin-film resistance and the Ar reverse sputtering process was conducted before the formation of the metal thin-film for the metal thin-film resistance, wherein FIG. 6A shows the case in which the Ar reverse sputtering has been conducted while FIG. 6B shows the case in which no Ar reverse sputtering has been conducted. In FIGS. 6A and 6B, the vertical axis represents the sheet resistance in terms of Ω/□ while the horizontal axis represents the time elapsed after formation of the underlying film.

In the experiment of FIGS. 6A and 6B, two silicon wafers are prepared, one carrying a plasma SiN film formed by a plasma CVD process with the thickness of 2000 Angstroms for the underlying layer and the other carrying a plasma NSG (non-doped silicate glass) film formed by a plasma CVD process with the thickness of 2000 Angstroms, wherein a CrSi thin-film resistance is formed on these silicon wafers and the sheet resistance was measured by using four terminal method.

Here, the underlying plasma SiN film was formed by using a parallel plate plasma CVD apparatus at the temperature of 360° C. under the process pressure of 5.5 Torr with the RF power of 200 W while supplying an $SiH_4$ gas, an $N_2$ gas and an $NH_3$ gas with respective flow rates of 70 SCCM, 3500 SCCM and 40 SCCM.

On the other hand, the underlying plasma NSG film was formed by using the parallel plate plasma CVD apparatus at the temperature of 400° C. under the process pressure of 3.0 Torr with the RF power of 250 W while supplying an $SiH_4$ gas and an $N_2O$ gas with respective flow rates of 16 SCCM and 1000 SCCM.

Further, the CrSi thin-film resistance was formed by using a multi-chamber sputtering apparatus provided with a target of the composition of Si/Cr=80/20 wt % under the DC power of 0.7 kW, while setting the Ar flow rate to 85 SCCM, the process pressure to 8.5 mTorr and the deposition time of 13 seconds, such that the CrSi thin-film resistance has a thickness of 100 Angstroms.

In the case of conducting the Ar reverse sputtering process, the foregoing multi-chamber sputtering apparatus was used with the condition of DC bias set to 1250V, the Ar flow rate set to 20 SCCM and the process pressure set to 8.5 mTorr, wherein the processing was conducted for the duration of 80 seconds. It should be noted that this etching process corresponds to the etching of a thermal oxide film formed at 1000° C. in a wet ambient for the depth of 200 Angstroms.

As can be seen from FIG. 6B, there appears a large difference in the sheet resistance value, in the case the Ar reverse sputtering process is not applied before formation of the CrSi thin-film, depending on the underlying film (whether it is an SiN film or an NSG film). Further, it will be noted that the sheet resistance value experiences significant effect by the duration elapsed after formation of the underlying film until the CrSi thin-film resistance is formed.

In the case there has been conducted the Ar reverse sputtering process shown in FIG. 6A, on the other hand, it can be seen that the sheet resistance value of the CrSi thin-film resistance experiences little effect by the type of the underlying film or the elapsed time.

From this, it is concluded that the variation of the resistance value, caused by the elapsed time from the previous process steps or by the type of the underlying film, which may be changed depending on the product, can be improved significantly by conducting the Ar reverse sputtering process and then forming the metal thin-film for the metal thin-film resistance in continuation with the previous step without breaking the vacuum.

Figure 7:
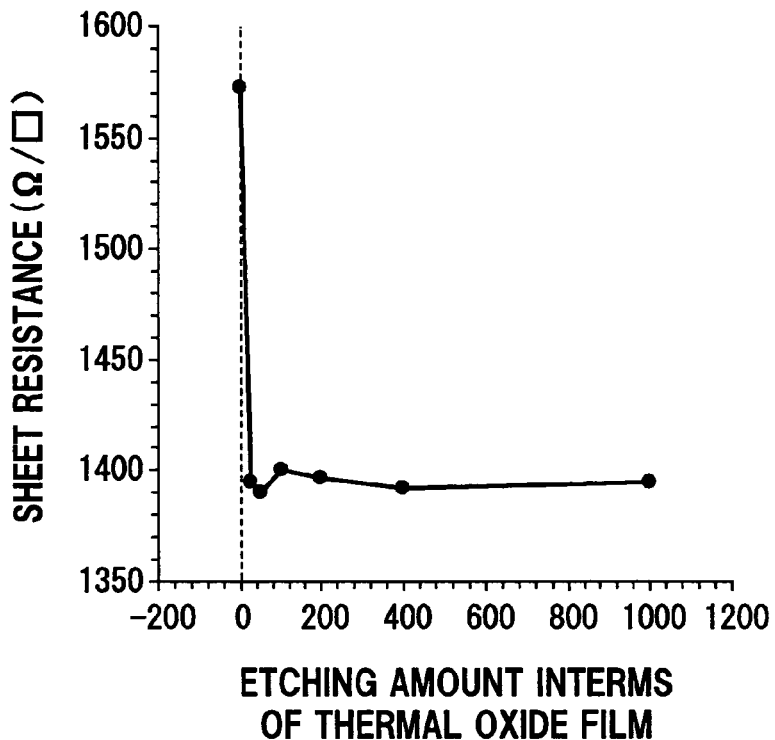
FIG. 7 is a diagram showing the relationship between the amount of Ar reverse sputtering process and the sheet resistance wherein the vertical axis represents the sheet resistance in terms of $\Omega/\square$ while the horizontal axis represents the etching amount converted to the etching amount of a thermal oxide film represented in terms of Angstroms.

FIG. 7 is a diagram showing the relationship between the amount of the Ar reverse sputtering and the sheet resistance, wherein the vertical axis represents the sheet resistance represented in terms of $\Omega/\square$, while the horizontal axis represents the amount of etching for the case of the thermal oxide film represented in terms of Angstroms.

In the experiment of FIG. 7, a CrSi thin-film resistance formed on a plasma NSG film under the condition similar to the case of FIGS. 6A and 6B has been used. Further, an Ar reverse sputtering process was applied to the plasma NSG film after one week from the formation thereof, and a CrSi thin-film resistance was formed on such a plasma NSG film. Thereby, the Ar reverse sputtering process was conducted under the same condition as in the case of FIGS. 6A and 6B except for the etching amount, wherein the etching amount is adjusted respectively to 0 Angstroms (no Ar reverse sputtering), 25 Angstroms, 50 Angstroms, 100 Angstroms, 200 Angstroms, 400 Angstroms and 1000 Angstroms in terms of the etching amount of a thermal oxide film formed in a wet ambient. Further, the sheet resistance of the CrSi thin-film resistance was measured by the four terminal method.

From the result of FIG. 7, it was discovered that desired stabilization of resistance value of the CrSi thin-film resistance is achieved by merely conducting the Ar reverse sputtering process with the amount of 25 Angstroms or more in terms of the equivalent etching amount of thermal oxide film formed in a wet ambient. In the experiment of FIG. 7 made with regard to the Ar reverse sputtering processing condition, samples have been prepared up to the etching amount of 1000 Angstroms in terms of the equivalent etching amount of the thermal oxide film. However, the result of FIG. 7 allows prediction that a similar effect of Ar reverse sputtering would be obtained even when the etching is conducted with the amount larger than 1000 Angstroms in terms of the equivalent etching amount of thermal oxide film, as long as there remains an underlying film in the region where the metal thin-film resistance is formed.

Further, it was discovered that the Ar reverse sputtering process not only provides influence on the effect of the underlying film to the resistance value of the CrSi thin-film resistance but also to the resistance value of the CrSi thin-film resistance itself.

Figure 8:
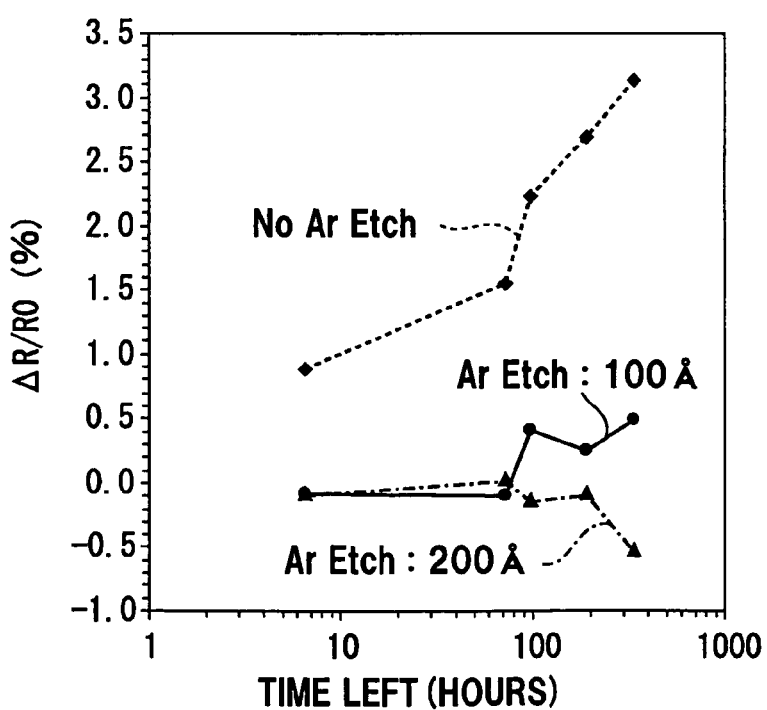
FIG. 8 is a diagram showing the relationship between the change rate of sheet resistance ($\Delta R/R$) of a CrSi thin-film formed for the metal thin-film resistance defined with reference to the sheet resistance of the as-formed state and the duration in which the CrSi thin-film formed for the metal thin-film resistance is left in the ambient of 25$\square$ and 45% humidity after formation thereof, the vertical axis representing the quantity $\Delta R/R$ in terms of percent, the horizontal axis representing the duration left in the ambient in terms of hours.

FIG. 8 is a diagram showing the relationship between the change rate ($\Delta R/R0$) of the sheet resistance value with regard to the sheet resistance value $R0$ of the thin-film resistance in the as-formed state and the duration in which the CrSi thin-film has been left in the ambient of 25° C. and 45% humidity after formation thereof. In FIG. 8, the vertical axis represents the quantity $\Delta R/R0$ (%) while the horizontal axis represents the duration (hours) in which the CrSi thin-film resistance has been left in the ambient.

In the experiment of FIG. 8, a plasma NSG film and a CrSi thin-film resistance thereon formed under the same condition as in the case of the experiments of FIGS. 6A and 6B were used for the CrSi thin-film resistance and the underlying insulation film.

With regard to the Ar reverse sputtering process, three experiments were prepared: one in which no Ar reverse processing was made (no Ar etching); one in which an Ar reverse sputtering was conducted for 40 seconds with the etching amount of 100 Angstroms in terms of equivalent etching amount of the thermal oxide (Ar etch: 100 Angstroms); and one in which an Ar reverse sputtering was conducted for 80 seconds with the etching amount of 200 Angstroms in terms of equivalent etching amount of thermal oxide.

In the sample not processed with the Ar reverse sputtering (no Ar etch), it can be seen that the resistance value increases with time after formation of the thin-film resistance and there appears a shift of resistance value of 3% or more after the thin-film resistance has been left in the ambient over 300 hours or more.

In the samples in which the Ar reverse sputtering processing has been made (Ar etch: 100 µm and Ar etch: 200 µm), on the other hand, it can be seen that the variation of the resistance value is decreased significantly, and deviation of the resistance value beyond ±1% from the as-deposited sheet resistance was not observed even when the thin-film resistance was left in the ambient over 300 hours or longer.

Further, the comparison of the experiments of: Ar etch=100 Angstroms and Ar etch=200 Angstroms, it was revealed that there is no significant difference, indicating that the amount of the Ar reverse sputtering is not important and only a small amount of etching provides the desirable effect.

Heretofore, the effect of the Ar reverse sputtering on the influence provided by the underlying film to the sheet resistance of the metal thin-film resistance or the effect of the Ar reverse sputtering on the influence of the duration in which the metal thin-film resistance has been left in the air has been examined with reference to FIGS. 4-8. It should be noted that these effects are by no means limited to the case in which the target has the specific composition of Si/Cr=50/50 wt % or Si/Cr=80/20 wt %, but similar effects are observed for all of the CrSi thin-films and the CrSiN films formed by using the target of the composition of Si/Cr=50/50–90/10 wt %.

Further, the Ar reverse sputtering process is by no means limited to the DC bias sputter etching process explained with the foregoing embodiment.

Figure 9:
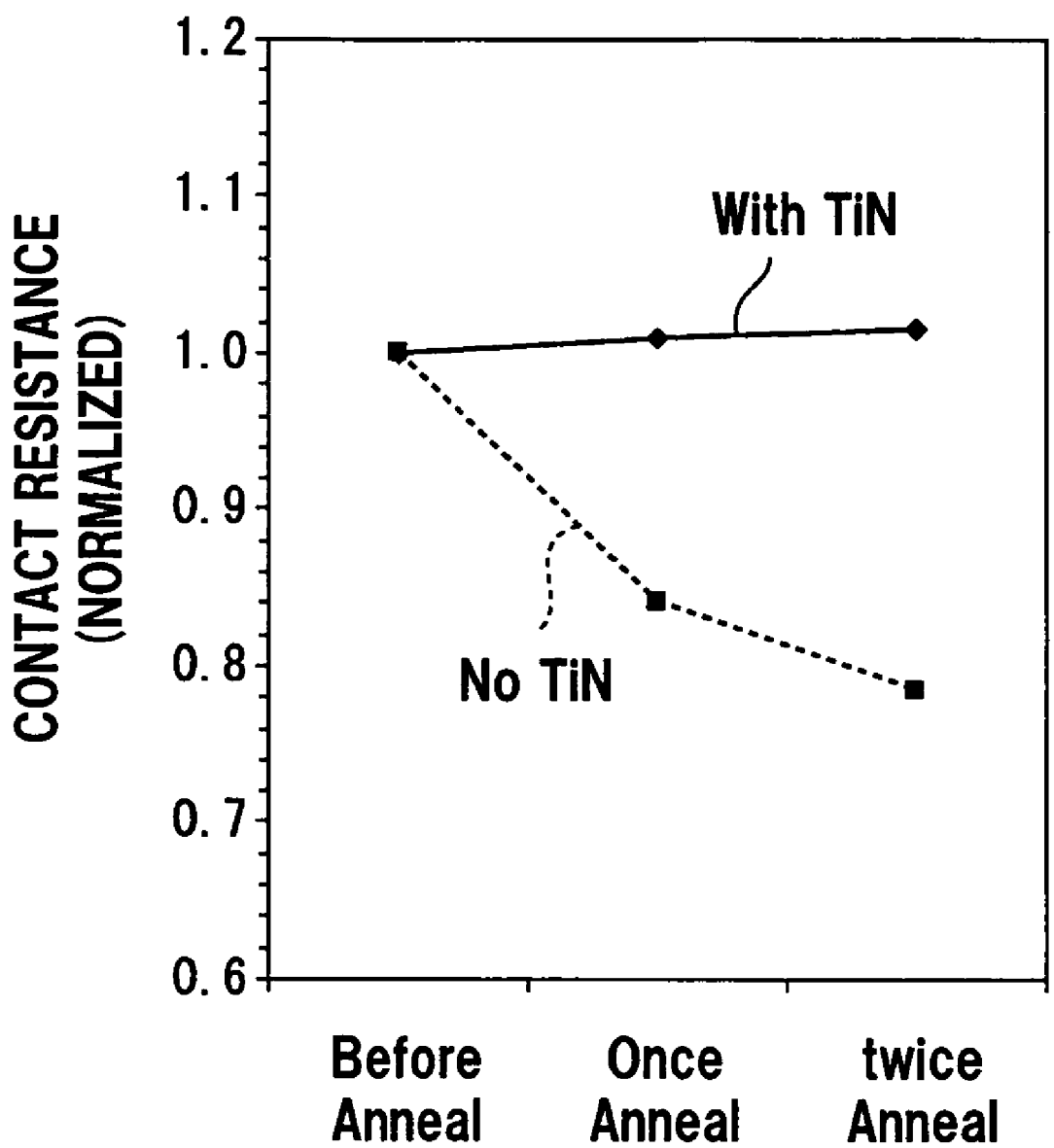
FIG. 9 is a diagram showing the variation of contact resistance between the metal thin-film and the metal interconnection caused by thermal annealing process for the samples in which a refractory metal film is left at the bottom of the contact hole at the time of formation of the contact hole and the sample in which the refractory metal film is completely removed from the bottom part of the contact hole, the vertical axis representing the value normalized by the contact resistance value before the thermal annealing process, the horizontal axis representing the number of thermal annealing processing.

FIG. 9 shows the contact resistance between the metal thin-film resistance and the metal interconnection pattern caused by thermal annealing process for the sample in which the refractory metal film is left at the bottom of the contact hole and the sample in which the refractory metal film is removed completely from the bottom of the contact hole at the time of formation of the contact hole. In FIG. 9, the vertical axis represents the contact resistance value normalized by the contact resistance value before the thermal annealing process, while the horizontal axis represents the number of the thermal annealing processes.

In the experiment of FIG. 9, the sample in which the refractory metal film is left at the bottom part of the contact hole with the thickness of about 500 Angstroms and the sample in which the refractory metal film is completely removed from the bottom part of the contact hole were prepared by adjusting the dry etching time at the time of formation of the contact hole. In this experiment, a TiN film was used for the refractory metal film.

In the experiment, the CrSi thin-film resistance was formed with the thickness of 50 Angstroms by using the target of the composition of Si/Cr=80/20 wt % with the DC power of 0.7 kW under the process pressure of 8.5 mTorr while setting the Ar flow rate to 85 SCCM for the duration of 6 seconds.

Further, the Ar reverse sputtering process before the formation of the CrSi thin-film resistance was conducted by setting the DC bias to 1250V, the Ar flow rate to 20 SCCM; the process pressure to 8.5 mTorr; and the processing time set to 160 seconds. It should be noted that this etching process corresponds to the process of etching a thermal oxide film formed at the temperature of 1000° C. in the wet ambient with the depth of 400 Angstroms.

In the experiment, the contact hole was formed to have a square form in the plan view having a size of 0.6 µm×0.6 µm. The contact resistance was measured by using four terminal method.

Thus, in the experiment, change of the contact resistance was investigated for the foregoing samples by adding a thermal annealing process conducted at 350° C. for the duration of 30 minutes.

Referring to FIG. 9, it can be seen that there is caused little change of contact resistance with respect to the contact resistance value before the thermal annealing process even when such a thermal annealing process is conducted twice in the sample in which the TiN film is left at the bottom of the contact hole (TiN: Yes). On the other hand, with regard to the sample (TiN: No) in which the TiN film is completely removed, it can be seen that there has been caused a change of contact resistance value of 20% or more as compared with the state before the thermal annealing process, as a result of the thermal annealing process conducted twice.

This indicates that the TiN film successfully functions as a barrier film preventing the resistance change caused by interaction of the CrSi thin-film and the metal interconnection pattern.

By interposing such a TiN film between the CrSi thin-film resistance and the metal interconnection pattern, it becomes possible to minimize the variation of the contact resistance caused by the thermal annealing process in the semiconductor fabrication process such as sintering process or CVD process. Further, it becomes possible to suppress the variation of contact resistance caused by the thermal process used in the assembling process such as soldering process. With this, it becomes possible to maintain the preset contact resistance and avoid any change of contact resistance associated with the assembling process. Thereby, the precision of the semiconductor device product is improved and the yield of production is improved.

In the fabrication process explained with reference to FIGS. 1-3, the metal film for the first layer metal interconnection pattern 11 and the refractory metal film are formed in continuation in the vacuum environment in the step (1), while it should be noted that the fabrication process of the present invention is by no means limited to this example.

For example, there arises a problem of difficulty of achieving electrical contact because of the native oxide film on the surface of the interconnection metal film in the case the metal film for the first layer interconnection pattern 11 is exposed to the air and then the refractory metal film is formed. In such a case, it is possible to achieve secure electrical connection between the first layer metal interconnection pattern 11 and the CrSi thin-film resistance 21 by removing the refractory metal film 9 entirely from the bottom of the contact hole 17 in the step of forming the contact hole 17 in the second layer interlayer insulation film 15 on the first metal interconnection pattern 11 formed of the metal pattern and the refractory metal film 9 formed as a result of patterning of the metal film and the refractory metal film.

Further, while the refractory metal film is formed in the foregoing step (1) with the thickness of 800 Angstroms in the prospect of using the same also as an antireflection coating in addition to the barrier film, formation process of the refractory metal film is by no means limited to this.

Generally, the refractory metal film for use as antireflection coating is used with the thickness of 500 Angstroms or less, while in the case it is desired to leave the refractory metal film 9 at the bottom of the contact hole as a barrier film, it is preferable to form the refractory metal film 9 to have the thickness of 500 Angstroms or more in order to obtain the performance of stable barrier film, in view of the possibility of loss of the film thickness of the refractory metal film 9 at the time of overetching used for formation of the contact hole 17 (see step (3) noted before) or at the time of the Ar reverse sputtering process (see step (4) noted before) at the time of formation of the metal thin-film.

Of course, it is possible to minimize the loss of film thickness of the refractory metal film 9 and realize a reliable barrier film even in the case the refractory metal film 9 has a thickness of 500 Angstroms or less, by optimizing the etching condition at the time of formation of the contact hole or the Ar reverse sputtering condition.

Further, while the foregoing step (4) carries out the Ar reverse sputtering process immediately before formation of the CrSi thin-film 27, electrical contact can be achieved between the CrSi thin-film 27 and the first layer interlayer metal interconnection pattern 11 without carrying out such an Ar reverse sputtering process in the case the refractory metal film 9 is left at the bottom part of the contact hole 17 as a barrier film, and the refractory metal film 9 of TiN does not form a solid native oxide as in the case of an AlSiCu film when the it is exposed to the air. In the case the Ar reverse sputtering process is not applied, the tapered shape is not formed at the top edge part of the contact hole 17 and the reverse sputtering residue 19 is not formed also. However, it is preferable to carry out the Ar reverse sputtering process because the resistance value of the CrSi thin-film resistance 21 is stabilized as a result of such an Ar reverse sputtering process conducted immediately before formation of the CrSi thin film 27.

Further, while the foregoing embodiment uses a planarized film for the second layer interlayer insulation film 15 by forming an SOG film and by etching back the same, it should be noted that the insulation film forming the underlying film of the metal thin-film resistance is not limited to this.

Thus, for the insulation film constituting the underlying film of the metal thin-film resistance, it is possible use other insulation films such as a planarized insulation film planarized by a CMP (chemical mechanical polishing) process, a plasma CVD oxide film not applied with planarization process, an SOG film planarized by thermal annealing process after applying an SOG, a planarized CVD insulation film planarized by etch-back process after film formation by an HD (high-density plasma) CVD process, and the like.

In the case of analog resistance elements, there are often the cases in which the resistance elements are used with the construction in which not only TCR but also parity or relative precision is important. Thus, in the case the metal thin-film resistance of the present invention is to be used for an analog resistance element, it is preferable that the underlying insulation film of the metal thin-film resistance is processed with a planarization processing.

In the foregoing embodiment, the passivation film 23 is formed on the CrSi thin-film resistance 21, while it should be noted that the present invention is by no means limited to such a specific construction. For example, the insulation film formed on the CrSi thin-film resistance may be any insulation film such as the interlayer insulation film used for forming a second layer metal interconnection thereon.

Figure 10A:
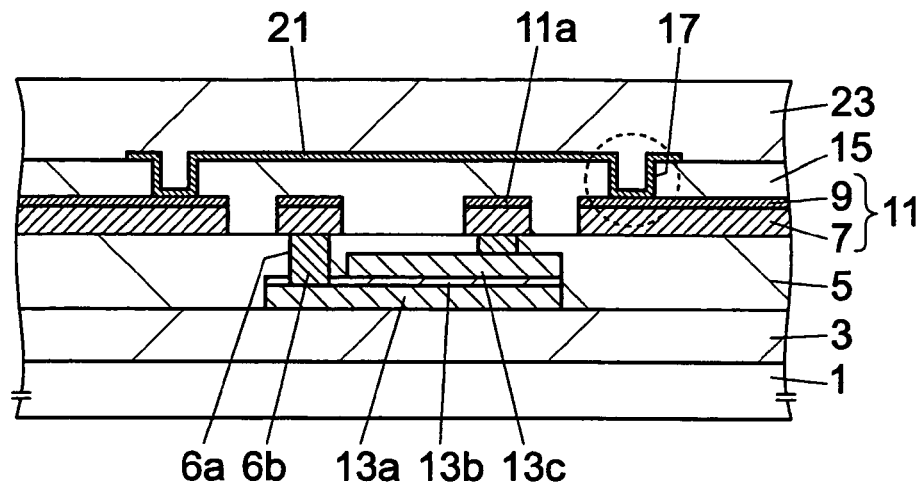
Figure 10B:
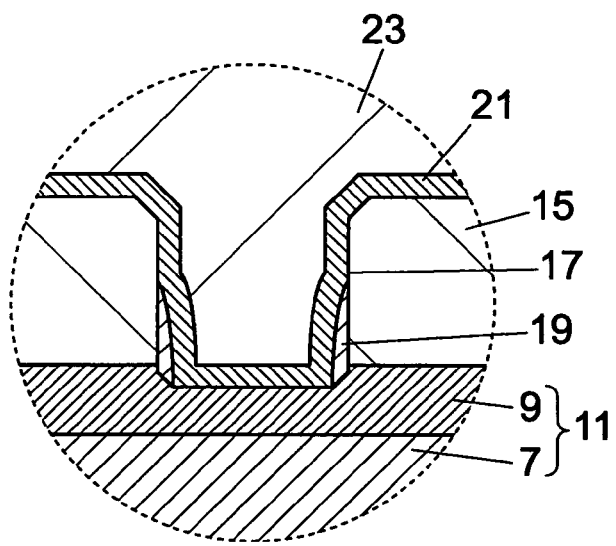

FIGS. 10A and 10B are cross-sectional diagrams showing other embodiment of the first mode of the present invention, wherein FIG. 10A is a cross-sectional diagram showing the region where the metal thin-film resistance is to be formed, while FIG. 10B shows the part surrounded in FIG. 10A by a broken line with enlarged scale.

It should be noted that this embodiment includes a capacitor in the region underneath the metal thin-film in place of the transistors in the embodiment of FIGS. 1A and 1B. In FIGS. 10A and 10B, those parts corresponding to the parts described with reference to FIGS. 1A and 1B are designated by the same reference numerals and the description thereof will be omitted.

Referring to FIG. 10A, the device isolation oxide 3 is formed on the silicon substrate 1, and a lower electrode 13a of polysilicon is formed on the device isolation oxide 3 in the region right underneath the CrSi thin-film resistance 21. Further, an upper electrode 13c of polysilicon is formed on the lower electrode 13a via a capacitor insulation film 13b. The capacitor insulation film 13b is formed for example of a silicon oxide film or a silicon nitride film, or lamination of a silicon oxide film or silicon nitride film. Thereby, the lower electrode 13a, the capacitor insulation film 13b and the upper electrode 13c constitute the capacitor.

Further, the first layer interlayer insulation film 5 is formed on the silicon substrate 1 including the region of the device isolation oxide 3 and the capacitor, and contact holes 6a and conductive plugs 6b are formed in the first layer interlayer insulation film 5 in correspondence to the region of the lower electrode 13a not formed with the upper electrode 13c and further in correspondence to the upper electrode 13c.

On the first layer interlayer insulation film 5, there are formed the first layer metal interconnection patterns 11 and 11a formed of the metal pattern 7 and the refractory metal film 9, the second layer interlayer insulation film 15, the contact hole 17 having a tapered shape at the top edge part thereof, the reverse sputtering residue 19, the CrSi thin-film resistance 21, and the passivation film 23.

Underneath the region of the CrSi thin-film resistance 21, there are disposed the first layer metal interconnection pattern 11a and the capacitance element formed by the lower electrode 13a, the capacitor insulation film 13b and the upper electrode 13c.

In this embodiment, in which the capacitance element constituting the semiconductor integrated circuit and the first layer interconnection pattern 11a are disposed in the region underneath the CrSi thin-film resistance 21, it is possible to reduce the chip area of the semiconductor integrated circuit.

It should be noted that the embodiment of the present invention can be formed by carrying out the process steps explained with reference to FIGS. 1 through 3 similarly to the previous embodiment, after formation of the lower electrode 13a, the capacitor insulation film 13b and the upper electrode 13c on the device isolation film 3 according to a know process.

Figure 11A:
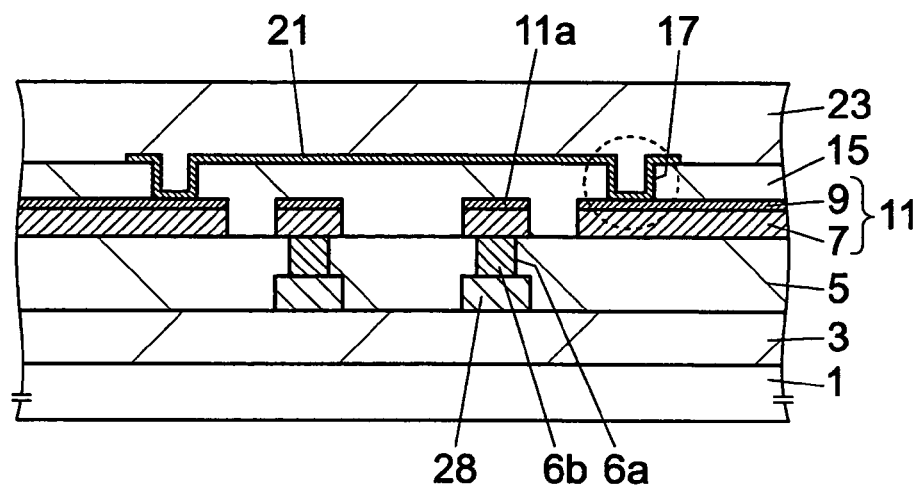
Figure 11B:
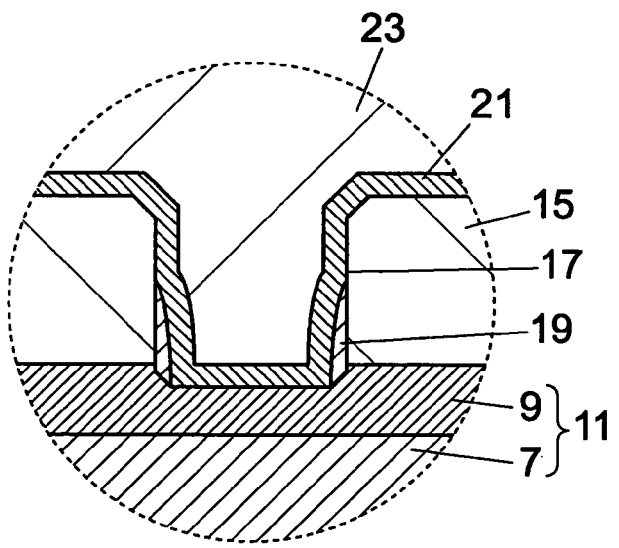

FIGS. 11A and 11B are cross-sectional diagrams showing other embodiment of the first mode of the present invention, wherein FIG. 11A is a cross-sectional diagram showing the region where the metal thin-film resistance is to be formed, while FIG. 11B shows the part surrounded in FIG. 11A by a broken line with enlarged scale.

It should be noted that this embodiment includes a polysilicon interconnection pattern in the region underneath the metal thin-film in place of the transistors in the embodiment of FIGS. 1A and 1B. In FIGS. 11A and 11B, those parts corresponding to the parts described with reference to FIGS. 1A and 1B are designated by the same reference numerals and the description thereof will be omitted.

Referring to FIG. 11A, the device isolation oxide 3 is formed on the silicon substrate 1, and a polysilicon interconnection pattern 23 of a polysilicon film is formed on the device isolation oxide 3 in the region right underneath the CrSi thin-film resistance 21.

Further, the first layer interlayer insulation film 5 is formed on the silicon substrate 1 including the region of the device isolation oxide 3 and the polysilicon pattern 28, and contact holes 6a and conductive plugs 6b are formed in the first layer interlayer insulation film 5 in correspondence to the polysilicon pattern 28.

On the first layer interlayer insulation film 5, there are formed the first layer metal interconnection patterns 11 and 11a formed of the metal pattern 7 and the refractory metal film 9, the second layer interlayer insulation film 15, the contact hole 17 having a tapered shape at the top edge part thereof, the reverse sputtering residue 19, the CrSi thin-film resistance 21, and the passivation film 23. Further, the first layer metal interconnection pattern 11a and the polysilicon interconnection pattern 28 are disposed in the region underneath the CrSi thin-film resistance 21.

In this embodiment, in which the polysilicon pattern 28 constituting the semiconductor integrated circuit and the first layer interconnection pattern 11a are disposed in the region underneath the CrSi thin-film resistance 21, it is possible to reduce the chip area of the semiconductor integrated circuit.

It should be noted that the embodiment of the present invention can be formed by carrying out the process steps explained with reference to FIGS. 1 through 3 similarly to the previous embodiment, after formation of the polysilicon pattern 3 on the device isolation film 3 according to a known process.

Figure 12A:
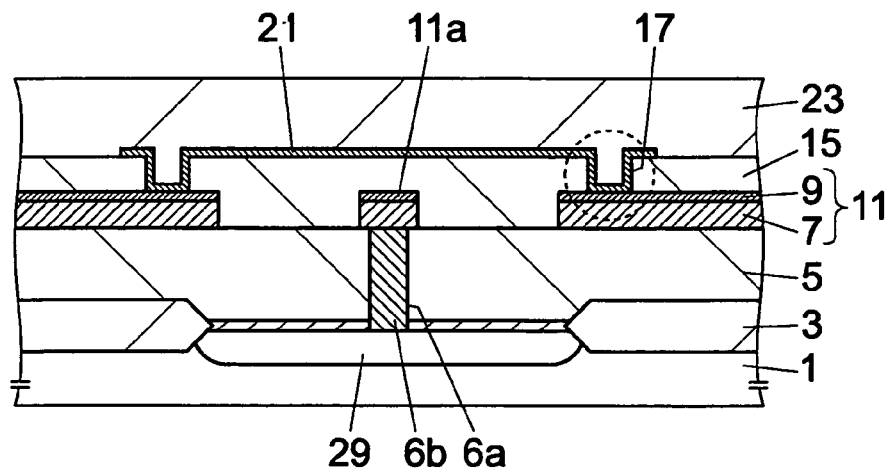
Figure 12B:
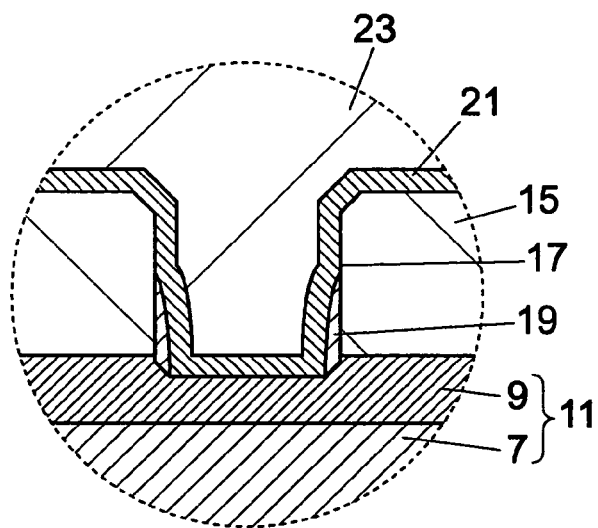

FIGS. 12A and 12B are cross-sectional diagrams showing other embodiment of the first mode of the present invention, wherein FIG. 12A is a cross-sectional diagram showing the region where the metal thin-film resistance is to be formed, while FIG. 12B shows the part surrounded in FIG. 12A by a broken line with enlarged scale. It should be noted that this embodiment includes a diffusion region in the region underneath the metal thin-film in place of the transistors in the embodiment of FIGS. 1A and 1B. In FIGS. 12A and 12B, those parts corresponding to the parts described with reference to FIGS. 1A and 1B are designated by the same reference numerals and the description thereof will be omitted.

Referring to FIG. 12A, the device isolation oxide 3 is formed on the silicon substrate 1, and an impurity diffusion region 29 is formed on the surface of the silicon substrate 1 defined by the device isolation oxide 3 in the region right underneath the CrSi thin-film resistance 21.

Further, the first layer interlayer insulation film 5 is formed on the silicon substrate 1 including the region of the device isolation oxide 3 and the impurity diffusion region 29, and contact holes 6a and conductive plugs 6b are formed in the first layer interlayer insulation film 5 in correspondence to the impurity diffusion region 29.

On the first layer interlayer insulation film 5, there are formed the first layer metal interconnection patterns 11 and 11a formed of the metal pattern 7 and the refractory metal film 9, the second layer interlayer insulation film 15, the contact hole 17 having a tapered shape at the top edge part thereof, the reverse sputtering residue 19, the CrSi thin-film resistance 21, and the passivation film 23. Further, the first layer metal interconnection pattern 11a and the impurity diffusion region 29 are disposed in the region underneath the CrSi thin-film resistance 21.

In this embodiment, in which the impurity diffusion region 29 constituting the semiconductor integrated circuit and the first layer interconnection pattern 11a are disposed in the region underneath the CrSi thin-film resistance 21, it is possible to reduce the chip area of the semiconductor integrated circuit.

It should be noted that the embodiment of the present invention can be formed by carrying out the process steps explained with reference to FIGS. 1 through 3 similarly to the previous embodiment, after formation of the device isolation film 3 and the impurity diffusion region 29 according to a known process.

Figure 13A:
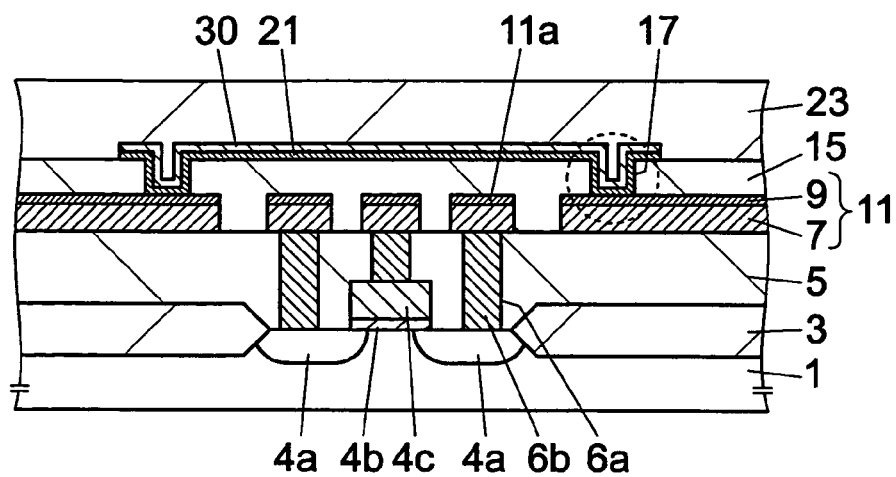
Figure 13B:
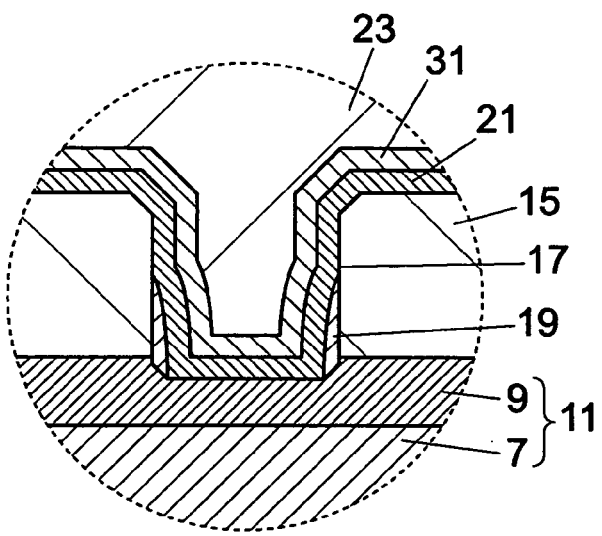

FIGS. 13A and 13B are cross-sectional diagrams showing other embodiment of the first mode of the present invention, wherein FIG. 13A is a cross-sectional diagram showing the region where the metal thin-film resistance is to be formed, while FIG. 13B shows the part surrounded in FIG. 13A by a broken line with enlarged scale. In FIGS. 13A and 13B, those parts corresponding to the parts described with reference to FIGS. 1A and 1B are designated by the same reference numerals and the description thereof will be omitted.

Referring to FIG. 13A, the device isolation oxide 3 is formed on the silicon substrate 1, wherein the silicon substrate is further formed with a transistor having impurity diffusion regions 4a and 4a, a gate insulation film 4b and a gate electrode 4c, the first layer interlayer insulation film 5, the contact holes 6a, the conductive plugs 6b, the first layer metal interconnection patterns 11 and 11a of a metal pattern 7 and a refractory metal film 9, the second layer interlayer insulation film 15, the contact hole 17 having a tapered shape at the top edge part thereof, the reverse sputtering residue 19, and the CrSi thin-film resistance 21.

Further, there is formed a CrSiN film (metal nitride film) 30 on the top surface of the CrSi thin film resistance 21. Thereby, no CrSiO is formed between the CrSi thin-film resistance 21 and the CrSiN film 30.

Further, the passivation film 23 is formed on the second layer interlayer insulation film 15 including the region where the CrSi thin-film resistance 21 and the CrSiN film 30 are formed.

In this embodiment, in which the transistor constituting the semiconductor integrated circuit and the first layer interconnection pattern 11a are disposed in the region underneath the CrSi thin-film resistance 21, it is possible to reduce the chip area of the semiconductor integrated circuit.

Hereinafter, the process for fabricating this embodiment will be explained.

First, the device isolation oxide 3 and the transistor having the impurity diffusion regions 4a and 4a, the gate insulation film 4b and the gate electrode 4c are formed on the silicon substrate 1 in the form of wafer according to the process steps (1)-(3) explained with reference to FIGS. 2A-2C, and the first layer interlayer insulation film 5, the contact hole 6a, the conductive plug 6b, the first layer metal interconnection patterns 11a and 11b formed of the metal interconnection pattern 7 and the refractory metal film 9, the second layer interlayer insulation film 15 and the contact hole 17 are formed.

Next, under the same condition as the step (4) explained with reference to FIG. 2D, an Ar reverse sputtering process is applied to the surface of the interlayer insulation film 5 in a vacuum environment by using an Ar sputtering chamber of a multi-chamber sputtering apparatus, and the reverse sputtering residue 19 is formed together with the tapered shape at the top edge part of the contact hole 17.

Next, after formation of the CrSi thin film, a CrSiN film is formed on the CrSi thin-film without breaking the vacuum.

For example, the CrSi target of the composition of Si/Cr=80/20 wt % used with the formation of the CrSi thin film is used, and the deposition of the CrSiN film is made on the CrSi thin-film with the thickness of about 50 Angstroms under the condition of: DC power set to 0.7 kW; flow rate of Ar+N$_2$ (a mixed gas of Ar and nitrogen) set to 85 SCCM, the process pressure set to 8.5 mTorr, for the duration of 6 seconds.

Next, the CrSiN film and the CrSi thin-film are patterned, and a laminated pattern of the CrSiN film 30 and the CrSi thin-film resistance 21 is formed.

Similarly to the process explained with reference to FIGS. 1A and 1B through FIG. 3, the CrSi thin-film resistance is electrically connected to the first layer metal interconnection pattern 11, and there is no need of conducting removal process metal oxide from the surface of the CrSi thin-film resistance by using a hydrofluoric acid solution as in the case of the conventional art. Further, because the top surface of the CrSi thin-film resistance 21 is now covered with the CrSiN film 30, there occurs no oxidation at the top surface of the CrSi thin-film resistance even when it is exposed to the ambient containing oxygen.

Thereafter, the passivation film 23 is formed on the second layer interlayer insulation film 15.

Generally, metal thin-film is highly reactive with oxygen, and thus, there occurs a change of resistance value in the case the metal thin-film is left in the air over a long time.

In this example, the problem of change of the resistance value of the CrSi thin film resistance 21 caused by exposure of the top surface of the CrSi thin-film resistance 21 to the air is prevented by forming the CrSiN thin film 30 on the top surface of the CrSi thin-film resistance 21.

Here, it should be noted that the electrical connection between the CrSi thin film and the first layer metal interconnection pattern 11 is completed in the state in which the CrSi thin-film for the CrSi thin-film resistance 21 is formed. Thus, the CrSi thin-film 21 does not experience any change of the characteristics even when a new film is formed thereon.

Figure 14:
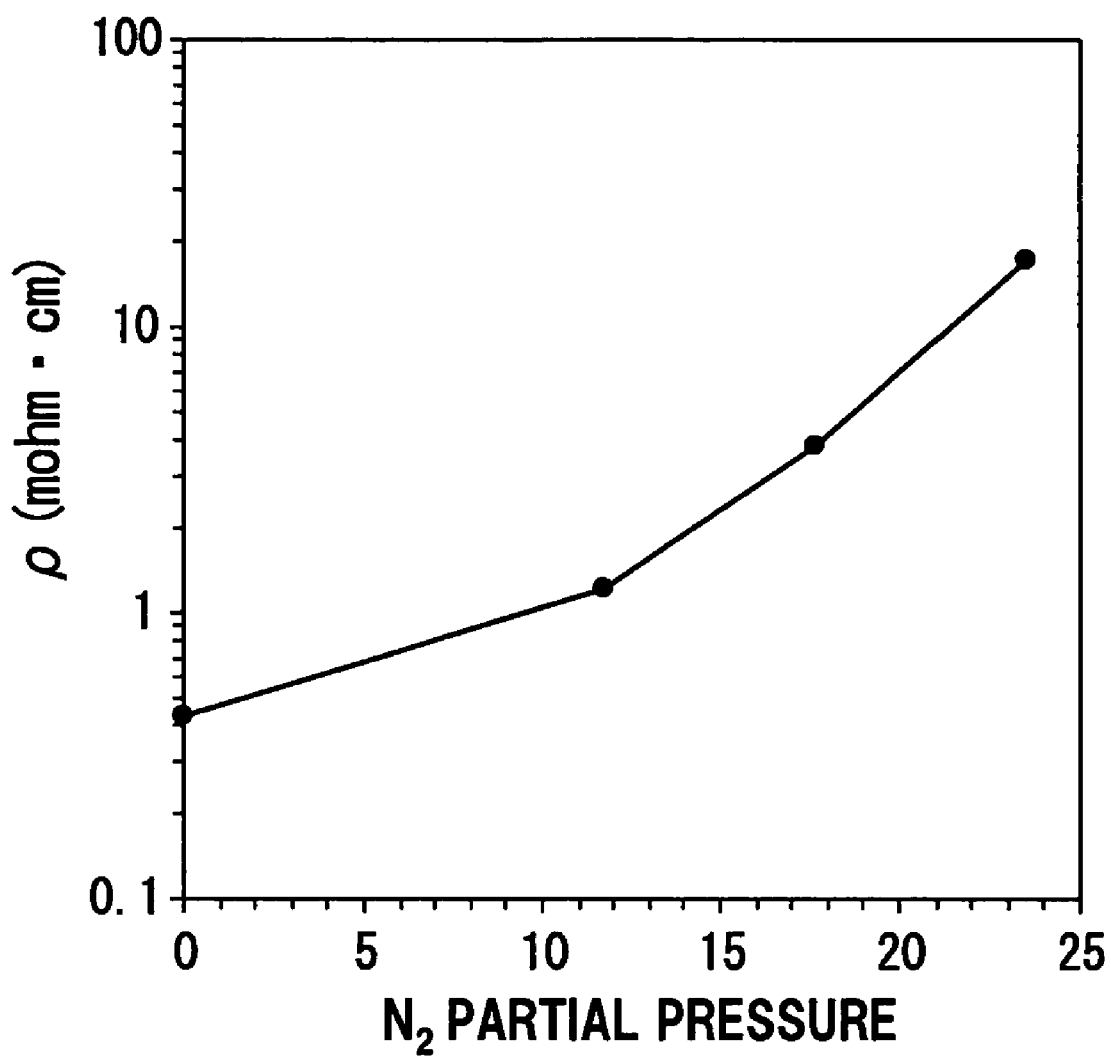
FIG. 14 is a diagram showing the relationship between the $N_2$ partial pressure in the gas used for forming a CrSiN film and the resistivity of the CrSiN film thus formed, wherein the vertical axis represents the resistivity $\rho$ in terms of mohm·cm, while the horizontal axis represents the $N_2$ partial pressure in terms of percent.

FIG. 14 is a diagram showing the relationship between the N$_2$ partial pressure used in the ambient gas for formation of the CrSiN film and the resistivity of the CrSiN film, wherein the vertical axis represents the resistivity $\rho$ in terms of mohm·cm and the horizontal axis represents the N$_2$ partial pressure represented in terms of percent. Here, the target having the composition of Si/Cr=50/50 wt % is used under the condition of: DC power set to 0.7 kW; Ar+N$_2$ flow rate set to 85 SCCM; process pressure set to 8.5 mTorr, wherein the processing is conducted over the duration of 6 seconds while controlling the N$_2$ partial pressure of the Ar+N$_2$ gas.

It will be noted form FIG. 14 that the CrSiN film formed by such a reactive sputtering process under the N$_2$ partial pressure set to 18% or more shows the resistivity value larger than the case in which no addition of N$_2$ was made (0% N$_2$ partial pressure) by ten times or more.

Thus, by forming the CrSiN film by setting the N$_2$ partial pressure to 18% or more, the overall resistance value of the CrSi thin-film resistance is determined by the CrSi thin film even when the CrSiN film is formed directly on the CrSi thin-film resistance, and the CrSiN film provides no substantial effect on the resistance value.

Here, the upper limit of the N$_2$ partial pressure is about 90%. When the N$_2$ partial pressure is increased beyond 90%, there is caused a serious decrease of sputtering rate, leasing to degradation of production efficiency.

Further, in the case the CrSiN film is formed with such a reactive sputtering process while setting the N$_2$ partial pressure to 6-11%, it is possible to use the CrSiN film itself as the metal thin-film resistance.

While the foregoing embodiment has the CrSiN film 303 on the CrSi thin-film resistance 21, it is also possible to construct such that the CrSi thin-film resistance 21 carries a CVD insulation film such as a CVD silicon nitride film. However, general multi-chamber sputtering apparatus does not include a CVD chamber, and it is necessary to introduce a new facility for forming a CVD insulation film, which such addition of new facility increases the production cost of the semiconductor device substantially.

On the other hand, with the foregoing embodiment in which the CrSiN film 30 is formed on the CrSi thin-film 27 for formation of the CrSi thin-film resistance 21, it is not possible to form the CrSiN film 30 functioning as the anti-oxidation cover film of the CrSi thin-film resistance 21 by using the existing multi-chamber sputtering apparatus, without introducing a new apparatus.

Further, the mode of having the CrSiN film 30 on the CrSi thin-film resistance 21 as in the embodiment explained with reference to FIGS. 13A and 13B can be applied to each embodiment explained with reference to FIGS. 10A and 10B through FIGS. 12A and 12B.

Figure 15A:
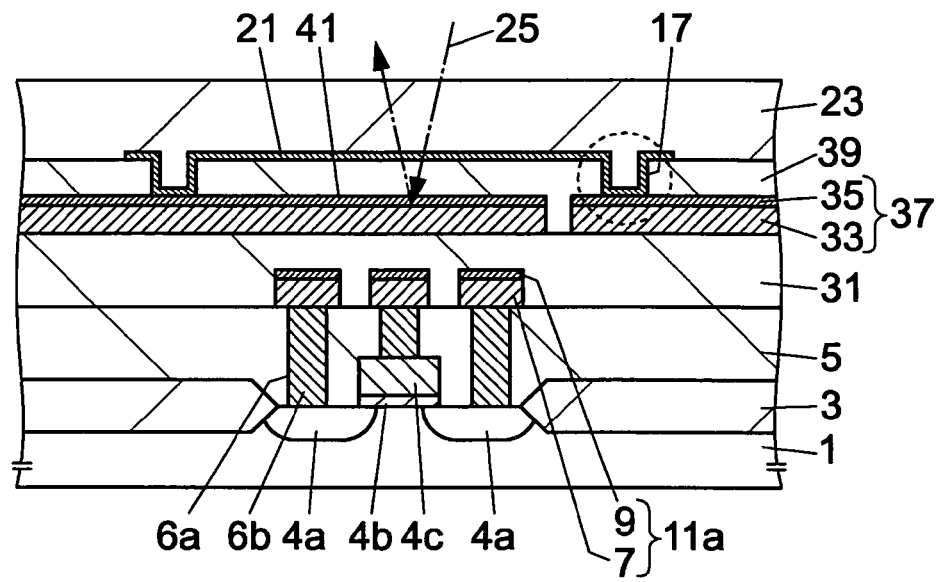
Figure 15B:
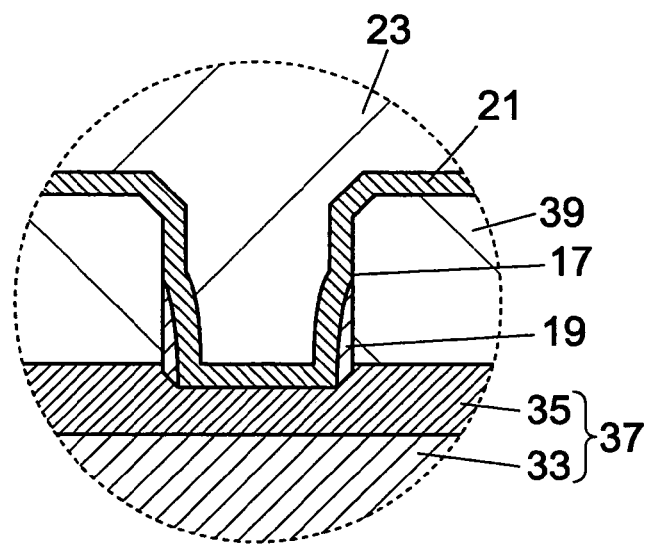

FIGS. 15A and 15B are cross-sectional diagrams showing an embodiment of the first mode and fifth mode of the present invention, wherein FIG. 15A is a cross-sectional diagram showing the region where the metal thin-film resistance is to be formed, while FIG. 15B shows the part surrounded in FIG. 15A by a broken line with enlarged scale. Those parts corresponding to the parts explained already with reference to FIGS. 1A and 1B are designated by the same reference numerals and the description thereof will be omitted.

Referring to FIG. 15A, the device isolation oxide 3 is formed on the silicon substrate 1, and the transistor having the impurity diffusion regions 4a and 4a, the gate insulation film 4b and the gate electrode 4c is formed on the device region defined by the device isolation oxide 3 in the region right underneath the CrSi thin-film resistance 21.

Further, the first layer interlayer insulation film 5 is formed on the silicon substrate 1 including the region of the device isolation oxide 3 and the transistor, and contact holes 6a and conductive plugs 6b are formed in the first layer interlayer insulation film 5 in correspondence to the diffusion regions 4a and 4a and the gate electrode 4c.

On the first layer interlayer insulation film 5 and the conductive plugs 6b, there is formed the first layer metal interconnection patterns 11a formed of the metal pattern 7 and the refractory metal film 9. Further, the first layer metal interconnection pattern 11 of the metal pattern 7 and the refractory metal film 9 is formed on the region of the first layer interlayer insulate film 5 not illustrated.

On the first layer interlayer insulation film 5 including the formation region of the first layer interconnection pattern 11a, there is formed a second layer interlayer insulation film 31 of lamination of consecutively a lowermost plasma CVD oxide film, an intermediate SOG film and an uppermost plasma CVD oxide film, wherein the second layer interlayer insulation film 31 is illustrated as if it is a single layer film in FIG. 15A.

On the second layer interlayer insulation film 31, there is formed a second layer metal interconnection pattern formed of lamination of a metal pattern 33 and a refractory metal film 35 formed on the metal pattern 33, wherein the metal pattern 33 may be formed of an AlSiCu film, for example. The refractory metal film 35 is formed of a TiN film, which functions also as an anti-reflection coating and at the same time as a barrier film. Further, a part of the second layer metal interconnection pattern 27 extends to the reaction underneath the CrSi thin-film resistance 21 and constitutes a layer beam interruption film 41.

Further, on the second layer interlayer insulation film 31 including the region where the second layer metal interconnection pattern 37 and the laser beam interruption film 41 are formed, there is formed a third interlayer insulation film (underlying insulation film) 39 formed of lamination of a lowermost plasma CVD oxide film, an intermediate SOG film and an uppermost plasma CVD oxide film, wherein FIG. 15 shows the third interlayer insulation film 39 as if it is a single layer film. Further, the first layer interlayer insulation film 39 is formed with the contact holes 17 in correspondence to the both end parts of the metal thin-film resistance and the second layer metal interconnection pattern 37.

As shown in FIG. 15B, a part of the surface of the refractory metal 35 is removed at the bottom part of the contact hole 17. Further, the contact hole 17 has a tapered shape at the top edge part thereof. Further, the inner wall of the contact hole 17 is formed with the reverse sputtering residue 19. It should be noted that illustration of the foregoing tapered shape at the top edge part of the contact hole 17 or formation of the reverse sputtering residue 19 on the inner wall surface of the contact hole is omitted in the representation of FIG. 15A.

It should be noted that the foregoing tapered shape at the top edge part of the contact hole 17 and the reverse sputtering residue 19 are formed at the time of conducting the Ar reverse sputtering process to the third layer interlayer insulation film 39 after formation of the contact hole 17. Thus, the reverse sputtering residual 19 contains the material of the refractory metal film 35, the material of the third layer interlayer insulation film 39 and Ar as the constituent elements thereof. Thus, in the present case, the reverse sputtering residue contains the elements of Ti, N, Si, 0 and Ar.

Further, on the third layer interlayer insulation film 39, the CrSi thin-film resistance 21 is formed so as to extend from the region between the contact holes 17 and 17 and further on the second layer metal interconnection pattern 27.

Thereby, both end parts of the CrSi thin-film resistance 21 are connected electrically to the second layer metal interconnection pattern 37 at the respective contact holes 17.

Further, it should be noted that the laser beam interruption film 41 is disposed underneath the CrSi thin-film resistance 21 via the third-layer interlayer insulation film 39 in the construction of FIG. 15A, and the first layer metal interconnection pattern 11a and the transistor are disposed underneath the laser beam interruption film 41. Further, the passivation film 23 is formed on the third layer interlayer insulation film 39 formed so as to include the region where the CrSi thin-film resistance 21 is formed.

Because the transistor constituting the semiconductor integrated circuit and the first layer metal interconnection pattern 11a are disposed in the region underneath the CrSi thin-film resistance 21 similarly to the embodiment explained with reverence to FIGS. 1A and 1B, and thus, it is possible to reduce the area of the semiconductor chip.

Further, because the laser beam interruption film 41 of metal material is provided between the third layer interlayer insulation film 39 and the silicon substrate 1 carrying thereon the first layer metal interconnection pattern and the transistor in the region underneath the CrSi thin-film resistance, irradiation of laser beam upon the first layer metal interconnection pattern 11a or the transistor or other parts of the silicon substrate 1 is prevented even in the case a laser beam 25 is irradiated upon the CrSi thin-film resistance 21 for the purpose of trimming of the CrSi thin-film resistance 21 with the intensity sufficient for causing disconnection or modification in the CrSi thin-film resistance 21, as the laser beam 25 passed through the third layer interlayer insulation film 39 is reflected in the direction away from the silicon substrate 1 by the laser beam interruption film 41.

With this, it becomes possible to avoid damaging of the first layer metal interconnection disposed underneath the CrSi thin-film resistance 21 or modification of the transistor characteristics. In addition, it becomes possible to prevent degradation of reliability of the semiconductor device caused by the irradiation of the laser beam upon the silicon substrate 1 at the time of the trimming processing. Further, in the case of on-line trimming process, it becomes possible to prevent formation of the electron-hole pairs associated with the laser beam irradiation upon the silicon substrate 1, and it becomes possible to achieve high precision trimming.

Further, because the inner wall of the contact hole 17 is formed with the reverse sputtering is residue 19 and because the top edge part of the contact hole 17 is formed to have a tapered shape, the step coverage of the CrSi thin-film resistance 21 in the vicinity of the contact hole 17 is improved similarly to the embodiment explained with reference to FIGS. 1A and 1B in which the reverse sputtering residue 19 is formed on the inner wall surface of the contact hole and the top edge part of the contact hole 17 is formed to have the tapered shape, and the contact resistance between the CrSi thin-film resistance 21 and the metal interconnection pattern 27 is stabilized.

The semiconductor device of the present embodiment can be fabricated according to the process below.

First, the first layer insulation film 5, the contact holes 6a, the conductive plugs 6b and the first layer metal interconnection pattern 11a are formed on the silicon substrate 1 after formation of the transistor including the diffusion regions 4a and 4a, the gate insulation film 4b and the gate electrode 4c in the device region defined thereon by the device isolation oxide 3 according to the process step (1) explained with reference to FIG. 2A. Thereafter the second layer interlayer insulation film 31 is formed according to the process similar to the process step (2) explained with reference to FIG. 2B.

Further, the second layer metal interconnection pattern 37 is formed on the second layer interlayer insulation film 31 in the form of lamination of the metal pattern 33 and the refractory metal film 35, and the third interlayer insulation film 39 is formed further thereon according to the step similar to the process steps (1) through (4) explained with reference to FIGS. 2A-2D, in which the first layer metal interconnection pattern 11 of the metal pattern 7 and the refractory metal film 9, the second layer interlayer insulation film 15, the contact hole 17, the reverse sputtering residue 19 and the CrSi thin-film 27, are formed on the first layer interlayer insulation film 5. Thereafter, the contact hole 17 is formed in the third layer interlayer insulation film 39, and the tapered shape at the top edge part of the contact hole 17 and the Ar reverse sputtering residue are formed by conducting the Ar reverse sputtering process. Further, the CrSi thin-film for the CrSi thin-film resistance 21 is formed.

Thereafter, the CrSi thin-film is patterned and the CrSi thin-film resistance 21 is formed. Further, by forming the passivation film 23, fabrication of the semiconductor device of the present embodiment is completed.

Thus, with the present embodiment, too, various advantageous effects similar to the embodiment explained with reference to FIGS. 1A and 1B, such as: elimination of the need of patterning the CrSi thin-film resistance 21 after patterning thereof by using a wet etching process; elimination of exposure of the contact surface of the CrSi thin-film resistance 21 to the metal interconnection pattern 27; existence of the refractory metal film 35 between the CrSi thin-film resistance 21 and the metal interconnection pattern 33 as a barrier film; and the effect associated with the Ar reverse sputtering process to the third layer interlayer insulation film 39 used for the underlying film before formation of the CrSi thin-film for the CrSi thin-film resistance, are attained.

Figure 16A:
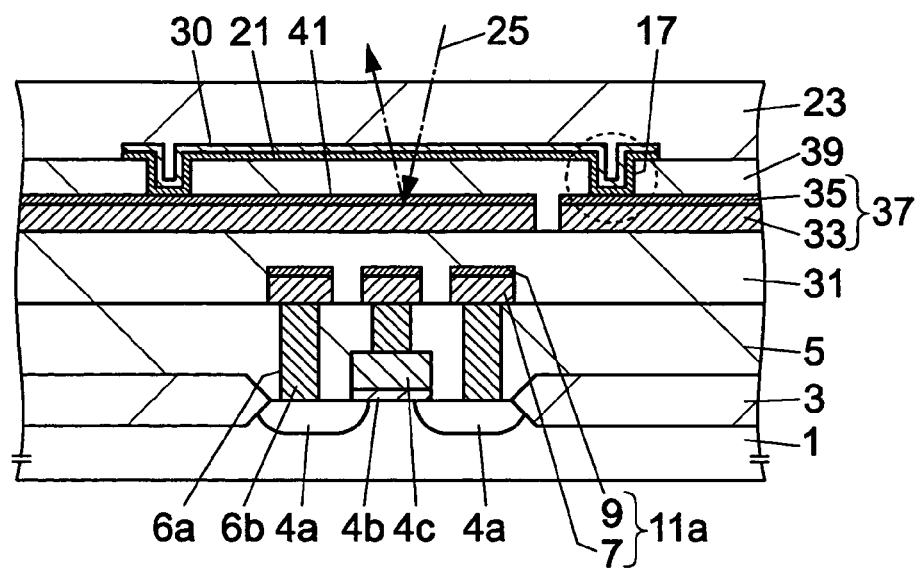
Figure 16B:
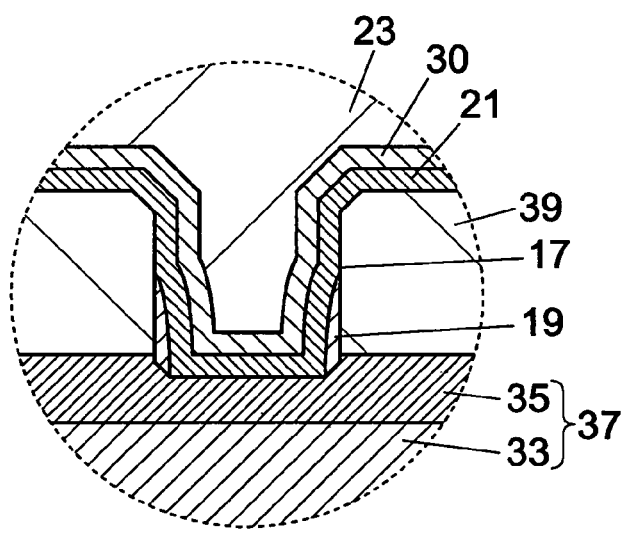

Further, as shown in FIGS. 16A and 16B, it is possible to form the CrSiN film 30 on the top surface of the CrSi thin-film resistance 21 similarly to the embodiment explained with reference to FIGS. 13A and 13B. In the present embodiment, too, no CrSiO is formed between the CrSi thin-film resistance 21 and the CrSiN film 30. In the embodiment of FIGS. 16A and 16B, it should be noted that the CrSiN film 30 can be formed similarly to the method explained with reference to FIGS. 13A and 13B.

Figure 17A:
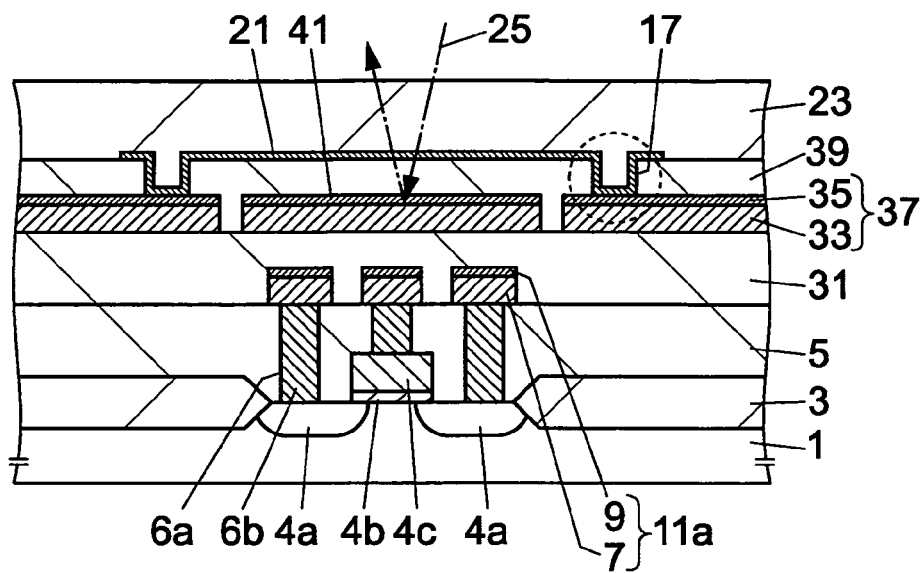
Figure 17B:
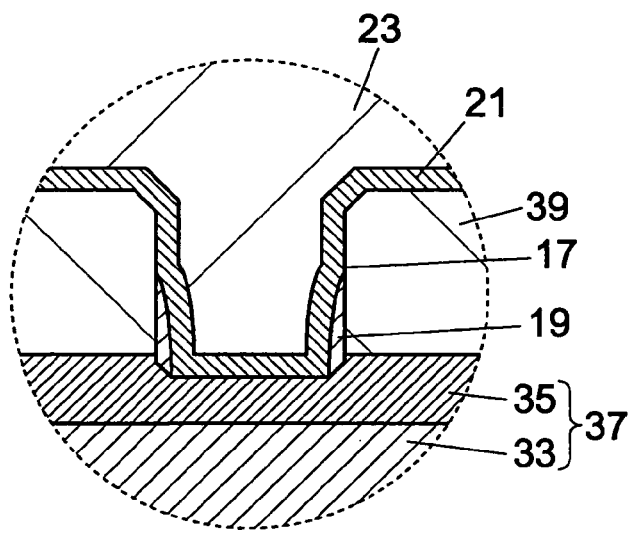

FIGS. 17A and 17B are diagrams showing a further embodiment of the first mode and fifth mode of the present invention, wherein FIG. 17A shows the region where the metal thin-film resistance is formed in a cross-sectional view with enlarged scale, while FIG. 17B shows the part of FIG. 17B surrounded by the broken line with enlarged scale. In the drawings those parts corresponding to the parts explained previously are designated by the same reference numerals and the description thereof will be omitted.

The difference of the present invention over the embodiment of FIGS. 15A and 15B is that the laser beam interruption film 41 of the metal pattern 33 and the refractory metal 35 is formed with separation from the second metal interconnection pattern 37. Otherwise, the structure is identical with that of the embodiment explained with reference to FIGS. 15A and 15B. It should be noted that such a structure can be formed by modifying the mask used for patterning the second layer metal interconnection pattern 37 and the laser beam interruption film 41 in the step of fabricating the embodiment of FIGS. 15A and 15B.

Thus, even in such a case in which the second layer metal interconnection pattern 37 is separated from the laser beam interruption film 41, the present embodiment can achieve the same effect as in the case of the embodiment explained with reference to FIGS. 15A and 15B.

Further, in the embodiment explained with reference to FIGS. 17A and 17B, it is possible to form the CrSi thin-film resistance 21 to carry the CrSiN film 30 thereon similarly to the case of the embodiment explained with reference to FIGS. 16A and 16B.

Further, in place of the transistor explained with reference to the embodiment of FIGS. 15A and 15B through FIGS. 17A and 17B, it is also possible to dispose the capacitor explained with reference to FIG. 10, the polysilicon pattern 29 explained with reference to FIGS. 11A and 11B, or the impurity diffusion region 29 explained with reference to FIGS. 12A and 12B in the region underneath the laser beam interruption film 41.

In the embodiments explained with reference to FIGS. 15A and FIGS. 15B through FIGS. 17A and 17B, the laser beam interruption film 41 is formed of a material identical with the material of the second layer interconnection pattern 37 to which the CrSi thin-film resistance 21 is eclectically connected, wherein it should be noted that the semiconductor device according to the fist and fifth mode of the present invention is not limited to this but it is possible to form the laser beam interruption film from a metal material formed separately to the second layer metal interconnection pattern 37 and hence of a material different from the metal material of the second layer metal interconnection pattern 37.

Further, while the laser beam interruption film 41 has been formed in the same laser as the second layer metal interconnection pattern, to which the CrSi thin-film resistance 21 is electrically connected in each of the embodiments explained with reference to FIGS. 15A and 15B through FIGS. 17A and 17B, while the present invention is by no means limited with this, and it is possible to use a construction in which the laser beam interruption film is formed in the same layer as the second layer metal interconnection pattern and the metal interconnection pattern, to which the metal thin-film resistance is connected electrically, is formed of the third layer metal interconnection pattern. Thereby, the metal interconnection pattern to which the metal thin-film resistance is connected electrically and the laser beam interruption film belong to different layers.

Figure 18A:
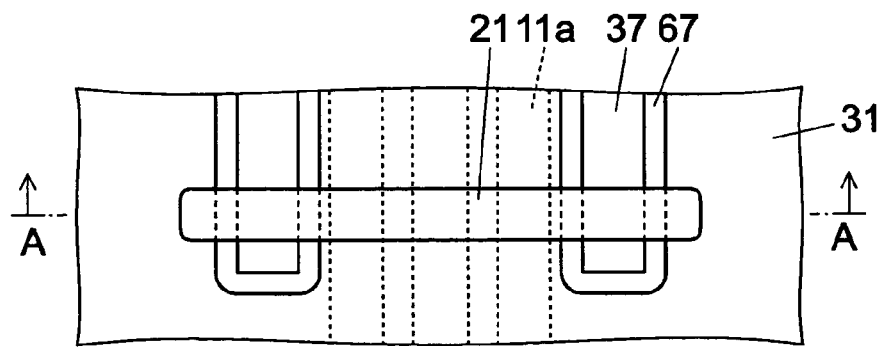
Figure 18B:
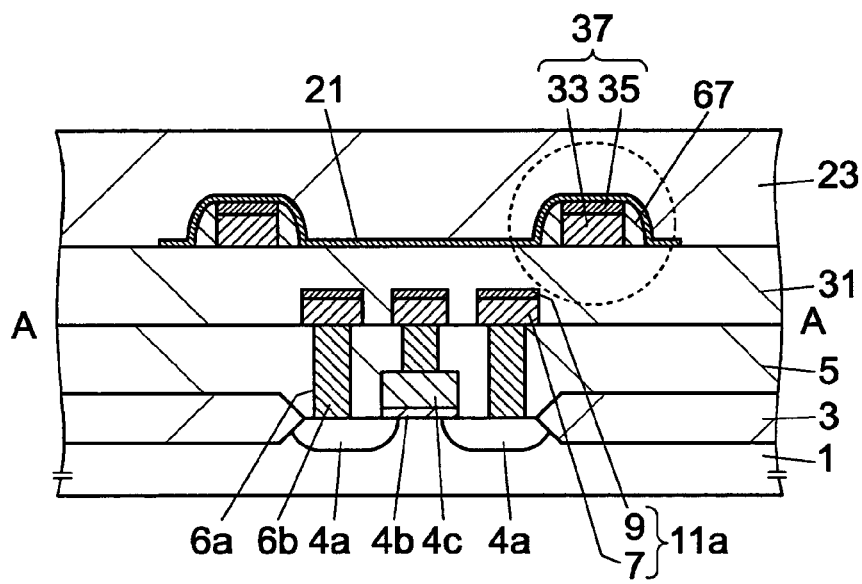
Figure 18C:
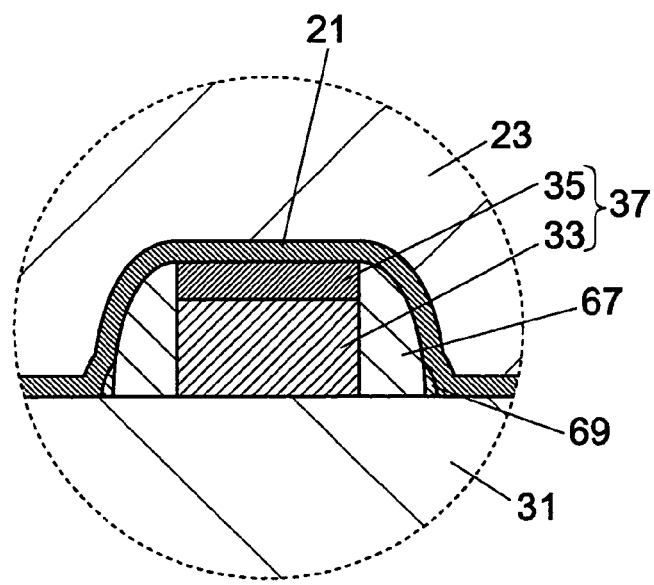

FIGS. 18A-18C are diagrams showing an embodiment of the second mode of the present invention, wherein FIG. 18A is a plan view while FIG. 18B is a cross-sectional view taken along an A-A line of FIG. 18A, and FIG. 18C is an enlarged cross-sectional view showing the part of FIG. 18B surrounded by the broken line with enlarged scale. In FIG. 18A, illustration of the passivation film is omitted. In the drawings, those parts corresponding to the parts described previously are designated by the same reference numerals and the description thereof will be omitted.

Referring to FIG. 18A-18C, the device isolation oxide 3 is formed on the surface of the silicon substrate 1, and a transistor having the diffusion regions 4a and 4a, the gate insulation film 4b and the gate electrode 4c is formed in a device region defined by the device isolation oxide 3 in the region underneath the CrSi thin-film resistance 21.

On the silicon substrate 1 including the device isolation oxide 3 and the device region for the transistor, the first layer interlayer insulation film 5 is formed, wherein the first layer interlayer insulation film 5 is formed with the contact holes 6a and the conductive plugs 6b in correspondence to the impurity diffusion regions 4a and 4a and the gate electrode 4c.

On the first layer interlayer insulation film 5 including the conductive plugs 6b, the first layer metal interconnection pattern 11a of the metal pattern 7 and the refractory metal film 9. Further, the first layer metal interconnection pattern 11 also formed of the metal pattern 7 and the refractory metal film 9 is formed on the first layer interlayer insulation film 5 so as to cover the region not illustrated.

On the first layer interlayer insulation film 5, the second layer interlayer insulation film 31 is formed so as to include the region where the first layer metal interconnection pattern 11a is formed, and the second layer metal interconnection pattern of the metal pattern 33 and the refractory metal film 35 is formed on the second layer interlayer insulation film 31.

Further, the second layer metal interconnection pattern 27 carries a sidewall insulation film 67 of a CVD oxide film, or the like, on the sidewall surface thereof, wherein it will be noted that there is formed a reverse sputtering residue 69 on the surface of the sidewall insulation film 67 close to the surface of the second layer interlayer insulation film, wherein illustration of this reverse sputtering residue 69 is omitted in the representation of FIGS. 18A and 18B. It should be noted that this reverse sputtering residue 69 is formed by applying an Ar reverse sputtering process to the second layer interlayer insulation film 31 after formation of the second layer metal interconnection pattern 37 and the sidewall insulation film 67. This reverse sputtering residue contains at least the material the second layer interlayer insulation film 31 and the sidewall insulation film 67 and Ar as the constituent elements thereof.

Further, it will be noted that the CrSi thin film-resistance 21 is formed in a band-like form so as to extend over the region of the second layer interlayer insulation film 31 between a pair of second layer metal interconnection patterns 37 including the surface of the sidewall insulation film 67 and the surface of the reverse sputtering residue 69.

Further, both end parts of the CrSi thin-film resistance 21 extend over the respective surfaces of the sidewall insulation films 67 and over the surfaces of the reverse sputtering residues 69 at the opposite sides of the foregoing mutually facing sides of the second layer metal interconnection pattern pair 37 and extend further over the surface of the second layer interlayer insulation film 31. Thereby, it should be noted that the CrSi thin-film resistance 21 and the second layer metal interconnection pattern 37 are formed so as to cross with each other.

Further, the passivation film 23 (not shown in FIG. 18A) is formed on the second layer interlayer insulation film 31 including the region where the CrSi thin-film resistance 21 is formed, as the final protective film.

In this embodiment, too, it is possible to reduce the chip area of the semiconductor device in view of the fact that the transistor and the first layer metal interconnection pattern 11a constituting the semiconductor integrated circuit device is disposed in the region underneath the CrSi thin-film resistance 21 similarly to the embodiment explained with reference to FIGS. 1A and 1B.

Figure 19A:
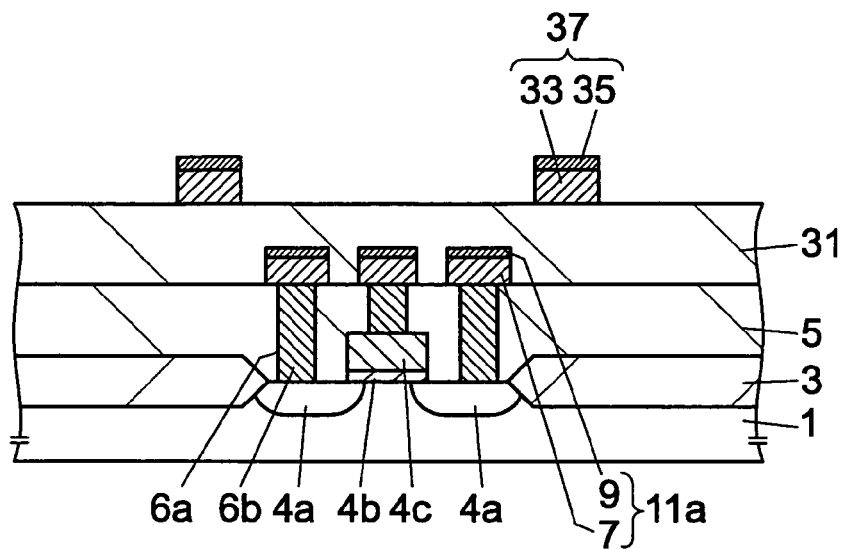
FIGS. 19A-19C are diagrams explaining the fabrication process of the embodiment FIGS. 18A-18C.
Figure 19B:
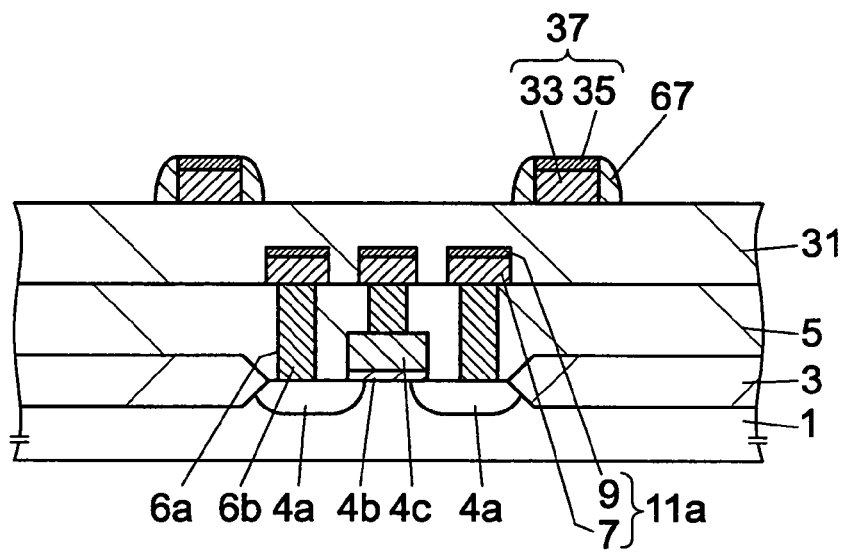
Figure 19C:
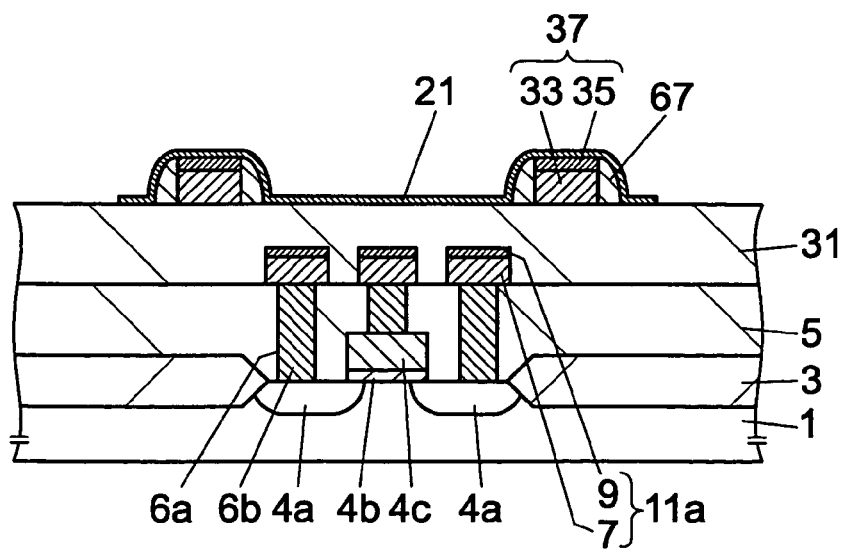

FIGS. 19A-19C are cross-sectional diagrams for explaining an example of fabricating the semiconductor device of the present embodiment.

(1) First, the first layer insulation film 5, the contact holes 6a, the conductive plugs 6b and the first layer metal interconnection pattern 11a are formed on the silicon substrate 1 after formation of the transistor including the diffusion regions 4a and 4a, the gate insulation film 4b and the gate electrode 4c in the device region defined thereon by the device isolation oxide 3 according to the process step (1) explained with reference to FIG. 2A.

Thereafter the second layer interlayer insulation film 31 is formed on the first interlayer insulation film 5 according to the process similar to the process step (2) explained with reference to FIG. 2B, such that second interlayer insulation film 31 has a lamination structure in which a CVD oxide film, an SOG film and a CVD oxide film are laminated consecutively.

Further, in the step of FIG. 19A, the second layer metal interconnection pattern 37 is formed on the second layer interlayer insulation film 31 in the form of lamination of the metal pattern 33 and the refractory metal film 35.

In this state, no metal thin-film resistance is formed yet, contrary to the prior art process, and the underlying film of the second layer metal interconnection pattern 37 is provided by the second layer interlayer insulation film 31.

Thus, there is no problem in conducting the patterning of the refractory metal film and the interconnection metal film by using dry etching process with sufficient overetching, and thus, there is no need of using a wet etching process that has caused various problems in the prior art. Thus, no adversary effect is caused on device miniaturization.

(2) Next, by using a plasma CVD process, for example, a plasma CVD oxide film is formed on the second layer interlayer insulation film including the region where the second layer metal interconnection pattern 37 is formed with the thickness of about 2000 Angstroms, followed by an etch back process to form the sidewall insulation film 67 of the plasma CVD oxide on the sidewall surfaces of the second layer metal interconnection pattern 37 (step of FIG. 19B)

(3) Next, in an Ar sputter etching chamber of a multi-chamber sputtering apparatus, an Ar reverse sputtering process is applied to the second layer interlayer insulation film 31 including the region where the second layer metal interconnection pattern and the sidewall insulation film 67 are to be formed, in vacuum environment under the condition of: DC bias set to 1250V; Ar flow rate set to 20 SCCM; and processing pressure set to 8.5 mTorr, for the duration of 20 seconds. This etching condition is identical to the etching condition for etching a thermal oxide film formed at 1000° C. in a wet ambient with the thickness of about 50 Angstroms.

As a result of this Ar reverse sputtering process, the reverse sputtering residue 69 is formed on the surface of the sidewall insulation film 67 close to the surface of the second layer interlayer insulation film 31 (see FIG. 18C).

Next, the CrSi thin-film for the metal thin-film resistance is formed after completion of the Ar sputter etching process in continuation therewith without breaking the vacuum.

In the present example, the semiconductor wafer is transported from the Ar sputter etching chamber to a sputter chamber in which the CrSi target is mounted, and formation of the CrSi thin film is conducted on the entire surface of the second layer insulation film 31 including the region where the interconnection pattern 11 and the sidewall insulation films 67 and 67 have been formed, with the thickness of about 50 Angstroms, by using the CrSi target of the composition of Sr/Cr=80/20 wt % under the condition of: DC power set to 0.7 kW; Ar flow rate set to 85 SCCM; processing pressure set to 8.5 mTorr, for the duration of 9 seconds.

Next, a resist pattern for defining the region of the metal thin-film resistance is formed on the CrSi thin film by a photolithographic process, For example, an RIE apparatus is used for patterning the CrSi thin-film while using the resist pattern as a mask, and the CrSi thin-film resistance 21 is formed as represented in FIG. 19C. Thereafter, the resist pattern is removed.

Here, it should be noted that the CrSi thin-film resistance 21 is connected to a part of the second layer metal interconnection pattern 37 electrically, and thus, it is no longer necessary to conduct a process of removing metal oxide from the surface of the CrSi thin-film resistance by using hydrofluoric acid for achieving electrical contact at the top surface of the metal thin-film resistance, contrary to the conventional art.

(4) Next, by using a plasma CVD process, a silicon oxide film and a silicon nitride film are deposited consecutively on the entire surface of the second layer insulation film 31 as the passivation film 23. With this, fabrication of the semiconductor device is completed (see FIGS. 18A-18C).

Thus, there is no longer the need of carrying out patterning by a wet etching process after formation of the CrSi thin-film resistance. Further, because there is no chance that the contact surface of the CrSi thin-film resistance 21 to the second layer metal interconnection pattern 37 is exposed to the air, and it is possible to achieve good electrical contact between the CrSi thin-film resistance 21 and the second layer metal interconnection pattern 37 without applying the surface oxide removal process and formation of etching stopper barrier on the CrSi thin-film resistance 21. With this, it is possible to achieve miniaturization of the CrSi thin-film resistance 21 and stabilization of the resistance value thereof irrespective of the thickness of the CrSi thin-film resistance 21, without increasing the number of the fabrication process steps.

Further, because the CrSi thin-film resistance 21 is formed so as to extend over the second layer interlayer insulation film from the top surface of the second layer metal interconnection pattern 37 via the surface of the side wall insulation film 67 and the reverse sputtering residue 69, there is no need of conducting a series of process steps for forming a contact hole contrary to the case of achieving electrical contact between the metal thin-film resistance and the interconnection pattern via a contact hole formed on the interconnection pattern, and it becomes possible to simplify the process and reduce the number of the process steps. Thereby, there is caused no problem such as variation of the resistance value of the metal thin-film resistance or degradation of contact resistance due to poor step coverage of the metal thin-film resistance at such a contact hole. Further, because of existence of the sidewall insulation film 67 at the sidewall surface of the second layer metal interconnection pattern 37, it is possible to avoid deterioration of step coverage of the CrSi thin-film resistance 21 caused by the steep step at the sidewall surface of the interconnection pattern 11.

Thus, with the present mode of the invention, it is possible to stabilize the resistance value of the CrSi thin-film resistance 21 including the contact resistance to the second layer metal interconnection pattern 37.

Further, because the end parts of the CrSi thin-film resistance 21 are formed so as to intersect with the second layer metal interconnection pattern 37, it becomes possible to eliminate the variation of the contact region between the second layer metal interconnection pattern 37 and the CrSi thin-film resistance 21 caused by misalignment of overlapping between the second layer metal interconnection pattern 27 and the CrSi thin-film resistance or caused by rounding at the end parts of the CrSi thin-film resistance 21.

Further, because the refractory metal film 35 functioning as a barrier film is interposed between the CrSi thin-film resistance 21 and the metal pattern 33, variation of contact resistance between the CrSi thin-film resistance 21 and the second layer metal interconnection pattern 38 is reduced, and precision of the resistance value is improved for the CrSi thin-film resistance 21 together with the yield of production.

Further, because the refractory metal film 35 functions as a barrier film and simultaneously an antireflection film, it is possible to form the refractory metal film 35 with the present mode of the invention without increasing the number of fabrication process steps as compared with the prior art. Thereby, it becomes possible to stabilize the contact resistance between the metal thin-film resistance and the interconnection pattern while avoiding increase of the production cost.

Further, because the Ar reverse sputtering process is conducted immediately before formation of the CrSi thin-film used for the CrSi thin-film resistance 21, the dependence of the CrSi thin-film resistance on the underlying film is improved as explained already with reference to FIGS. 4 through 8.

Figure 20A:
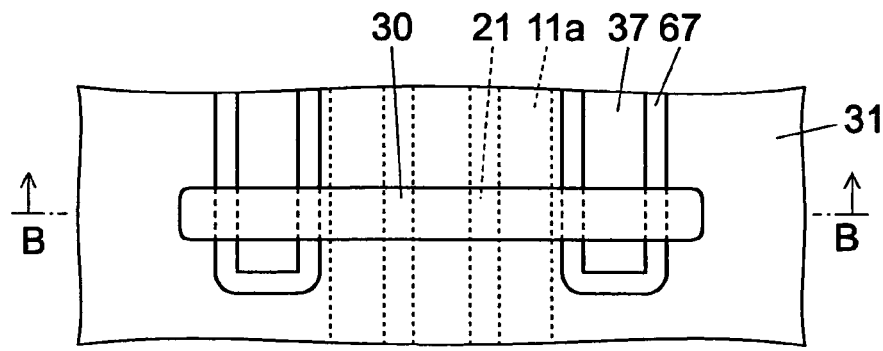
Figure 20B:
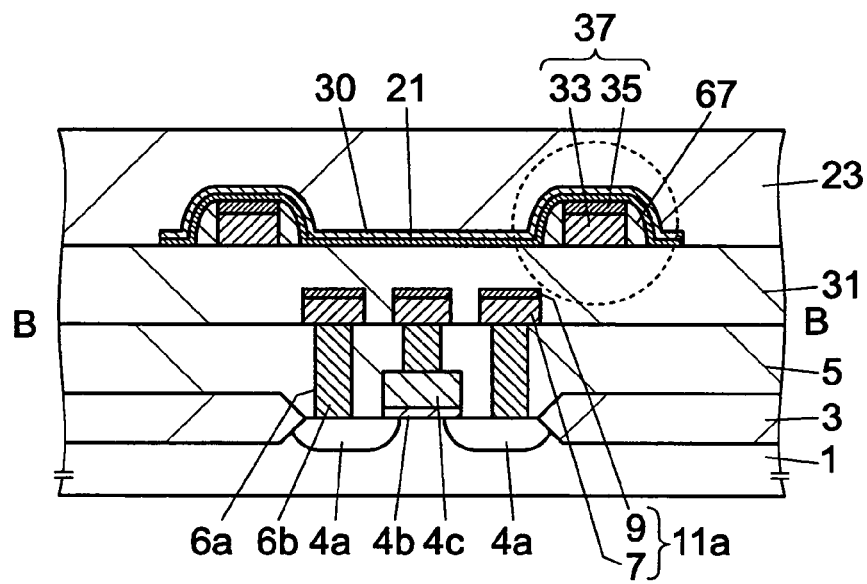
Figure 20C:
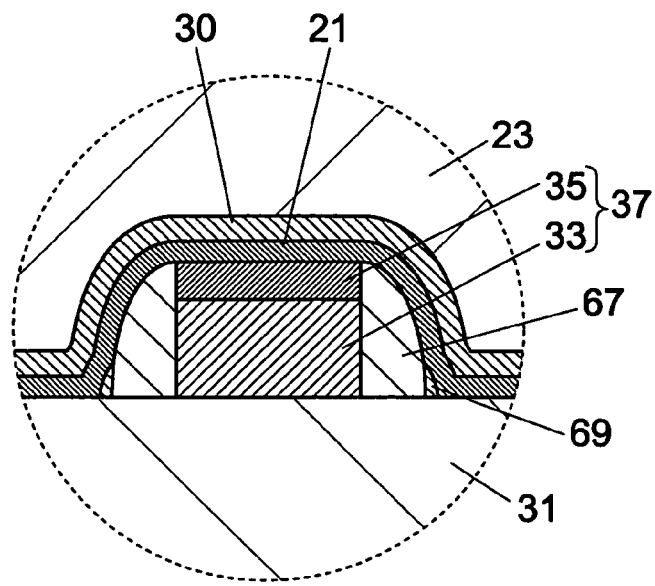

FIGS. 20A-20C are diagrams showing another embodiment of the second mode of the present invention, wherein FIG. 20A is a plan view while FIG. 20B is a cross-sectional view taken along an B-B line of FIG. 20A, and FIG. 20C is an enlarged cross-sectional view showing the part of FIG. 20B surrounded by the broken line with enlarged scale. In FIG. 20A, illustration of the passivation film is omitted. In the drawings, those parts corresponding to the parts described previously are designated by the same reference numerals and the description thereof will be omitted.

The embodiment of FIGS. 20A-20C is different from the embodiment of FIGS. 18A-18C in the point that the CrSiN film 30 is formed on the top surface of the CrSi thin-film resistance 21. No CrSiO is formed between the CrSi thin-film resistance and the CrSiN film 30. The CrSiN film 30 can be formed similarly to the process explained with reference to FIGS. 13A and 13B.

In this embodiment, too, the CrSiN film 30 is provided on the top surface of the CrSi thin-film resistance similarly to the embodiment shown in FIGS. 13A and 13B, and thus, variation of resistance value of the CrSi thin-film resistance 21 caused by exposure of the top surface of the CrSi thin-film resistance 21 to the air can be avoided.

Figure 21A:
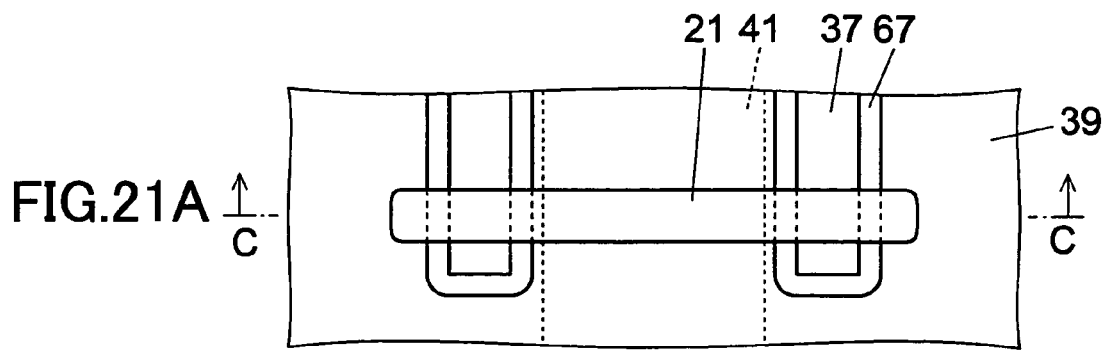
Figure 21B:
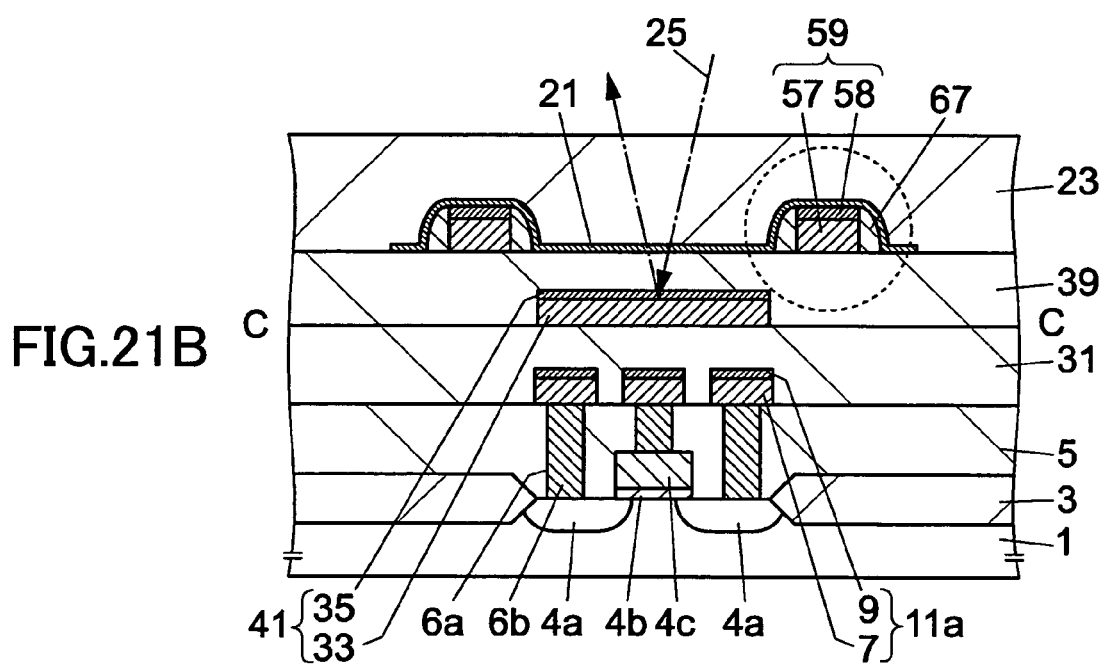
Figure 21C:
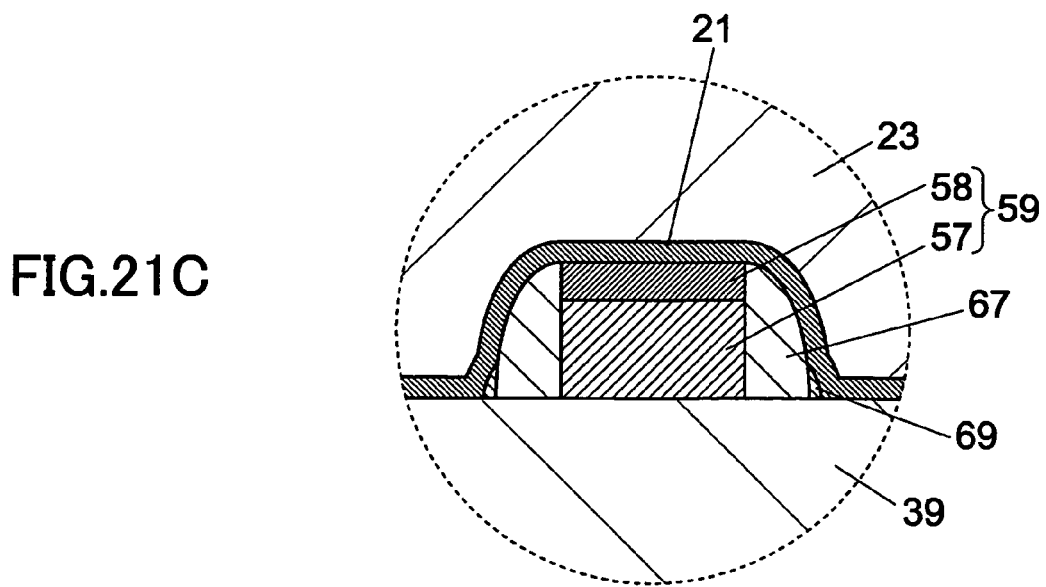
Figure 22A:
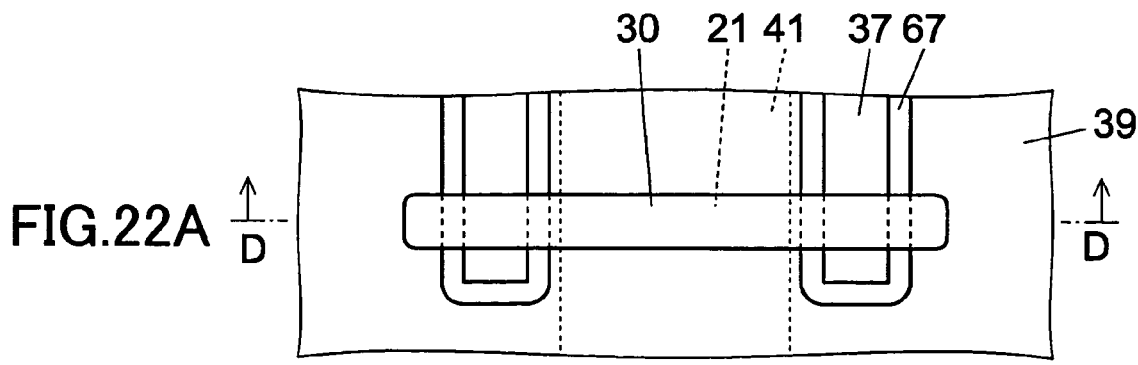
Figure 22B:
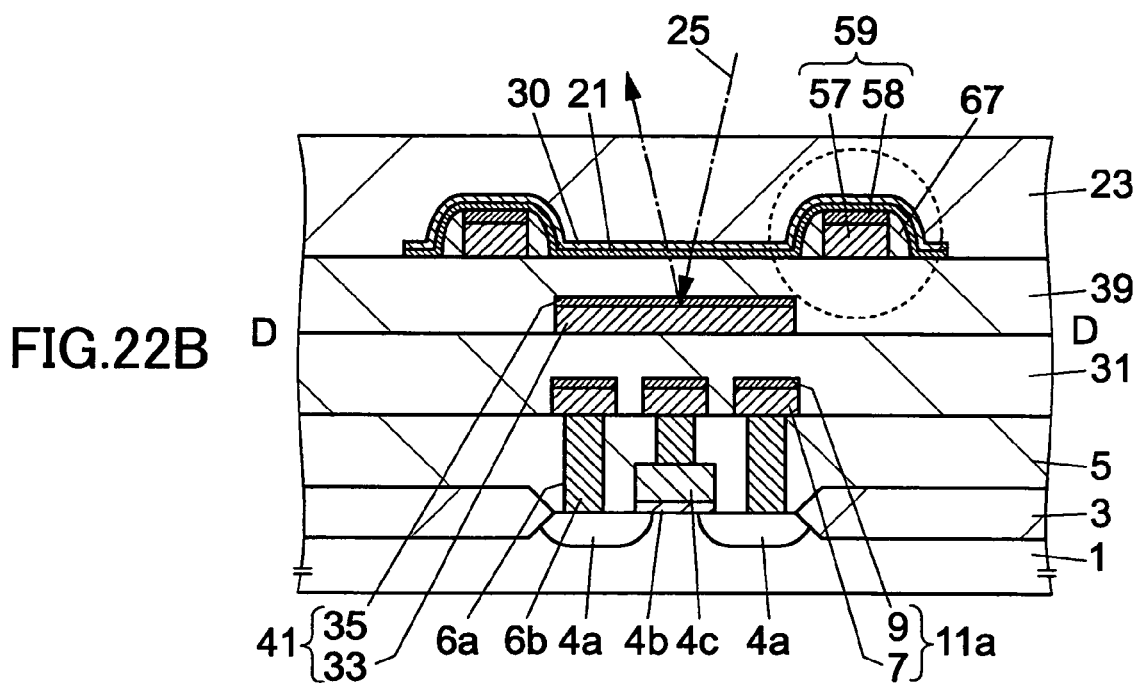
Figure 22C:
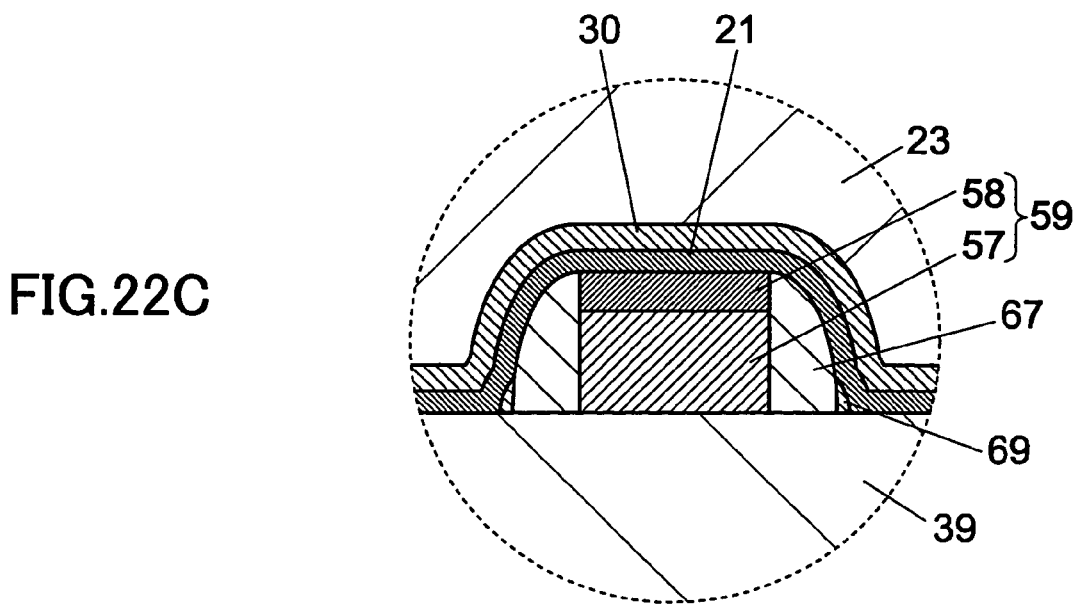

FIGS. 21A-21C are diagrams showing an embodiment of the second mode and fifth mode of the present invention, wherein FIG. 21A is a plan view while FIG. 21B is a cross-sectional view taken along an C-C line of FIG. 21A, and FIG. 21C is an enlarged cross-sectional view showing the part of FIG. 21B surrounded by the broken line with enlarged scale. In FIG. 21A, illustration of the passivation film is omitted. In the drawings, those parts corresponding to the parts described previously are designated by the same reference numerals and the description thereof will be omitted.

Referring to FIG. 21A-21C, the device isolation oxide 3 is formed on the surface of the silicon substrate 1, and a transistor having the diffusion regions 4a and 4a, the gate insulation film 4b and the gate electrode 4c is formed in a device region defined by the device isolation oxide 3 in the region underneath the CrSi thin-film resistance 21.

On the silicon substrate 1 including the device isolation oxide 3 and the device region for the transistor, the first layer interlayer insulation film 5 is formed, wherein the first layer interlayer insulation film 5 is formed with the contact holes 6a and the conductive plugs 6b in correspondence to the impurity diffusion regions 4a and 4a and the gate electrode 4c.

On the first layer interlayer insulation film 5 including the conductive plugs 6b, the first layer metal interconnection pattern 11a of the metal pattern 7 and the refractory metal film 9. Further, the first layer metal interconnection pattern 11 also formed of the metal pattern 7 and the refractory metal film 9 is formed on the first layer interlayer insulation film 5 so as to cover the region not illustrated.

On the first layer interlayer insulation film 5, the second layer interlayer insulation film 31 is formed so as to include the region where the first layer metal interconnection pattern 11a is formed, and the layer beam interruption film 41 of the metal pattern 33 and the refractory metal film 35 is formed on the second layer interlayer insulation film 31. The laser beam interruption film 41 is disposed in the region underneath the CrSi thin-film resistance 21.

On the second layer interlayer insulation film including the region where the laser beam interruption film 41 is formed, there is formed a third interlayer insulation film 39 formed of a metal pattern 57 and a refractory metal film 58 formed on the metal pattern 57, wherein the metal pattern 57 may for example be formed of an AlSiCu film. The refractory metal 57 is formed for example by a TiN film that functions as an antireflection film and at the same time a barrier film.

Further, the third layer metal interconnection pattern 59 carries the sidewall insulation film 67 of a CVD oxide film, or the like, on the sidewall surface thereof, wherein it will be noted that there is formed the reverse sputtering residue 69 on the surface of the sidewall insulation film 67 close to surface of the second layer interlayer insulation film, wherein illustration of this reverse sputtering residue 69 is omitted in the representation of FIGS. 18A and 18B. It should be noted that this reverse sputtering residue 69 is formed by applying an Ar reverse sputtering process to the third layer interlayer insulation film 39 after formation of the third layer metal interconnection pattern 59 and the sidewall insulation film 67. This reverse sputtering residue 69 contains at least the material of the third layer interlayer insulation film 39 and the sidewall insulation film 67 and Ar as the constituent elements thereof.

Further, it will be noted that the CrSi thin film-resistance 21 is formed in a band-like form so as to extend over the region of the third layer interlayer insulation film 39 between a pair of third layer metal interconnection patterns 59 including the surface of the sidewall insulation film 67 and the surface of the reverse sputtering residue 69, wherein the CrSi thin-film resistance 21 and the third layer metal interconnection pattern 59 are formed so as to intersect with each other. Thereby, the laser beam interruption film 41 is disposed underneath the CrSi thin-film resistance 21 via the third-layer interlayer insulation film 39, and the first layer metal interconnection pattern 11a and the transistor are disposed under the laser beam interruption film 41.

Further, the passivation film 23 (not shown in FIG. 21A) is formed on the third layer interlayer insulation film 39 including the region where the CrSi thin-film resistance 21 is formed, as the final protective film.

In this embodiment, too, it is possible to reduce the chip area of the semiconductor device in view of the fact that the transistor and the first layer metal interconnection pattern 11a constituting the semiconductor integrated circuit device is disposed in the region underneath the CrSi thin-film resistance 21 similarly to the embodiment explained with reference to FIGS. 1A and 1B.

Further, because the laser beam interruption film 41 of metal is provided between the third layer interlayer insulation film 39 and the first layer metal interconnection pattern 11a, the transistor or the silicon substrate 1 in the region underneath the CrSi thin-film resistance 21, it is possible to prevent the laser beam 25 is irradiated upon the first layer metal interconnection pattern 11a, the transistor or the silicon substrate 1 even in the case the laser beam 25 is irradiated upon the CrSi thin-film resistance 21 for the purpose of trimming thereof with the intensity sufficient for causing disconnection or modification of the CrSi thin-film resistance 21 similarly to the embodiment explained with reference to FIGS. 15A and 15B.

The fabrication process of the semiconductor device of the present embodiment may be conducted as follows.

First, the first layer insulation film 5, the contact holes 6a, the conductive plugs 6b and the first layer metal interconnection pattern 11a are formed on the silicon substrate 1 after formation of the transistor including the diffusion regions 4a and 4a, the gate insulation film 4b and the gate electrode 4c in the device region defined thereon by the device isolation oxide 3 according to the process step (1) explained with reference to FIG. 2A. Thereafter the second layer interlayer insulation film 31 is formed according to the process similar to the process step (2) explained with reference to FIG. 2B.

Next, by the process similar to the process steps (1) and (2) used for forming the first layer metal interconnection pattern 11 of the metal pattern 7 and the refractory metal film 9 and the second layer interlayer insulation film 15 explained with reference to FIGS. 2A and 2B, the laser beam interruption film 41 of the metal pattern and the refractory metal film 35 and the third layer interlayer insulation film 39 are formed on the second layer interlayer insulation film 31.

Next, by using a process similar to the process step (1) used for forming the first layer metal interconnection pattern 11 explained with reference to FIG. 2A, the second layer metal interconnection pattern 59 is formed on the third layer interlayer insulation film 39 as the lamination of the metal pattern 57 and the refractory metal film 58.

Further, similarly to the process steps (2) and (3) explained with reference to FIGS. 19B and 19C, the sidewall insulation film 67 is formed on the sidewall surfaces of the third layer metal interconnection pattern 59, and the reverse sputtering residue 69 is formed by conducting the Ar reverse sputtering process. Further, formation of the CrSi thin-film resistance 21 is achieved.

Further, by forming the passivation film 23, the fabrication process of the present embodiment is completed.

Thus, with the present embodiment, too, various advantageous effects such as: elimination of the need of patterning the CrSi thin-film resistance 21 after patterning thereof by using a wet etching process; elimination of exposure of the contact surface of the CrSi thin-film resistance 21 to the metal interconnection pattern 37; existence of the refractory metal film 35 between the CrSi thin-film resistance 21 and the metal interconnection pattern 33 as a barrier film; and the effect associated with the Ar reverse sputtering process to the third layer interlayer insulation film 39 used for the underlying film before formation of the CrSi thin-film for the CrSi thin-film resistance, are attained.

Further, because the CrSi thin-film resistance 21 is formed so as to extend over the second layer interlayer insulation film 31 over the surface of the sidewall insulation film 67 and the surface of the reverse sputtering residue 69 from the top surface of the third layer metal interconnection pattern 59, it is possible to reduce the number of the fabrication steps as compared with the case of connecting the metal thin film resistance and the interconnection pattern electrically via a contact hole formed on the interconnection pattern similarly to the embodiment explained with reference to FIGS. 18A-18C, and the fabrication process of the semiconductor device is simplified. Thereby, increase of variation of resistance value or increase of contact resistance is also avoided. Further, it is possible to avoid deterioration of step coverage of the metal thin-film resistance 21 caused by the sharp step at the sidewall surface of the metal interconnection pattern 11 is successfully avoided.

Further, because the end parts of the CrSi thin-film resistance 21 are formed so as to intersect with the third layer metal interconnection pattern 59, it becomes possible to eliminate the variation of the contact region between the third layer metal interconnection pattern 59 and the CrSi thin-film resistance 21 caused by misalignment of overlapping between the third layer metal interconnection pattern 59 and the CrSi thin-film resistance or caused by rounding at the end parts of the CrSi thin-film resistance 21. Thereby, stable contact resistance is attained.

Further, similarly to the embodiment explained with reference to FIGS. 13A and 13B, it is possible to form the CrSiN film 30 on the top surface of the CrSi thin-film resistance 21. In this embodiment, too, no CrSiO is formed between the CrSi thin-film resistance 21 and the CrSiN film 30. Thereby, it is possible to form the CrSiN film 30 similarly to the embodiment explained with reference to FIGS. 16A and 16B.

Further, it is possible to dispose, in place of the transistor explained with reference to the embodiments of FIGS. 18A-18C, FIGS. 20A-20C-FIGS. 22A-22C, the capacitor explained with reference to FIGS. 10A and 10B or the polysilicon pattern 28 explained with reference to FIGS. 11A and 11B or the impurity diffusion region 29 explained with reference to FIGS. 12A and 12B.

Figure 23A:
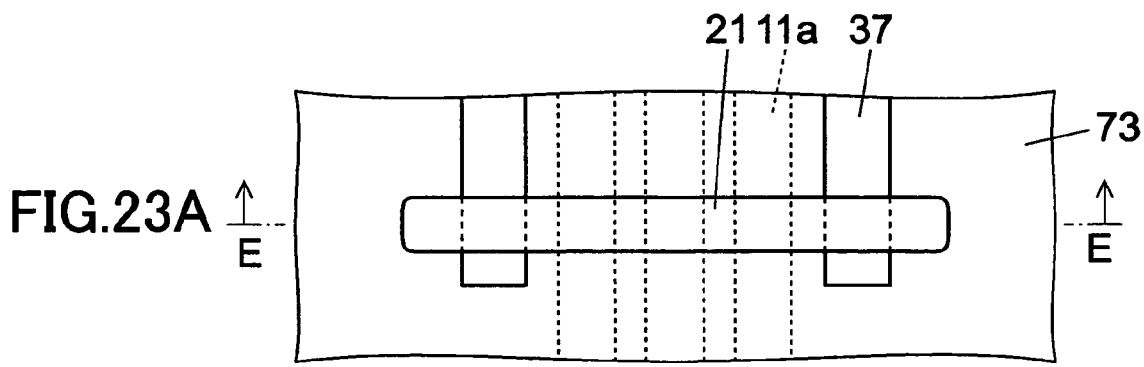
Figure 23B:
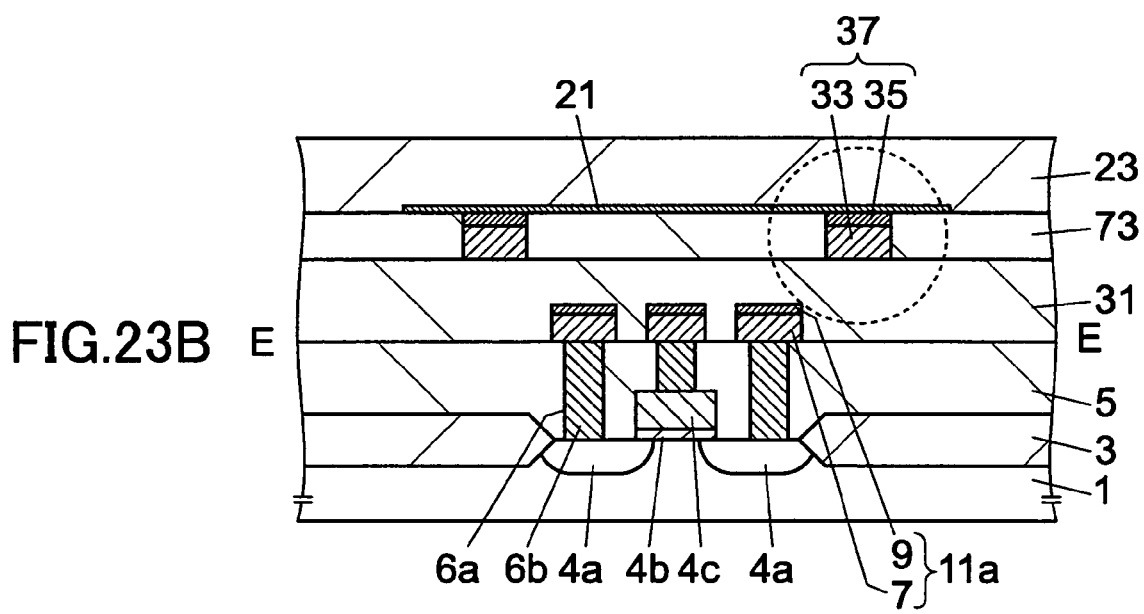
Figure 23C:
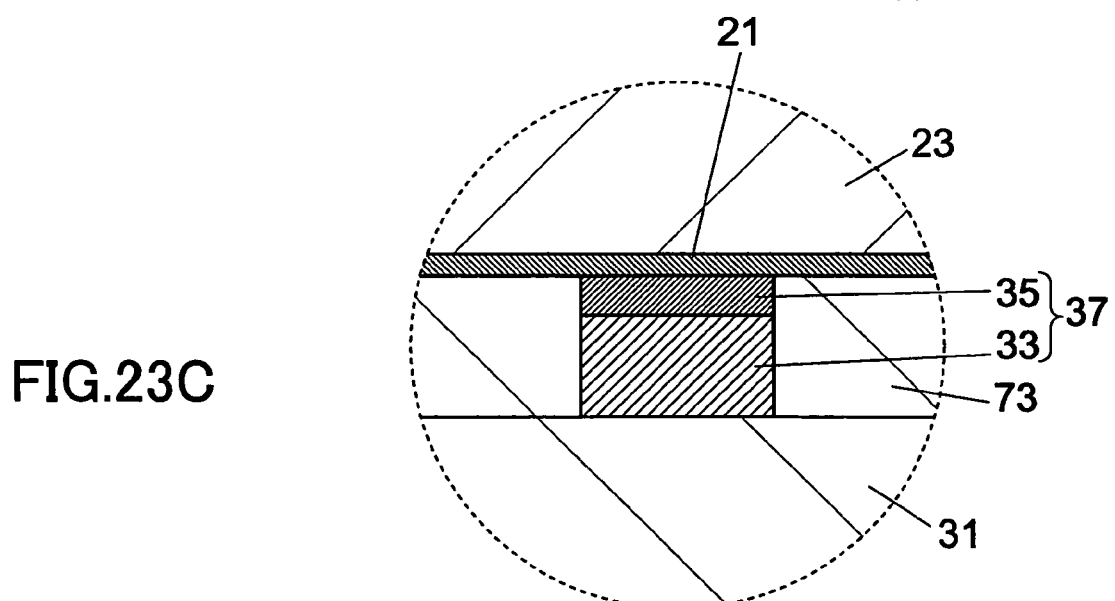

FIGS. 23A-23C are diagrams showing an embodiment of the second mode and fifth mode of the present invention, wherein FIG. 23A is a plan view while FIG. 23B is a cross-sectional view taken along an E-E line of FIG. 23A, and FIG. 23C is an enlarged cross-sectional view showing the part of FIG. 23B surrounded by the broken line with enlarged scale. In FIG. 23A, illustration of the passivation film is omitted. In the drawings, those parts corresponding to the parts described previously are designated by the same reference numerals and the description thereof will be omitted.

Referring to FIG. 23A-23C, the device isolation oxide 3 is formed on the surface of the silicon substrate 1, and a transistor having the diffusion regions 4a and 4a, the gate insulation film 4b and the gate electrode 4c is formed in a device region defined by the device isolation oxide 3.

Further, the first layer interlayer insulation film 5 is formed on the silicon substrate 1, wherein the first layer interlayer insulation film 5 is formed with the contact holes 6a and the conductive plugs 6b, and the first layer metal interconnection pattern 11a formed of the metal pattern 7 and the refractory metal film 9 is formed thereon. Further, the second layer interlayer insulation film 31 and the second layer metal interconnection pattern 37 formed of the metal pattern 33 and the refractory metal film 35 are formed on the silicon substrate 1.

On the second layer interlayer insulation film 31, there is formed an underlying insulation film 73 formed of lamination of a lower plasma CVD film and an upper SOG film, wherein the underlying insulation film 73 is subjected to an etch back process or CMP process after lamination of the foregoing layers to the depth such that the top surface of the second layer metal interconnection pattern 37 is exposed. It should be noted that FIG. 23B illustrates the underlying insulation film 73, formed of the plasma CVD oxide film and the SOG film, as if it is a single layer film. Here, it should be noted that the underlying film 73 is not limited to the plasma CVD oxide film or the SOG film or to a specific material but any insulation film may be used with the thickness such that the top surface of the second layer metal interconnection pattern 37 on the second layer interlayer insulation film 31 is exposed.

Further, it will be noted that the CrSi thin film-resistance 21 is formed in a band-like form so as to extend over the region of the second layer interlayer insulation film 31 between a pair of second layer metal interconnection patterns 37. Further, both end parts of the CrSi thin-film resistance 21 extend over the underlying insulation film 73 formed at the opposite sides of the foregoing mutually facing sides of the second layer metal interconnection pattern pair 37, and the CrSi thin-film resistance 21 and the second layer metal interconnection pattern 37 are formed so as to cross with each other.

Further, the passivation film 23 (not shown in FIG. 23A) is formed on the interlayer insulation film 5 including the region where the CrSi thin-film resistance 21 is formed.

Figure 24A:
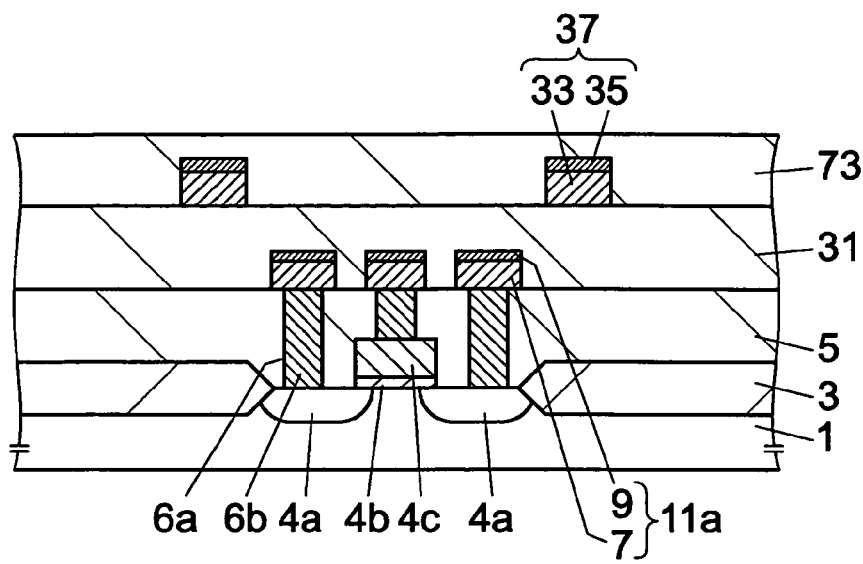
FIGS. 24A-24C are cross-sectional diagrams showing an example of the fabrication process of forming the semiconductor device of FIGS. 23A-23C.
Figure 24B:
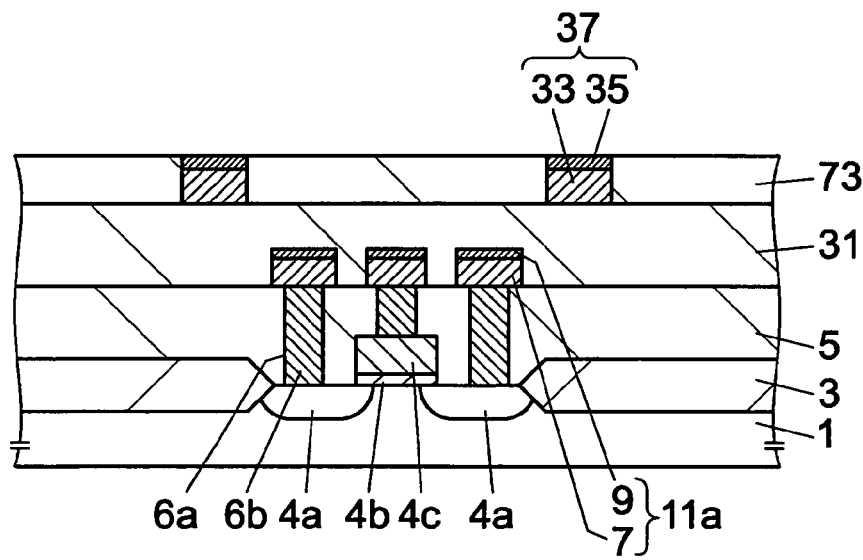
Figure 24C:
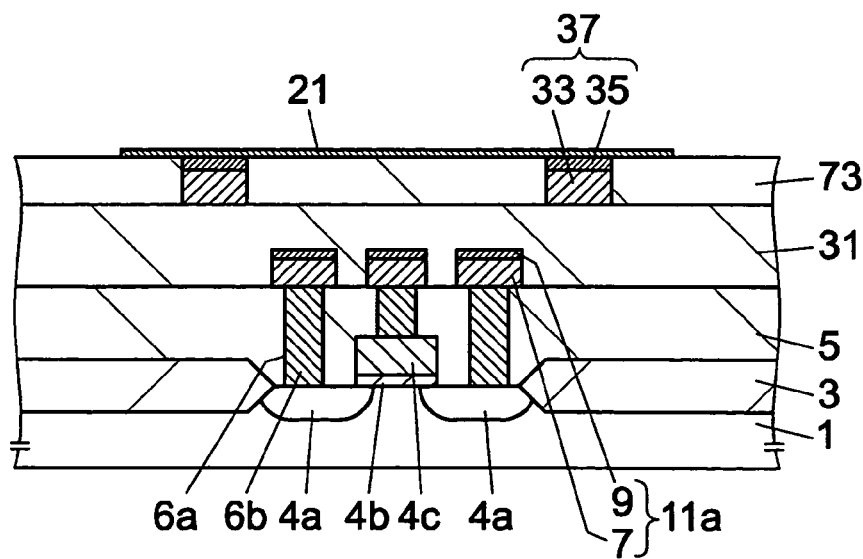

FIGS. 24A-24C are cross-sectional diagrams for explaining an example of fabricating the semiconductor device of the present embodiment.

(1) First, in the step of FIG. 24A, the first layer insulation film 5, the contact holes 6a, the conductive plugs 6b and the first layer metal interconnection pattern 11a are formed on the silicon substrate 1 after formation of the transistor including the diffusion regions 4a and 4a, the gate insulation film 4b and the gate electrode 4c in the device region defined thereon by the device isolation oxide 3 according to the process step (1) explained with reference to FIG. 2A.

Thereafter the second layer interlayer insulation film 31 is formed on the first interlayer insulation film 5 according to the process similar to the process step (2) for forming the second layer interlayer insulation film 15 explained with reference to FIG. 2B, such that second interlayer insulation film 31 has a lamination structure in which a CVD oxide film, an SOG film and a CVD oxide film are laminated consecutively.

Further, the second layer metal interconnection pattern 37 is formed on the second layer interlayer insulation film 31 in the form of lamination of the metal pattern 33 and the refractory metal film 35 similarly to the step (1) explained with reference to FIG. 2A for forming the first layer metal interconnection pattern 11.

For example, a plasma CVD oxide film is formed on the second layer interlayer insulation film 31 including the region where the second layer metal interconnection pattern 37 is formed by using a plasma CVD process with the thickness of about 2000 Angstroms, and the SOG film is formed thereafter by applying an SOG with a known coating process. With this the underlying insulation film 73 is formed in the state that the top surface of the second layer metal interconnection pattern 37 is covered with the underlying insulation film 73 (reference should be made to FIG. 24A)

(2) Next, in the step of FIG. 24B, an etch back process or CMP process is applied to the underlying insulation film 73 until the top surface of the second layer metal interconnection pattern 37 is exposed.

(3) Next, an Ar reverse sputtering process is applied to the second layer interlayer insulation film 31 including the region where the second layer metal interconnection pattern 37 under the condition identical with the Ar reverse sputtering processing explained with reference to FIG. 2D. Subsequently, formation of the CrSi thin-film for the metal thin-film resistance is formed after completion of the Ar sputter etching process, without breaking the vacuum.

Next, a resist pattern for defining the region of the metal thin-film resistance is formed on the CrSi thin film by a photolithographic process. For example, an RIE apparatus is used for patterning the CrSi thin-film while using the resist pattern as a mask, and the CrSi thin-film resistance 21 is formed as represented in FIG. 24C. Thereafter, the resist pattern is removed.

(4) Next, by using a plasma CVD process, a silicon oxide film and a silicon nitride film are deposited consecutively on the entire surface of the second layer insulation film 31 as the passivation film 23. With this, fabrication of the semiconductor device is completed (see FIGS. 23A-23C).

Thus, there is no longer the need of carrying out patterning by a wet etching process after formation of the CrSi thin-film resistance in the embodiment of FIGS. 23A-23C. Further, because there is no chance that the contact surface of the CrSi thin-film resistance 21 to the second layer metal interconnection pattern 37 is exposed to the air, it is possible to achieve good electrical contact between the CrSi thin-film resistance 21 and the second layer metal interconnection pattern 37. Further, because the refractory metal film 35 functioning as a barrier film is interposed between the CrSi thin-film resistance 21 and the metal pattern 33, variation of contact resistance between the CrSi thin-film resistance 21 and the second layer metal interconnection pattern 38 is reduced. Further, because the Ar reverse sputtering process is conducted before formation of the CrSi thin-film used for the CrSi thin-film resistance 21 to the third layer interlayer insulation film 39 used for the underlying film, the dependence of the CrSi thin-film resistance on the underlying film is improved as explained already with reference to FIGS. 4 through 8.

Further, similarly to the embodiment explained with reference to FIGS. 18A-18C, there is no need of forming a contact hole for connecting the CrSi thin-film resistance 21 and the second layer interconnection pattern 37 electrically, and it is possible to simplify the fabrication process and fabrication cost of the semiconductor device as compared with the case of forming such a contact hole. Further, because there is caused no problem of poor step coverage of the metal thin-film resistance at such a contact hole, there arises no problem of increased variation of the resistance value of the thin-film resistance or increase of contact resistance to the electrode.

Further, because the underlying insulation film 73 is formed at the lateral side of the second layer interconnection pattern 37, there occur no problem of deterioration of step coverage in the CrSi thin-film resistance 21 caused by the step formed at the sidewall surface of the second layer metal interconnection pattern 37.

Thus, with the present embodiment, a reliable resistance value is achieved for the CrSi thin-film resistance 21 including the contact resistance to the second layer metal interconnection pattern 37.

Because the both end parts of the CrSi thin-film resistance 21 is formed so as to intersect with the second layer metal interconnection pattern 37, it is further possible to eliminate the alignment error between the second layer metal interconnection pattern 37 and the CrSi thin-film resistance 21. Further, it is possible to eliminate the variation of the contact region between the second layer metal interconnection pattern 37 and the CrSi thin-film resistance 21 caused by the rounding of the end parts of the CrSi thin-film resistance 21. Thereby, reliable and stable contact resistance is attained.

Figure 25A:
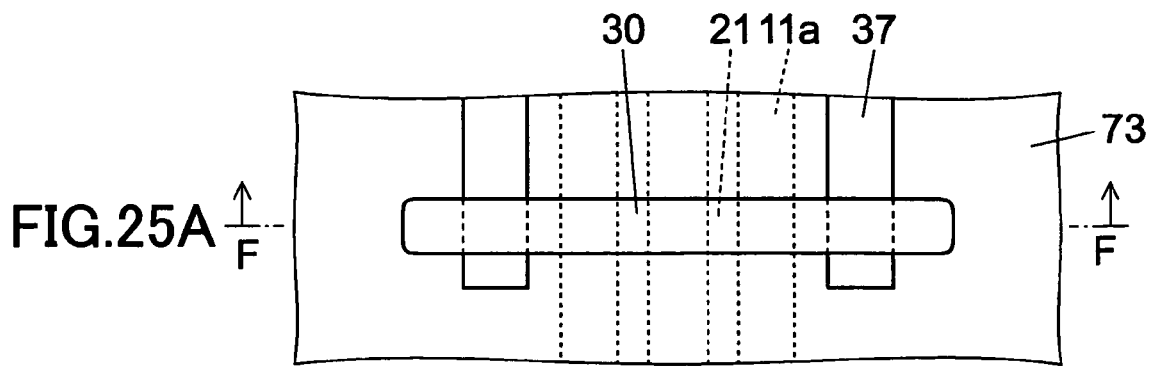
Figure 25B:
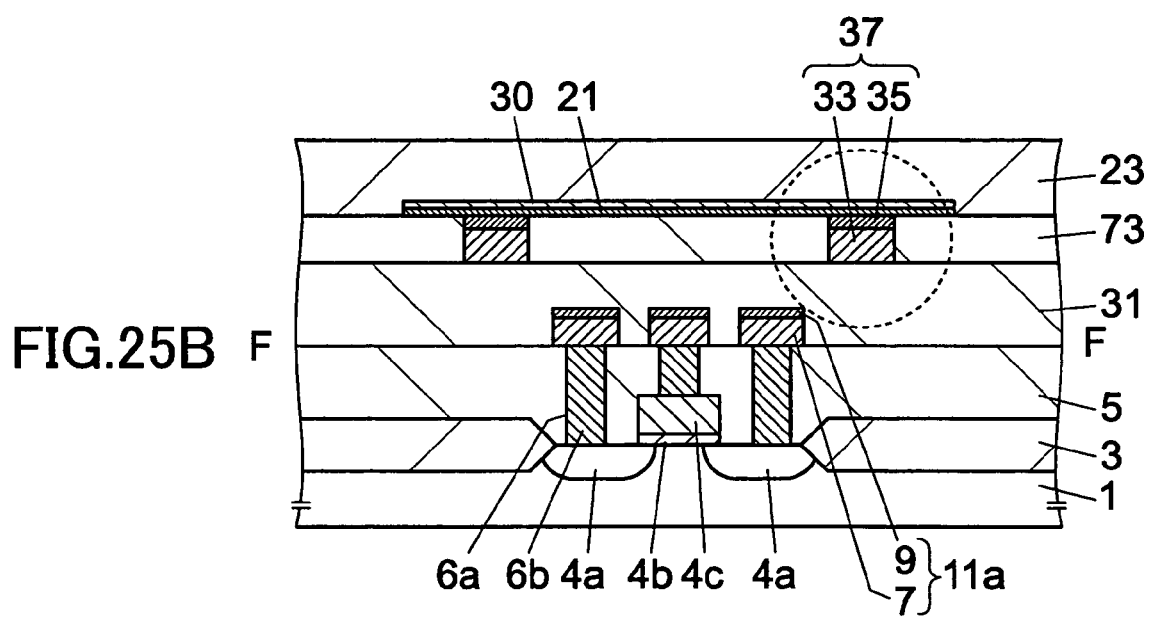
Figure 25C:
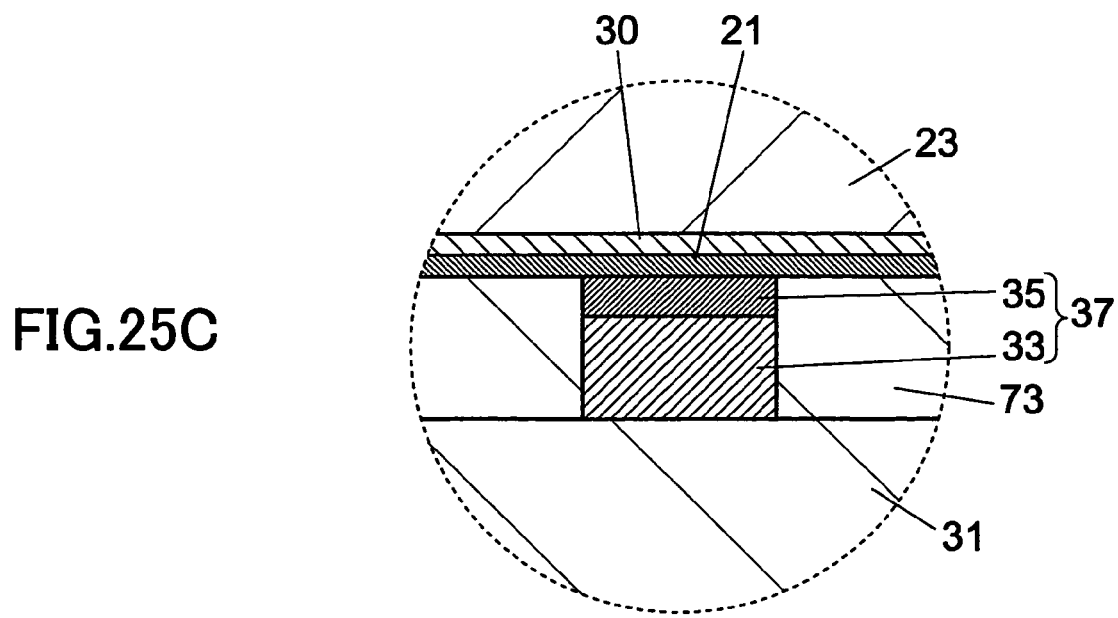

FIGS. 25A-25C are diagrams showing another embodiment of the third mode of the present invention, wherein FIG. 25A is a plan view while FIG. 25B is a cross-sectional view taken along an F-F line of FIG. 25A, and FIG. 25C is an enlarged cross-sectional view showing the part of FIG. 25B surrounded by the broken line with enlarged scale. In FIG. 25A, illustration of the passivation film is omitted. In the drawings, those parts corresponding to the parts described previously are designated by the same reference numerals and the description thereof will be omitted.

The present embodiment is different over the embodiment explained with reference to FIGS. 23A-23C in the point that the CrSiN film 30 is formed on the top surface of the CrSi thin-film resistance 21. No CrSiO is formed between the CrSi thin-film resistance 21 and the CrSiN film 30. The CrSiN film 30 can be formed similarly to the embodiment explained with reference to FIGS. 10A and 10B.

In this embodiment, too, the CrSiN film m30 is formed on the top surface of the CrSi thin-film resistance 21 and it is possible to prevent the change of resistance value of the CrSi thin-film resistance 21 caused by exposure of the top source of the CrSi thin-film resistance 21 to the air.

Figure 26A:
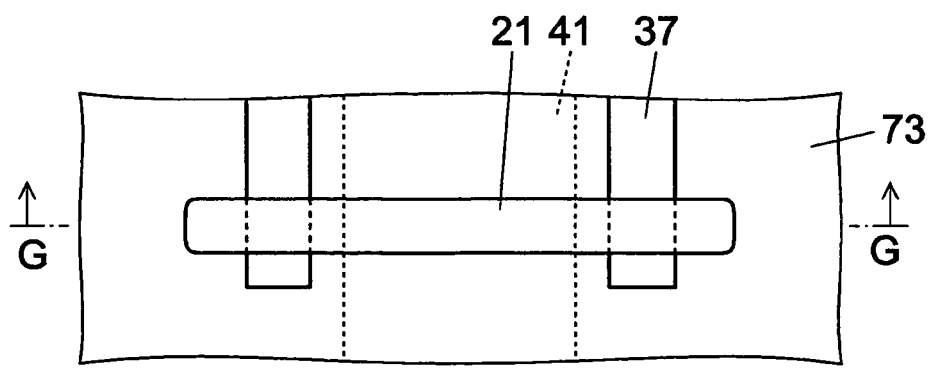
Figure 26B:
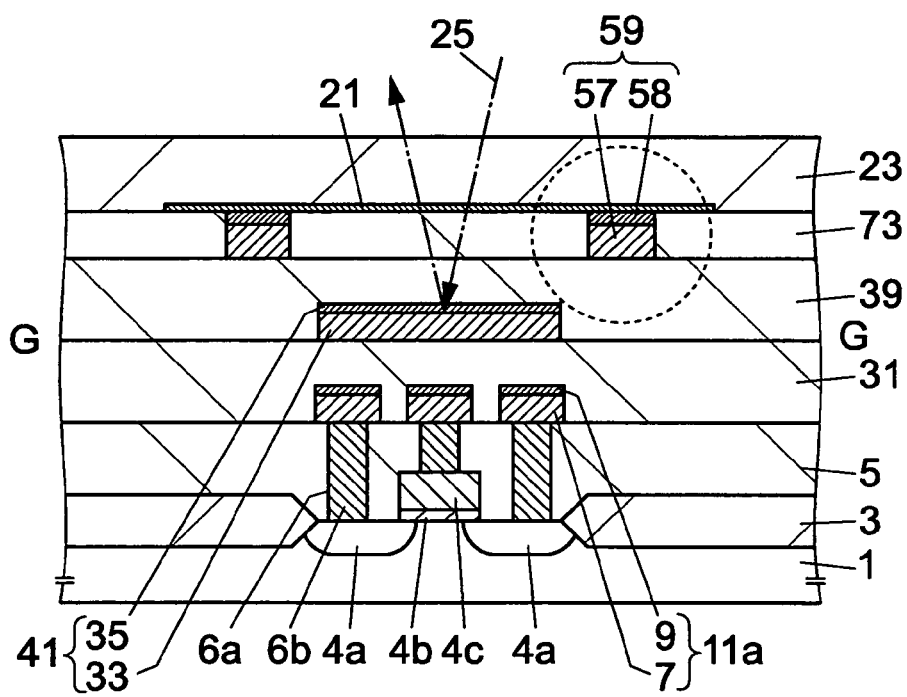
Figure 26C:
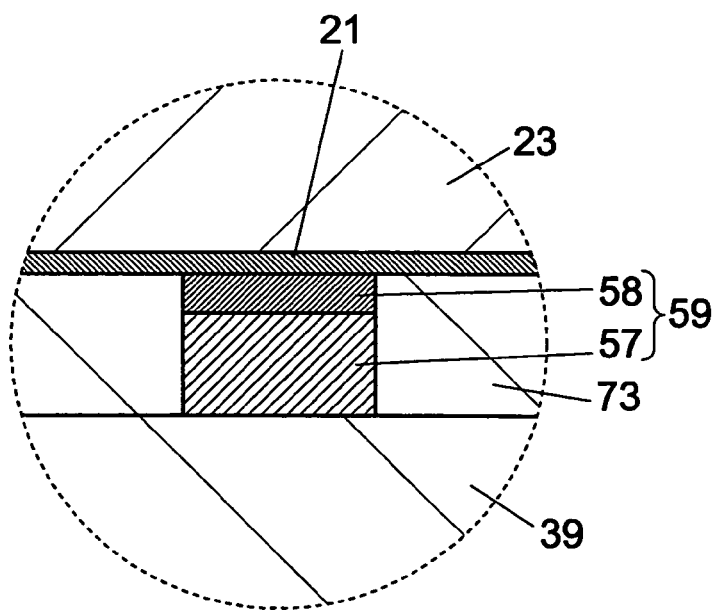

FIGS. 26A-26C are diagrams showing an embodiment of the third mode and fifth mode of the present invention, wherein FIG. 26A is a plan view while FIG. 26B is a cross-sectional view taken along an G-G line of FIG. 26A, and FIG. 26C is an enlarged cross-sectional view showing the part of FIG. 26B surrounded by the broken line with enlarged scale. In FIG. 26A, illustration of the passivation film is omitted. In the drawings, those parts corresponding to the parts described previously are designated by the same reference numerals and the description thereof will be omitted.

Referring to FIG. 26A-26C, the device isolation oxide 3 is formed on the surface of the silicon substrate 1, and a transistor having the diffusion regions 4a and 4a, the gate insulation film 4b and the gate electrode 4c is formed in a device region defined by the device isolation oxide 3. Further, the first layer interlayer insulation film 5 is formed on the silicon substrate 1, wherein the first layer interlayer insulation film 5 is formed with the contact holes 6a and the conductive plugs 6b, and the first layer metal interconnection pattern 11a formed of the metal pattern 7 and the refractory metal film 9 is formed thereon. Further, the second layer interlayer insulation film 31, the layer beam interruption film 41 and the third layer interlayer insulation film 39 are formed thereon.

On the third layer interlayer insulation film 39, there is formed a third layer metal interconnection pattern of lamination of the metal pattern 57 and the refractory metal film 58 formed on the surface of the metal pattern 57.

On the second layer interlayer insulation film 31, the underlying insulation film 73 is formed with the thickness such that the top surface of the third layer metal interconnection pattern 39 is exposed.

Further, it will be noted that the CrSi thin film-resistance 21 is formed in a band-like form so as to extend over the region of the underlying insulation film 73 between a pair of third layer metal interconnection patterns 39. The CrSi thin-film resistance 21 and the third layer metal interconnection pattern 39 are formed so as to cross with each other.

Further, the passivation film 23 (not shown in FIG. 26A) is formed on the interlayer insulation film 5 including the region where the CrSi thin-film resistance 21 is formed.

In this embodiment, too, the transistor constituting the semiconductor integrated circuit and the first layer metal interconnection pattern 11a are disposed in the region underneath the CrSi thin-film resistance 21 similarly to the embodiment explained with reference to FIGS. 1A and 1B. Thus, it is possible to reduce the chip area.

Further, because the laser beam interruption film 41 of metal is provided between the third layer interlayer insulation film 39 and the first layer metal interconnection pattern 11a, the transistor or the silicon substrate 1 in the region underneath the CrSi thin-film resistance 21, it is possible to prevent the laser beam 25 is irradiated upon the first layer metal interconnection pattern 11a, the transistor or the silicon substrate 1 even in the case the laser beam 25 is irradiated upon the CrSi thin-film resistance 21 for the purpose of trimming thereof with the intensity sufficient for causing disconnection or modification of the CrSi thin-film resistance 21 similarly to the embodiment explained with reference to FIGS. 15A and 15B.

Briefly explaining the fabrication process of this embodiment, the process steps up to the step of formation of the third layer interlayer insulation film 39 is conducted according to the process steps explained with reference to FIGS. 15A and 15B. Thereafter, by using similar process steps explained with reference to FIGS. 24A and 24B, the third layer metal interconnection pattern 37 formed of the metal pattern 57 and the refractory metal film 58, the underlying insulation film 73, the CrSi thin-film resistance 21 and the passivation film 23 are formed. Here, the foregoing Ar reverse sputtering process is applied immediately before formation of the CrSi thin-film used for the CrSi thin-film resistance 21.

Thus, with the present embodiment, too, various advantageous effects such as: elimination of the need of patterning the CrSi thin-film resistance 21 after patterning thereof by using a wet etching process; elimination of exposure of the contact surface of the CrSi thin-film resistance 21 to the metal interconnection pattern 37; existence of the refractory metal film 35 between the CrSi thin-film resistance 21 and the metal interconnection pattern 33 as a barrier film; and the effect associated with the Ar reverse sputtering process to the third layer interlayer insulation film 39 used for the underlying film before formation of the CrSi thin-film for the CrSi thin-film resistance, are attained.

Further, similarly to the embodiment explained with reference to FIGS. 23A-23C, various advantageous features such as: elimination of the need of forming a contact hole for electrically connecting the CrSi thin-film resistance 21 to the third-layer metal interconnection pattern 59, existence of the underlying insulation film 73 at the lateral sides of the second layer metal interconnection pattern 37, crossed relationship of the CrSi thin-film resistance 21 and the third layer metal interconnection pattern 59.

Figure 27A:
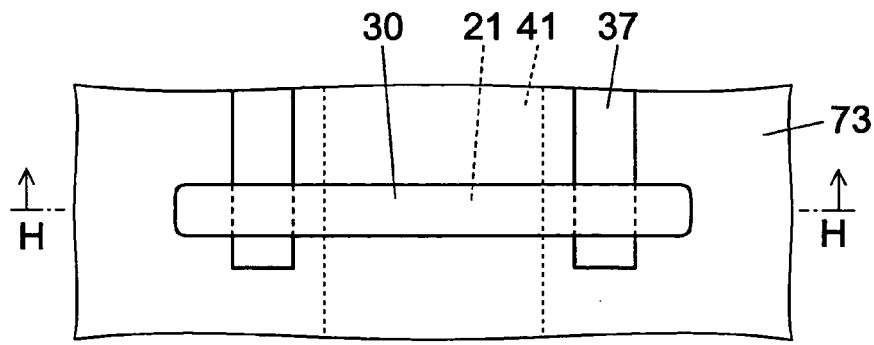
Figure 27B:
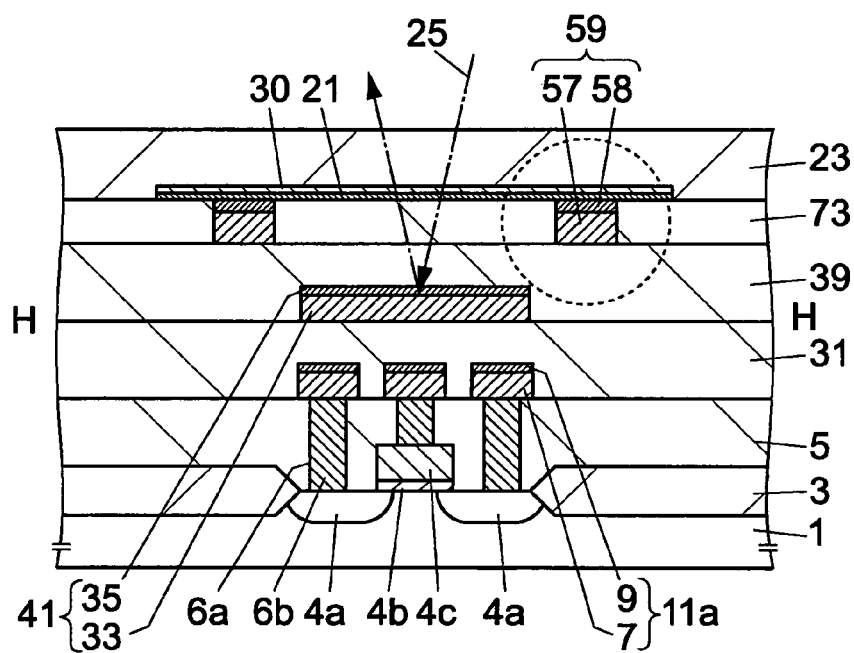
Figure 27C:
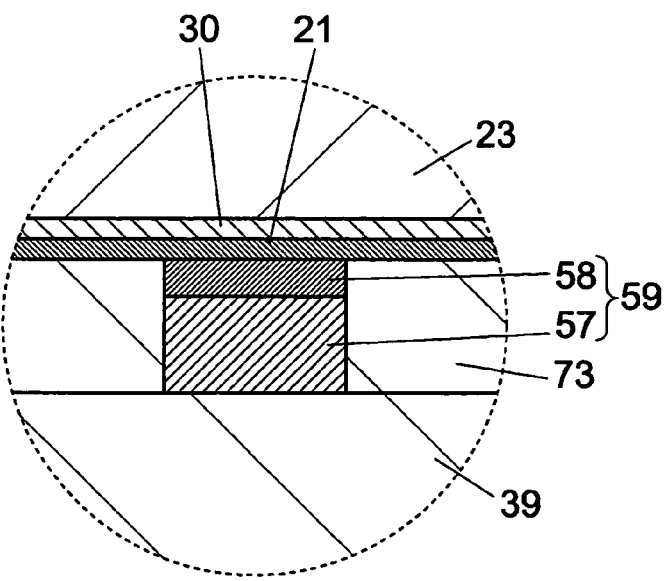

Further, as shown in FIGS. 27A-27C, it is possible to form the CrSiN film 30 on the top surface of the CrSi thin-film resistance 21 similarly to the embodiment explained with reference to FIGS. 13A and 13B. In this embodiment, too, no CrSiO is formed between the CrSi thin-film resistance 21 and the CrSiN film 30. In the embodiment shown in FIGS. 27A-27C, the CrSiN film 30 can be formed similarly to the method explained with reference to FIGS. 13A and 13B.

In the present embodiment, it is also possible to dispose the capacitor of FIGS. 10A and 10B, the polysilicon interconnection pattern 28 of FIGS. 11A and 11B or the impurity diffusion region 29 shown in FIGS. 12A and 12B in the region underneath the CrSi thin-film resistance 21 in place of the transistor explained with reference to the embodiments explained with reference to FIGS. 23A-23C through FIGS. 27A-27C.

Further, while the CrSi thin-film resistance 21 and the second layer metal interconnection pattern 37 or the third layer metal interconnection pattern 59 are disposed in a crossed relationship in the second mode and third mode of the present invention, the present invention is by no means limited to this construction and it is also possible to dispose the end part of the metal thin-film resistance over the metal interconnection pattern or under the metal interconnection pattern.

Further, there is no need that the metal thin-film resistance and the metal interconnection pattern are disposed in a perpendicular relationship. Thus, the shape, orientation and arrangement of the metal thin-film resistance and the metal interconnection pattern are by no means limited to those of the embodiment. For example, the metal thin-film resistance and the metal interconnection pattern can be disposed in parallel.

Figure 28A:
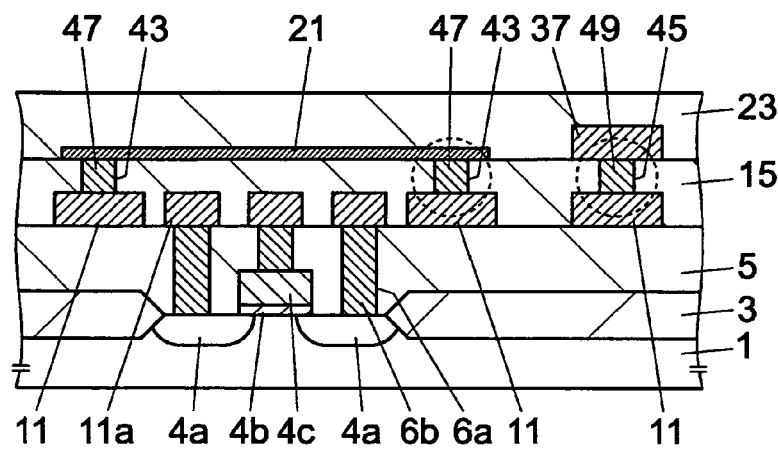
Figure 28B:
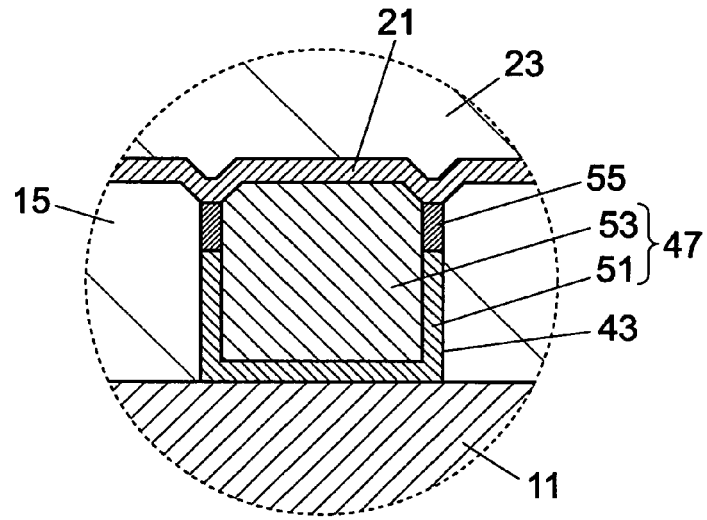
Figure 28C:
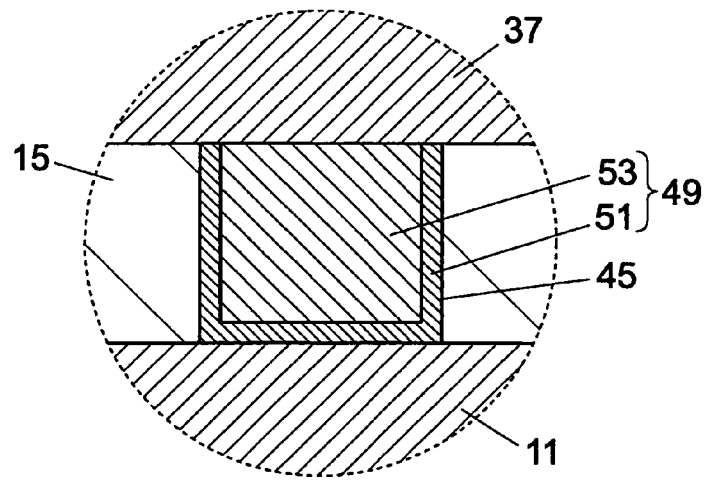

FIGS. 28A-28C are diagrams showing an embodiment of the fourth mode of the present invention, wherein FIG. 28A is a cross-sectional view while FIG. 28B is a cross-sectional showing the first contact hole with enlarged scale, and FIG. 28C is a cross-sectional view showing the second contact hole with enlarged scale. In the drawings, those parts corresponding to the parts described previously are designated by the same reference numerals and the description thereof will be omitted.

Referring to FIG. 28A-28C, the device isolation oxide 3 is formed on the surface of the silicon substrate 1, and a transistor having the diffusion regions 4a and 4a, the gate insulation film 4b and the gate electrode 4c is formed in a device region defined by the device isolation oxide 3. Further, the first layer interlayer insulation film 5 is formed on the silicon substrate 1, wherein the first layer interlayer insulation film 5 is formed with the contact holes 6a and the conductive plugs 6b, and the first layer metal interconnection pattern 11a formed of a metal pattern and a refractory metal film is formed thereon. The first layer metal interconnection patterns 11 and 11a are formed for example of al AlSiCu pattern and a refractory metal film formed thereon such as a TiN film, wherein FIGS. 28A-28C represent the first layer metal interconnection patterns 11 and 11a as if they are a single layer film. Further, a second layer interlayer insulation film 15 is formed in the form of lamination of a lower plasma CVD film, an intermediate SOG film and an upper plasma CVD film on the first layer interlayer insulation film 5 including the region where the first layer metal interconnection pattern is formed.

In the second layer interlayer insulation film 15, there are formed a first contact hole 43 and a second contact hole 45 in correspondence to the first layer metal interconnection pattern 11, wherein the first contact hole 43 is used for connecting the first layer metal interconnection pattern 11 to a metal thin-film resistance formed on the second layer interlayer insulation film, while the second contact hole 45 is used for connecting the first layer metal interconnection pattern to a second layer metal interconnection pattern formed on the second layer interlayer insulation film 15.

The first contact hole 43 is filled with a conductive material and there is formed a first conductive plug 47, while the second contact hole 45 is filled with a conductive plug and there is formed a second conductive plug 49. The first conductive plug 47 and the second conductive plug 49 are formed for example of a barrier metal (first conductive material) 51 of titanium, for example, formed on the inner wall surface of the contact hole and a tungsten plug (second conductive material) 53 formed on the barrier metal 51. In the illustration of FIG. 28A, the barrier metal 51 and the tungsten plug 53 are represented as a single part in the first conductive plug 47 and the second conductive plug 49.

As shown in FIG. 28B, the top end part of the barrier metal 51 is formed with a separation from the top edge of the first contact hole 53 and the top surface of the tungsten plug 53, and the top peripheral part of the tungsten plug 53 and the top edge part of the first contact hole 43 are shaped to have a tapered form, wherein illustration of this tapered form is omitted in the representation of FIG. 28A. Further, the space formed on the barrier metal 51 in the contact hole 43 between the inner wall of the first contact hole 43 and the tungsten plug 53 is filled with a reverse sputtering residue 55 containing at least the material of the second layer interlayer insulation film 15, tungsten and Ar as the constituent elements thereof. Illustration of this reverse sputtering residue 55 is omitted in FIG. 28A.

Further, as shown in FIG. 28C, the second contact hole has a structure in which the top surface of the barrier film 51, the top surface of the tungsten plug 53 and the top surface of the second layer interlayer insulation film 15 form a flush surface, and there is formed no tapered shape or reverse sputtering residue 55 contrary to the case of the first contact hole 43.

The CrSi thin-film resistance 21 is formed on the first conductive plug 47 and the second layer interlayer insulation film 15. Thereby, both ends of the CrSi thin-film resistance are connected electrically to the first layer metal interconnection patterns via the first conductive plugs 47. Further, the first layer metal interconnection patterns 11a and the transistor are disposed underneath CrSi thin-film resistance 21 via the second layer interlayer insulation film 15.

On the second conductive plug 49 and on the second layer interlayer insulation film 15, the second layer metal interconnection pattern 37 is formed as the uppermost metal interconnection pattern, wherein the second layer metal interconnection pattern 37 is connected to the first layer metal interconnection pattern 11 electrically via the second conductive plug 49.

Further, the passivation film 23 is formed on the second layer interlayer insulation film 15 including the region for the CrSi thin-film resistance and the second layer metal interconnection pattern 37.

In this embodiment, too, the chip area can be reduced similarly to the embodiment explained with reference to FIGS. 1A and 1B in view of the fact that the transistor and the first layer metal interconnection pattern 11a constituting the semiconductor integrated circuit are disposed in the region underneath the CrSi thin-film resistance 21.

FIGS. 29A-29E are cross-sectional diagrams for explaining an example of the fabrication process of the present embodiment, wherein the cross-sectional diagrams circled at the right of FIGS. 29A-29E represent the state of the first contact hole with enlarged scale.

Hereinafter, an example of the fabrication process will be explained with reference to FIGS. 28A-28C and FIGS. 29A-29E.

(1) Similarly to the case of the steps (1) and (2) explained with reference to FIGS. 2A and 2B, the silicon substrate 1 still in the form of wafer is formed with the device isolation oxide 3 and the devices such as a transistor having the impurity diffusion regions 4a and 4a, the gate insulation film 4b and the gate electrode 4c, and the first layer interlayer insulation film 5 is formed thereon together with the contact holes 6a and the conductive plugs 6b. Further, the first layer metal interconnection pattern 11a is formed on the first layer interlayer insulation film 5 in the form of lamination of the metal pattern 7 and the refractory metal film 9. Further, the second layer interlayer insulation film 15 is formed thereon.

Next, by using known photolithographic process and dry etching process, the first contact hole 43 and the second contact hole 45 are formed in the second layer interlayer insulation film 15 in correspondence to the predetermined region of the first layer metal interconnection pattern 11.

Further, the barrier metal 51 of titanium, for example, is formed on the entire surface of the second layer interlayer insulation film 15 including the inner wall surface of the first contact hole 43 and the second contact hole 45 with the thickness of 1000 Angstroms and, after formation of a tungsten film 53 thereon with the thickness of 7500 Angstroms, an etch back process or CMP process is applied and unnecessary tungsten film 53 and the barrier metal film 51 are removed. With this, the first conductive plug 47 is formed in the first contact hole 43 in the form of lamination of the barrier metal 51 and the tungsten plug 53, and the second conductive plug 49 is formed in the second contact hole 45 in the form of lamination of the barrier metal 51 and the tungsten plug 53 (reference should be made to FIG. 29A).

(2) Next, in the step of FIG. 20B, a metal film such as an AlSiCu film is formed on the second layer interlayer insulation film 15 by using a DC magnetron sputtering apparatus with the thickness of about 5000 Angstroms, for example, and the interconnection metal film 61 is formed in continuation in a vacuum environment by depositing a refractory metal film such as a TiN film with the thickness of about 500 Angstroms.

Figure 29A:
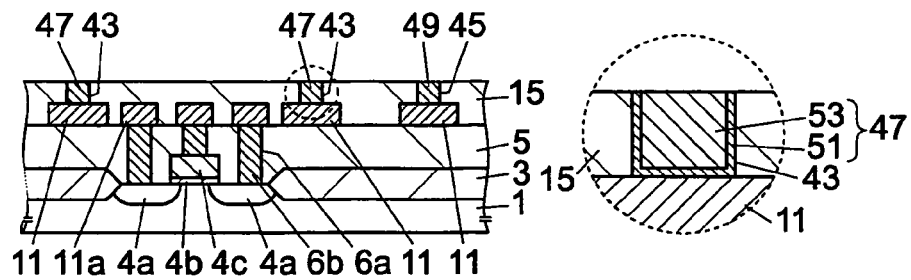
FIGS. 29A-29E are cross-sectional diagrams explaining the fabrication process of the semiconductor device of FIGS. 28A-28C.
Figure 29B:
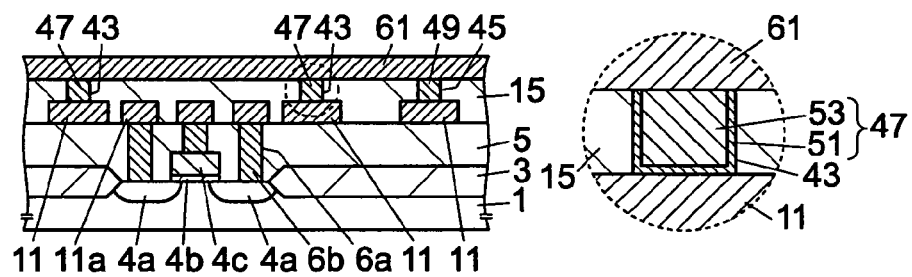
Figure 29C:
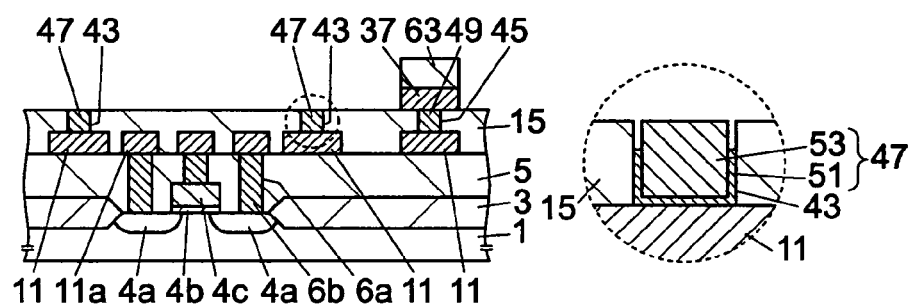

(3) Next, in the step of FIG. 29C, a resist pattern 63 defining the region for the second layer metal interconnection pattern is formed by using a photolithographic process on the metal film 61 for the interconnection pattern, and the second layer metal interconnection pattern 37 is formed by patterning the metal film 61 by a dry etching process while using the resist pattern 63 as a mask.

During this etching process, the metal film 61 for the interconnection pattern on the first conductive plug 47 is removed, while the top part of the barrier metal film 51 constituting the first conductive plug 47 is also removed at the same time, and there is formed a depression around the first conductive plug 47 as shown in the enlarged diagram of FIG. 29C.

It should be noted that such a depression is formed in the case a large etching selectivity is secured between the metal film 61 for the interconnection pattern and the tungsten film 53 (second conductive material) and the etching selectivity between the metal film 61 and the barrier metal film 51 (first conductive material) is small. Thus, the depression is formed not only in the present embodiment that uses specific materials for the first conductive plug 47 and the interconnection metal film 61, but also in the case the etching selectivity between the metal film and the first conductive material constituting the first conductive plug is small and a large etching selectivity is secured between the metal film for the interconnection pattern and the second conductive material constituting the first conductive plug.

Figure 29D:
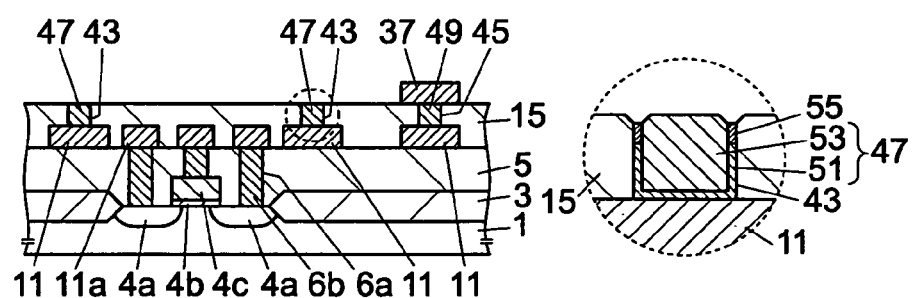

(4) After removal of the resist pattern 63, an Ar reverse sputtering process is applied in the step of FIG. 29D to the surface of the second layer interlayer insulation film 15 including the region where the first conductive plug 47 is formed under the same condition as in the case of the Ar reverse sputtering process in the step (4) of the process explained with reference to FIG. 2D.

With this Ar reverse sputtering process, the outer periphery of the top surface of the tungsten plug 53 and the top edge part of the fist contact hole 43 are shaped to have a tapered formed at the first contact hole 43. Further, the reverse sputtering residue containing therein the material of the second layer interlayer insulation film, tungsten and Ar as the constituent elements thereof, fills the space formed on the top part of the barrier metal film 51 between the inner wall surface of the first contact hole 43 and the tungsten plug 53.

Figure 29E:
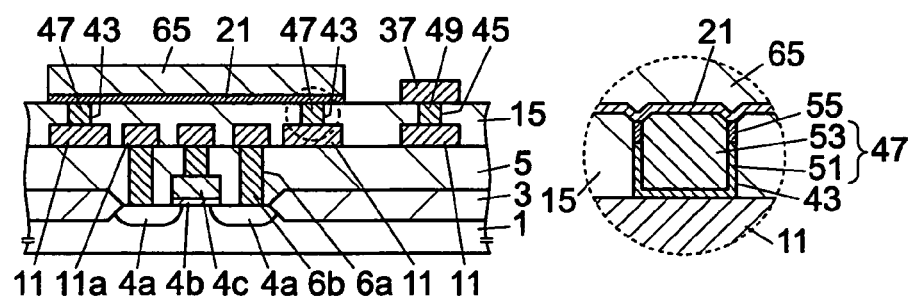

(5) After completion of the Ar reverse sputtering process, the CrSi thin-film for the metal thin-film resistance is formed on the entire surface of the second layer interlayer insulation film 15 including the region of the first conductive plug 47 and the second layer metal interconnection pattern 37 under the condition identical to the process of forming the CrSi thin-film resistance in the step (4) explained with reference to FIG. 2D, without breaking the vacuum. Further, the resist pattern 65 for defining the region of the metal thin-film resistance is formed on the CrSi thin-film for defining the region where the CrSi thin-film resistance is to be formed by using a photolithographic process, and the CrSi thin film is patterned by using the resist pattern as a mask, to form the CrSi thin-film resistance. Reference should be made to FIG. 29E.

Thus, by applying the Ar reverse sputtering process to the second layer interlayer insulation film 15 before formation of the CrSi thin-film 63 for the metal thin-film resistance and forming the tapered shaper at the top peripheral part of the tungsten plug 53 and the top edge part of the contact hole 43, and by forming the reverse sputtering residue 55 in the space on the barrier metal film 51 between the inner wall surface of the first contact hole 43 and the tungsten plug 53, it becomes possible to improve the step coverage of the CrSi thin-film 63 in the vicinity of the first contact hole 43.

Further, as explained with reference to FIGS. 4-8, the dependence of characteristics of the CrSi thin-film resistance formed from the CrSi thin-film 63 in the later process, on the underlying film is improved by applying such an Ar reverse sputtering process.

(6) Next, the resist pattern 65 is removed. Because the CrSi thin-film resistance 21 is connected electrically to the first layer metal interconnection pattern 11 via the first conductive plug 47, there is no longer the need of applying a metal oxide removal process to the surface of the CrSi thin-film resistance for achieving electrical contact at the top surface of the metal thin-film resistance by using a hydrofluoric acid solution, contrary to the conventional art.

Thereafter, the passivation film 23 is formed by consecutively depositing a silicon oxide film and a silicon nitride film. With this, fabrication of the semiconductor device of FIGS. 28A-28C is completed.

Thus, because the electrical connection between the CrSi thin-film resistance 21 and the first layer metal interconnection pattern 11 via the first conductive plug 47 is achieved by forming the first layer metal interconnection pattern 11 and the contact holes 43 and 45, forming the conductive plugs 47 and 49 in the contact holes 43 and 45, and then forming the CrSi thin-film resistance 21, there is no longer the need of conducting a patterning process by using a wet etching process after patterning the CrSi thin-film resistance 21.

Further, because the contact surface of the CrSi thin-film resistance 21 to the first conductive plug 47 is not exposed to the air, good electrical contact is secured between the CrSi thin-film resistance 21 and the first conductive plug 47 without conducting surface oxide film removal process and formation of etching stopper barrier film to the CrSi thin-film resistance 21.

With this, it becomes possible to miniaturize the CrSi thin-film resistance 21 and stabilize the resistance value thereof irrespective of the thickness of the CrSi thin-film resistance and with out increasing the number of process steps.

Further, because the CrSi thin-film resistance 21 is formed on the first conductive plug 47 and on the second layer interlayer insulation film 15, there occurs no variation of the resistance value of the metal thin-film resistance or contact resistance to the electrode caused by poor step coverage of the metal thin-film resistance, contrary to the conventional case in which the metal thin-film resistance is connected to the interconnection pattern eclectically via the contact hole formed on the interconnection pattern.

Figure 45:
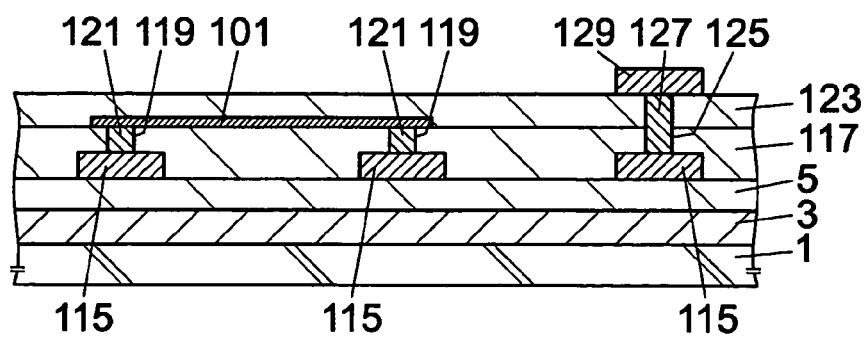
FIG. 45 is a diagram explaining the problem arising with a further conventional semiconductor device.
Figure 46:
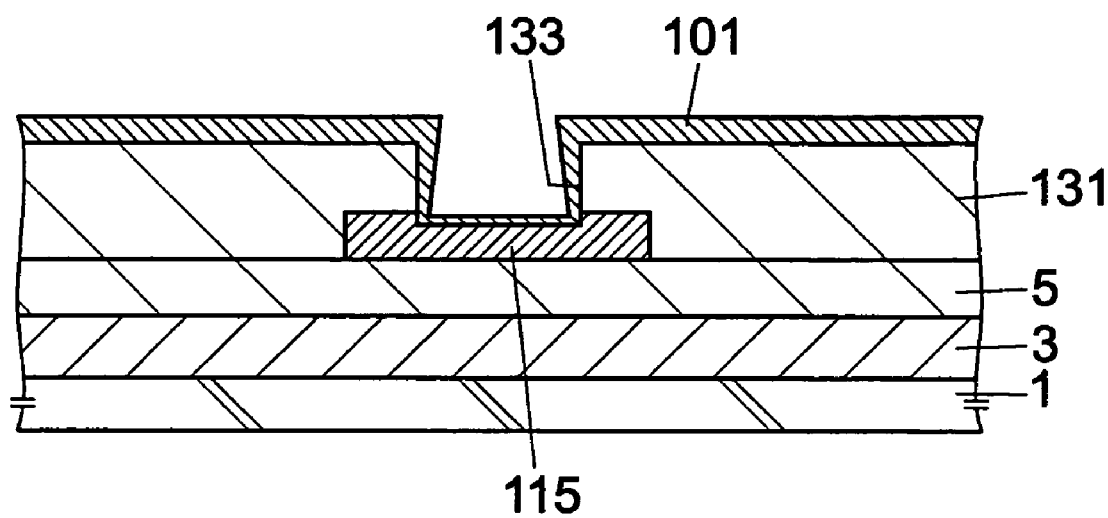
FIG. 46 is a cross-sectional diagram for explaining the problems arising with a further conventional semiconductor device.
Figure 47:
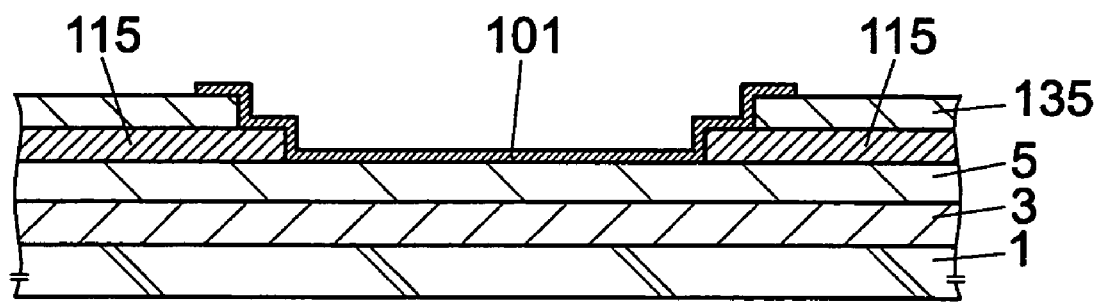
FIG. 47 is a cross-sectional diagram showing a further conventional semiconductor device.

Further, because the second conductive plug 49 for connecting the first layer metal interconnection pattern 11 to the second layer metal interconnection pattern 27 eclectically is formed simultaneously to the first conductive plug 47, it becomes possible to eliminate the dedicated process for forming the insulation film 123 or for forming the second contact hole 125 and the second conductive plug 127 as in the case of the conventional process explained with reference to FIG. 45, and it becomes possible to form the CrSi thin-film resistance 21 with low cost and short time period, without increasing the number of the process steps.

Figure 30A:
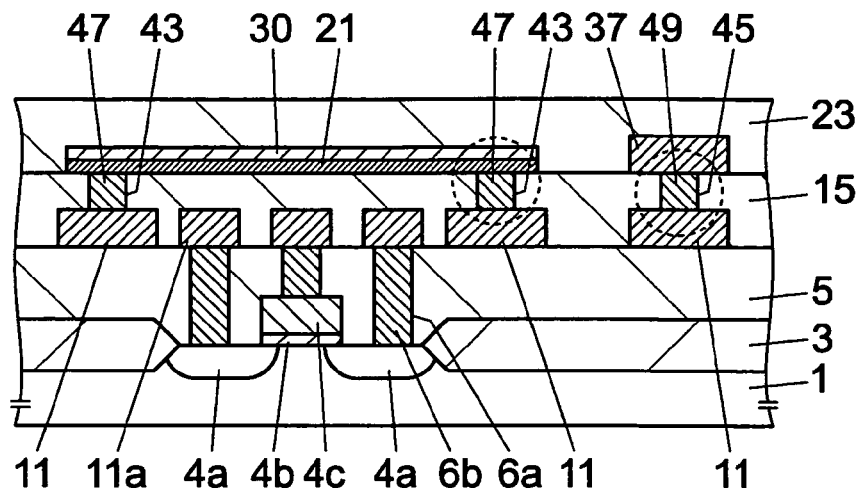
Figure 30B:
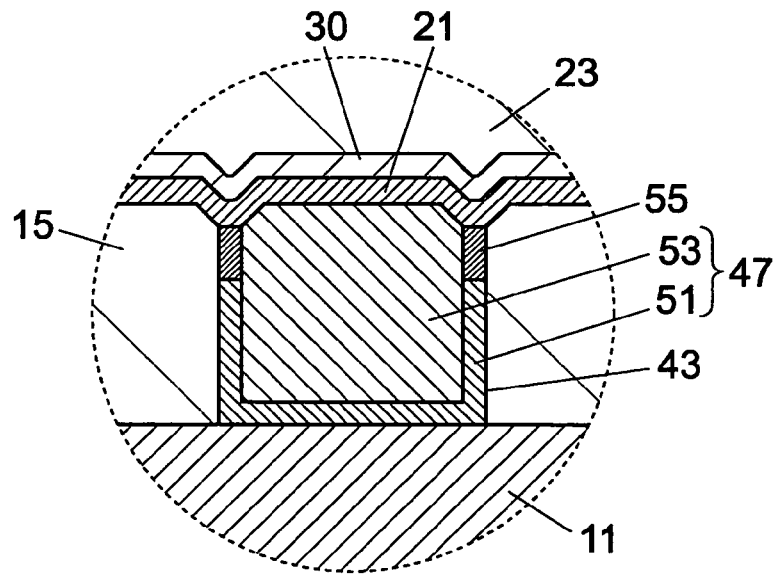
Figure 30C:
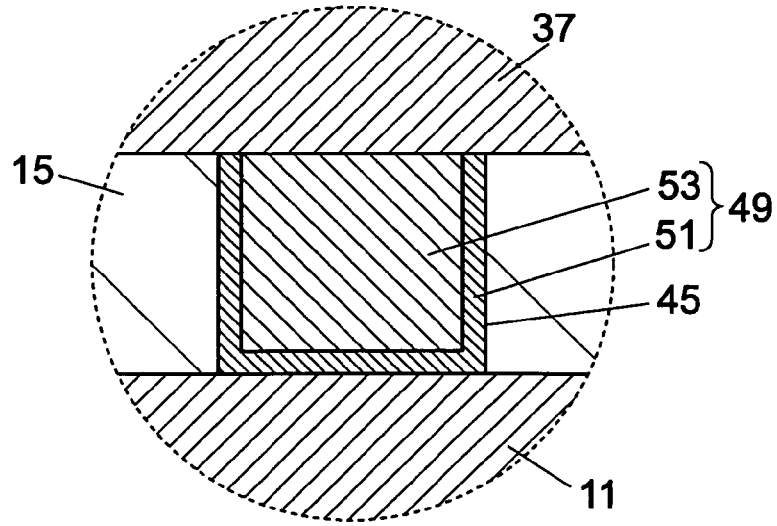

FIGS. 30A-30C are diagrams showing another embodiment of the fourth mode of the present invention, wherein FIG. 30A is a cross-sectional view while FIG. 30B is a cross-sectional showing the first contact hole with enlarged scale, and FIG. 30C is a cross-sectional view showing the second contact hole with enlarged scale. In the drawings, those parts corresponding to the parts described previously are designated by the same reference numerals and the description thereof will be omitted.

The present embodiment is distinct over the embodiment explained with reference to FIGS. 28A-28C in that the CrSiN film m30 is formed on the top surface of the CrSi thin-film resistance 21. Thus, no CrSiO is formed between the CrSi thin-film resistance 21 and the CrSiN film 30. The CrSiN film 30 can be formed similarly to the embodiment explained with reference to FIGS. 10A and 10B.

In this embodiment, too, the CrSiN film 30 is formed on the top surface of the CrSi thin-film resistance 21, and it is possible to prevent the change of resistance value of the CrSi thin-film resistance 21 caused by exposure of the top source of the CrSi thin-film resistance 21 to the air.

Figure 31A:
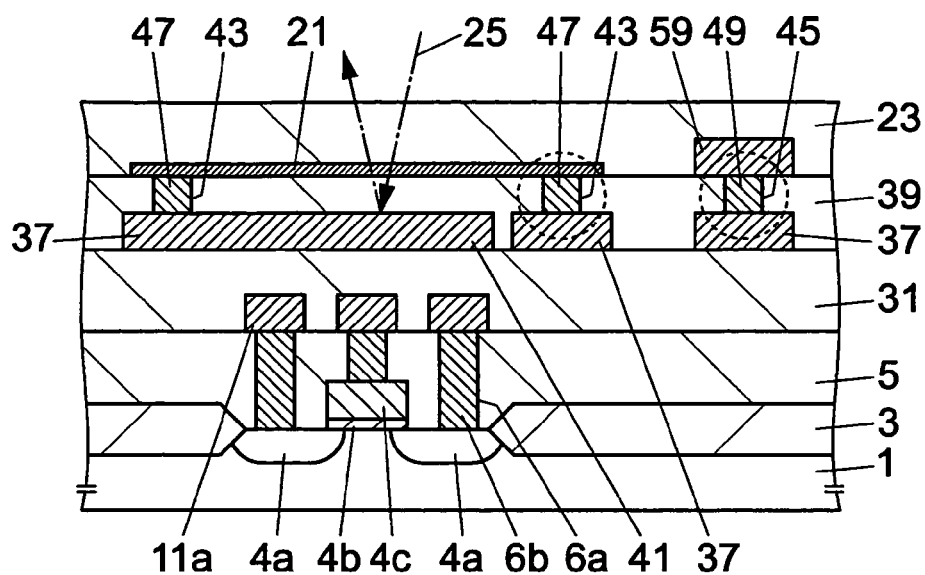
Figure 31B:
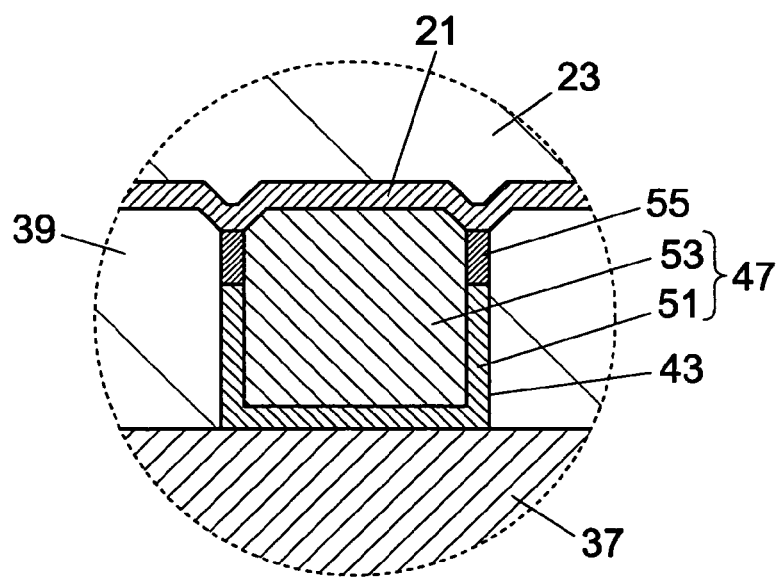
Figure 31C:
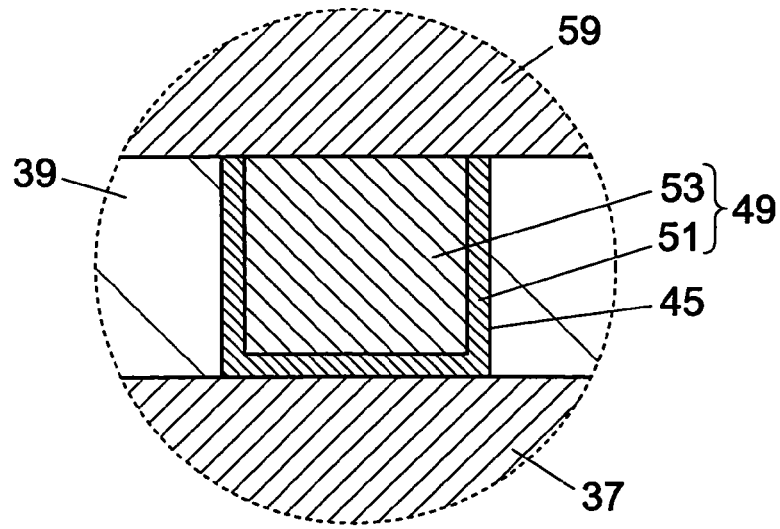

FIGS. 31A-31C are diagrams showing an embodiment of the fourth mode of the present invention, wherein FIG. 31A is a cross-sectional view while FIG. 31B is a cross-sectional showing the first contact hole with enlarged scale, and FIG. 31C is a cross-sectional view showing the second contact hole with enlarged scale. In the drawings, those parts corresponding to the parts described previously are designated by the same reference numerals and the description thereof will be omitted.

Referring to FIG. 30A-30C, the device isolation oxide 3 is formed on the surface of the silicon substrate 1, and a transistor having the diffusion regions 4a and 4a, the gate insulation film 4b and the gate electrode 4c is formed in a device region defined by the device isolation oxide 3. Further, the first layer interlayer insulation film 5 is formed on the silicon substrate 1, wherein the first layer interlayer insulation film 5 is formed with the contact holes 6a and the conductive plugs 6b, and the first layer metal interconnection pattern 11a formed of the metal pattern 7 and the refractory metal film 9 is formed thereon. Further, the second layer interlayer insulation film 31 is formed thereon.

The second layer metal interconnection pattern 37 is formed on the second layer interlayer insulation film 31, wherein a part of the second layer metal interconnection pattern 37 extends to the region underneath the CrSi thin-film resistance 21 and forms the laser beam interruption film 41. The second layer metal interconnection pattern 37 and the laser beam interruption film 41 is formed of lamination of a metal pattern of AlSiCu and a refractory metal film such as a TiN film formed thereon, wherein FIGS. 28A-28C represent the metal pattern and the refractory metal film as if it is a single layer film.

On the second layer interlayer film 31, the third layer interlayer insulation film 39 is formed so as to include the second layer metal interconnection pattern 37 and the laser beam interruption film 41.

In the third layer interlayer insulation film 39, the first contact hole 43 and the second contact hole 45 are formed in correspondence to the second layer metal interconnection pattern 37, wherein the first contact hole 43 is used for connecting the first layer metal interconnection pattern 21 to the second layer interlayer insulation film 37, while the second contact hole 45 is used for connecting the second layer metal interconnection pattern 37 to the third layer metal interconnection pattern 59. The first contact hole is formed with the first conductive plug 47 formed of the barrier metal film 51 and the tungsten plug 47, while the second contact hole 45 is formed with the second conductive plug 49 formed of the barrier metal film 51 and the tungsten plug 47.

As shown in FIG. 30B, the top end part of the barrier metal 51 is formed with a separation from the top edge of the first contact hole 43 and the top surface of the tungsten plug 53 in the first contact hole 43, and the top peripheral part of the tungsten plug 53 and the top edge part of the first contact hole 43 are shaped to have a tapered form, wherein illustration of this tapered form is omitted in the representation of FIG. 30A. Further, the space formed on the barrier metal 51 in the contact hole 43 between the inner wall of the first contact hole 43 and the tungsten plug 53 is filled with a reverse sputtering residue 55 containing at least the material of the third layer interlayer insulation film 39, tungsten and Ar as the constituent elements thereof. Illustration of this reverse sputtering residue 55 is omitted in FIG. 30A.

Further, as shown in FIG. 30C, the second contact hole 45 has a structure in which the top surface of the barrier film 51, the top surface of the tungsten plug 53 and the top surface of the second layer interlayer insulation film 15 form a flush surface, and there is formed no tapered shape or reverse sputtering residue 55 contrary to the case of the first contact hole 43.

The CrSi thin-film resistance 21 is formed on the first conductive plug 47 and the third layer interlayer insulation film 39. Thereby, both ends of the CrSi thin-film resistance 21 are connected electrically to the second layer metal interconnection patterns 37 via the first conductive plugs 47. Further, the first layer metal interconnection patterns 11a and the transistor are disposed underneath CrSi thin-film resistance 21 via the second layer interlayer insulation film 15.

On the second conductive plug 49 and on the third layer interlayer insulation film 39, the third layer metal interconnection pattern 59 is formed as the uppermost metal interconnection pattern, wherein the third layer metal interconnection pattern 59 is connected to the second layer metal interconnection pattern 37 electrically via the second conductive plug 49.

Further, the passivation film 23 is formed on the third layer interlayer insulation film 39 including the region for the CrSi thin-film resistance 21 and the third layer metal interconnection pattern 59.

In this embodiment, too, the chip area can be reduced similarly to the embodiment explained with reference to FIGS. 1A and 1B in view of the fact that the transistor and the first layer metal interconnection pattern 11a constituting the semiconductor integrated circuit are disposed in the region underneath the CrSi thin-film resistance 21.

Further, because the laser beam interruption film 41 of metal is provided between the third layer interlayer insulation film 39 and the first layer metal interconnection pattern 11a, the transistor and the silicon substrate 1 in the region underneath the CrSi thin-film resistance 21, irradiation of the laser beam 15 upon the first layer metal interconnection pattern 11a, the transistor or the silicon substrate 1 is prevented effectively even in the case the laser beam 25 is irradiated upon the CrSi thin-film resistance 21 with the intensity sufficient for causing cutting or modification of the CrSi thin-film resistance 21 at the time of the laser trimming process, similarly to the embodiment explained with reference to FIGS. 15A and 15B.

Briefly explaining the fabrication process of this embodiment, the process steps up to the step of formation of the third layer interlayer insulation film 39 is conducted according to the process steps explained with reference to FIGS.

15A and 15B. Thereafter, by using similar process steps explained with reference to FIGS. 29A-29E, the third layer interlayer insulation film 39 is formed with the first contact hole 43 and the second contact hole 45, and the first conductive plug 47 and the second conductive plug 49 are formed. Further, the third layer metal interconnection pattern 59 is formed, and the foregoing Ar reverse sputtering process is applied. Further, the CrSi thin-film resistance 21 is formed and the passivation film 23 is formed finally.

Thus, with the present embodiment, too, various advantageous effects such as: elimination of the need of patterning the CrSi thin-film resistance 21 after patterning thereof by using a wet etching process; elimination of exposure of the contact surface of the CrSi thin-film resistance 21 to the metal interconnection pattern 37; existence of the refractory metal film 35 between the CrSi thin-film resistance 21 and the metal interconnection pattern 33 as a barrier film; and the effect associated with the Ar reverse sputtering process to the third layer interlayer insulation film 39 used for the underlying film before formation of the CrSi thin-film for the CrSi thin-film resistance, are attained.

Further, similarly to the embodiment explained with reference to FIGS. 28A-28C, there is caused no increase of variation of the resistance value of the metal thin-film resistance or increase of the contact resistance to the electrode caused by poor step coverage of the metal thin-film resistance in view of the fact that the CrSi thin-film resistance 21 is formed on the first conductive plug 47 and on the second layer interlayer insulation film 15.

Further, because the first conductive plug 47 and the second conductive plug 49 are formed simultaneously, it is possible to form the CrSi thin-film resistance 21 with low cost and short time, without increasing the number of process steps.

Figure 32A:
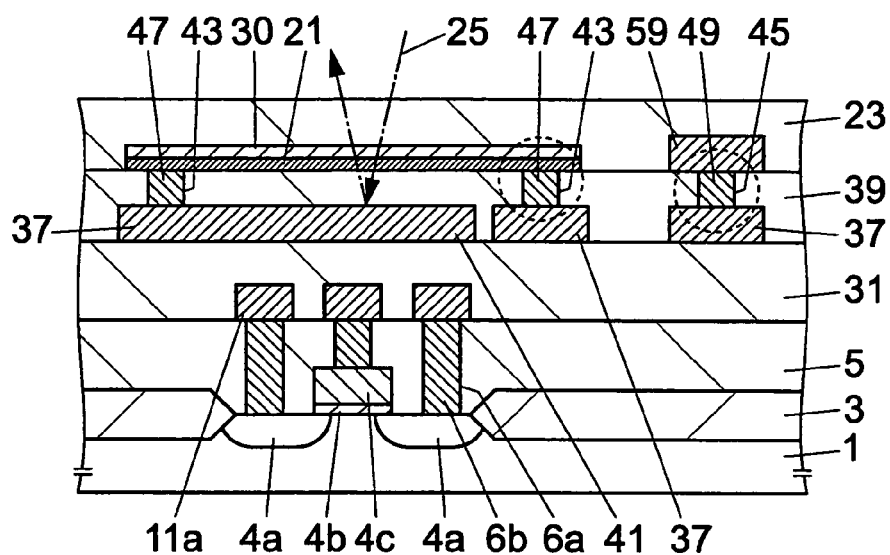
Figure 32B:
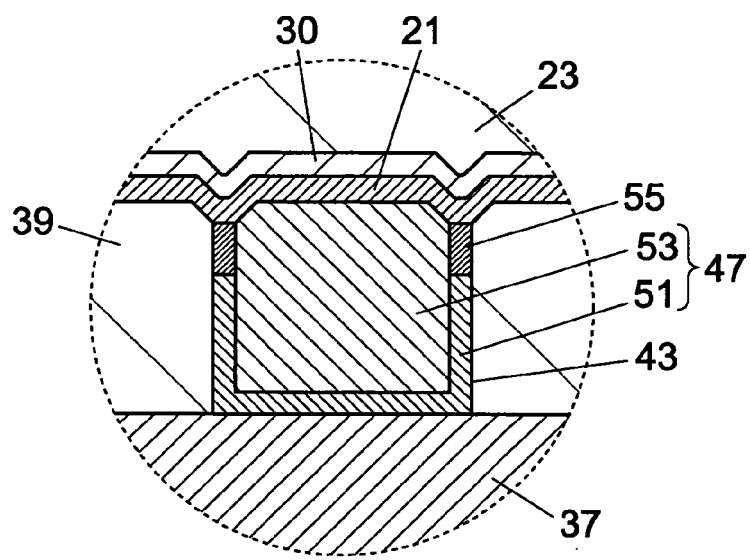
Figure 32C:
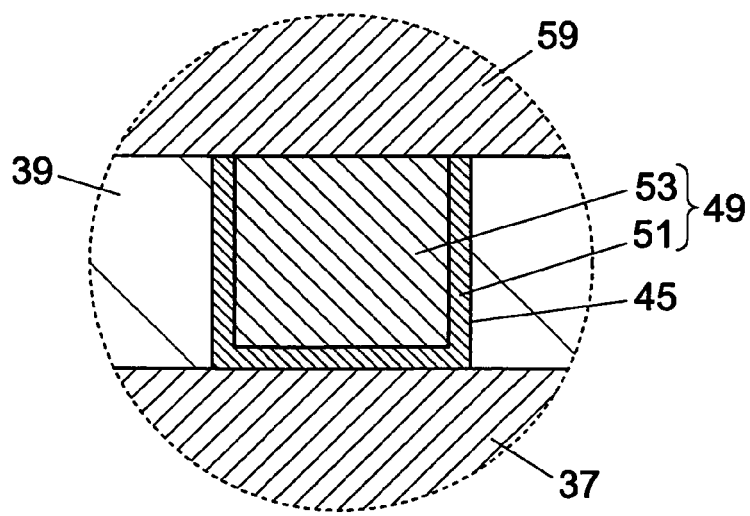

Further, as shown in FIGS. 32A-32C, it is possible to form the CrSiN film 30 on the top surface of the CrSi thin-film resistance 21 similarly to the embodiment explained with reference to FIGS. 13A and 13B. In this embodiment, too, no CrSiO is formed between the CrSi thin-film resistance 21 and the CrSiN film 30. In the embodiment shown in FIGS. 27A-27C, the CrSiN film 30 can be formed similarly to the method explained with reference to FIGS. 13A and 13B.

Figure 33A:
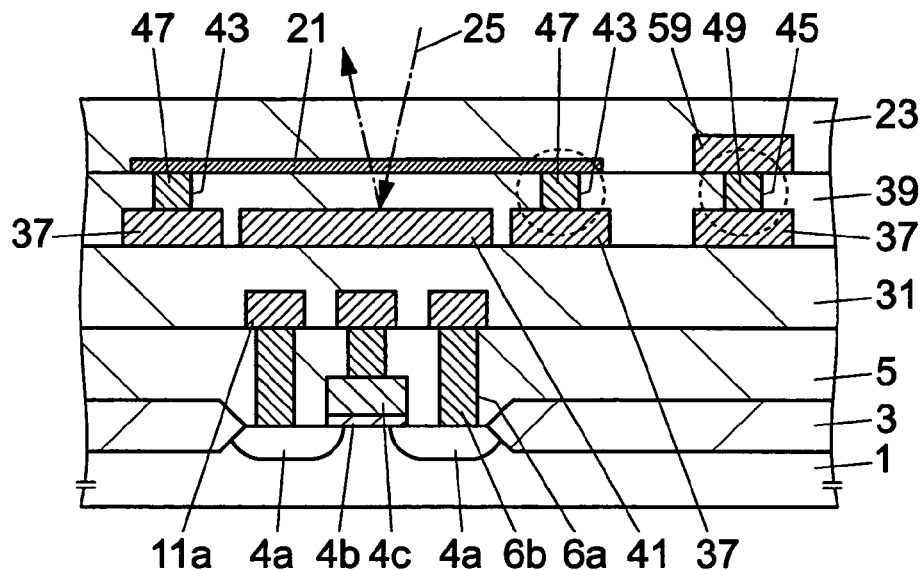
Figure 33B:
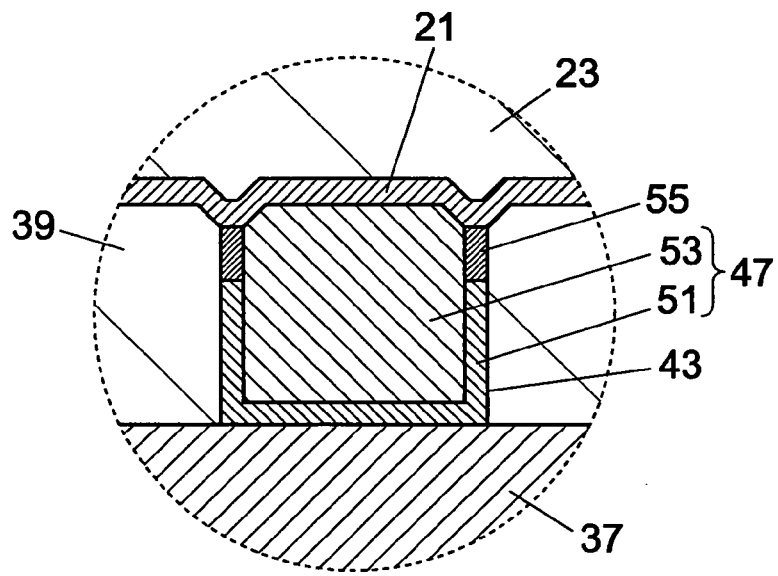
Figure 33C:
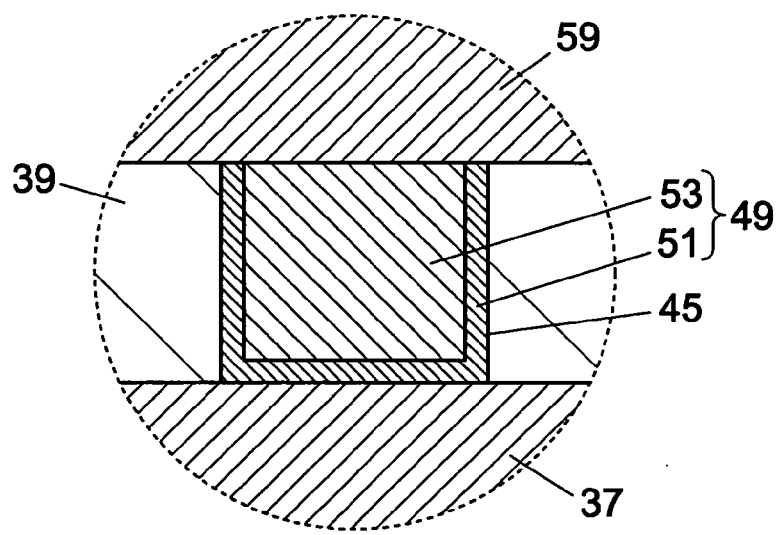

Further, as shown in the embodiment of FIGS. 33A-33C, the laser beam interruption film 41 may be formed separately from the second layer metal interconnection pattern 37.

Figure 34A:
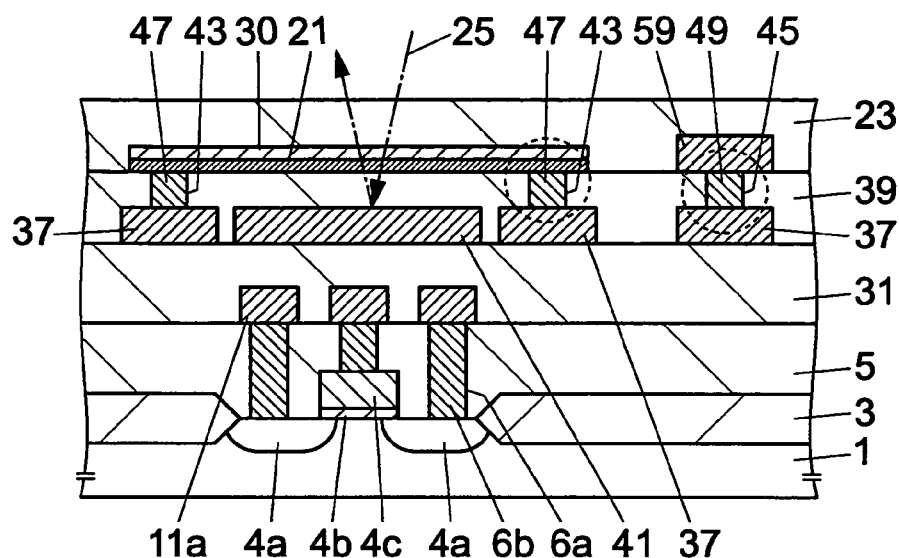
Figure 34B:
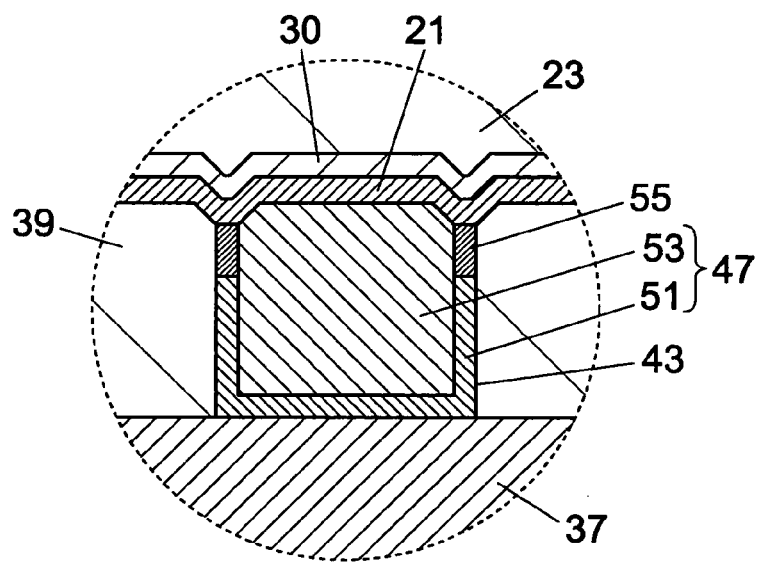
Figure 34C:
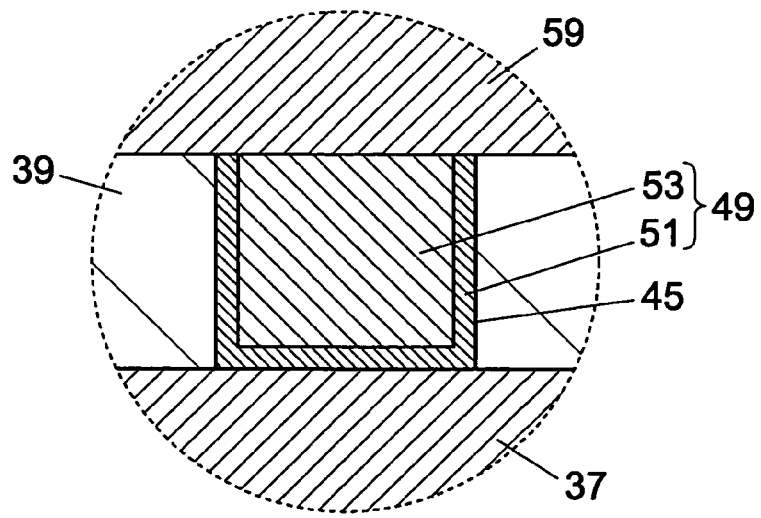

Further, in the embodiment of FIGS. 34A-34C, it is possible to form the CrSiN film 30 on the top surface of the CrSi thin-film resistance 21, similarly to the embodiment explained with reference to FIGS. 13A and 13B.

In any of these cases, the same functions and effects of the embodiment explained with reference to FIGS. 30A-30C are obtained.

Further, in each of the embodiments explained with reference to FIGS. 30A-30C through FIGS. 34A-34C, the laser beam interruption film 41 is formed of the same material as the second layer metal interconnection pattern 37 to which the CrSi thin-film resistance 21 is electrically connected, while the fourth mode and fifth mode of the present invention is not limited to this specific construction and the laser beam interruption film may be formed of a metal material different form the second layer metal interconnection pattern 37 and formed separately from the second layer metal interconnection pattern 37.

Further, in the foregoing embodiments, the laser beam interruption film 41 and the second layer metal interconnection pattern to which the CrSi thin-film resistance 21 is connected electrically are formed on the first layer interlayer insulation film 5, while it is also possible to form the laser beam interruption film and the metal interconnection pattern to which the metal thin-film resistance is connected may be formed on respective, different insulation films.

Further, in each of the embodiments explained with reference to FIGS. 28A-28C and FIGS. 30A-30C through FIGS. 34A-34C, it is also possible to dispose the capacitor shown in FIGS. 10A and 10B or the polysilicon interconnection pattern 28 shown in FIGS. 11A and 11B or the impurity diffusion region 29 shown in FIGS. 12A and 12B, in the region underneath the thin-film resistance 21 in place of the transistor.

Further, while titanium is used for the barrier metal 51 and tungsten is sued for the tungsten plug 53 for the first conductive plug 47 and the second conductive plug 49 in each of the embodiments explained with reference to FIGS. 28A-28C and FIGS. 30A-30C through FIGS. 34A-34C, the first conductive plug and the second conductive plug of the present invention are not limited to these. For example, it is possible to use a material other than titanium such as TiW, TiN, W, WSi, and the like, for the first conducive material (barrier metal). Further, it is possible to use a material other than tungsten such as Cu, Al, WSi, or the like, for the second conductive material. Further, the material for the first conductive material and the second conductive material are not limited to the materials listed above.

Further, while the top edge of the barrier metal 51 is formed with a separation from the top edge of the first contact hole 43 and the top surface of the tungsten 53 in the first contact hole 43 and the tapered shape is formed at the top peripheral part of the tungsten plug 53 and the top edge part of the first contact hole 43, and that the reverse sputtering residue 55 is formed in the embodiments explained with reference to FIGS. 28A-28C and FIGS. 30A-30C through FIGS. 34A-34C, the structure of the first contact hole 43 of the fourth mode of the present invention is by no means limited to this specific structure.

For example, in the case the Ar reverse sputtering processing is not used before formation of the CrSi thin-film for the CrSi thin-film resistance 21, there is formed no tapered shape at the top outer periphery of the tungsten plug 53 or at the top edge part of the first contact hole 43, and no reverse sputtering residue 55 is formed.

Further, in the example explained with reference to FIGS. 29A-29E, the CrSi thin-film resistance 21 is formed (step (4)) after formation of the second layer metal interconnection pattern 37 (steps (2) and (3)), while it is also possible to form the second layer metal interconnection pattern 37 after formation of the CrSi thin-film resistance 21. In this case, the top edge part of the barrier metal film 51 is not removed in the first contact hole 43, and it becomes possible to planarize the top surface of the first conductive plug 47. It should be noted that no tapered shape is formed at the top outer periphery of the tungsten plug 53 or the top edge part of the first contact hole 43 or no reverse sputtering residue 55 is formed in the case the Ar reverse sputtering is applied immediately before formation of the CrSi thin-film for the CrSi thin-film resistance 21.

However, in order to prevent etching of the CrSi thin-film resistance 21 at the time of formation of the second layer metal interconnection pattern 37 after formation of the CrSi thin-film resistance 21, it is preferable to form a protective insulation film on the top surface of the CrSi thin-film resistance 21. For such a protective insulation film, it is possible to use the CrSiN film 30 explained with FIGS. 13A and 13B or a silicon nitride film formed by a known process.

Alternatively, a laminated film of the CrSiN film 30 and the silicon nitride film may be used.

Heretofore, the embodiments of the first through fifth modes are explained. While the foregoing embodiments describes the example of using a TiN film for the refractory metal film 9, 33 or 57 formed on the top surface of the metal interconnection pattern, the refractory metal film constituting the metal interconnection pattern is by no means limited to this, but other refractory metal films such as TiW or WSi may also be used.

Further, while the experiments explained with reference to FIGS. 1A and 1B through FIGS. 34A-34C uses CrSi for the material of the metal thin-film resistance, while the present invention is not limited to this, but other materials such as NiCr, TaN, CrSi2, CrSiN, CrSi, CrSiO, and the like, may also be used for the metal thin-film resistance.

Further, while the foregoing embodiments explain the present invention as applied to a semiconductor device having the metal interconnection pattern of single layer, dual layer, or triple layer, the present invention is by no means limited to this and it is possible to apply the present invention to the semiconductor devices having a multilayer interconnection structure in which there are provided four or more layers of metal interconnection patterns. Thereby, the metal interconnection pattern to which the metal thin-film resistance is connected for electrical connection may be the metal interconnection pattern of any layer.

Further, the laser beam interruption film disposed underneath the metal thin-film resistance may be formed together with the metal interconnection pattern of any layer, as long as it is located underneath the metal thin-film resistance. Further, the laser beam interruption film may be formed of a metal material formed separately to the metal interconnection pattern.

In the embodiments of the first mode, second mode and third mode noted above, the first layer metal interconnection pattern 11, the second layer interconnection pattern 37 or the third layer metal interconnection pattern 59 is used as the uppermost metal interconnection pattern. Further, in the embodiments of the fourth mode, the second layer metal interconnection pattern 37 or the third layer metal interconnection pattern 59, which is one layer above the metal interconnection pattern to which the CrSi thin-film resistance 21 is connected, is used ad the uppermost metal interconnection pattern.

With this, the degree of freedom of design is improved such as achieving the layout change of the CrSi thin-film resistance 21 by way of the layout change of the CrSi thin-film resistance 21 and the uppermost metal interconnection pattern.

Further, because the passivation film 23 of insulation material is formed over the CrSi thin-film resistance 21 except of the thin CrSiN film 30, it becomes possible to reduce the variation of thickness of the insulating material over provided the CrSi thin-film resistance 21 together with the thickness thereof as compared with the case in which the insulation film other than the final protective film is formed over the metal thin-film resistance. With this, variation of laser energy provided to the CrSi thin-film resistance 21 is reduced at the time of trimming the CrSi thin-film resistance 21 with the laser beam, by reducing the variation of laser interference caused by the insulating material on the CrSi thin-film resistance 21. Thereby, precision of the trimming is improved, and it is further possible to improve the efficiency of heat radiation when there is caused a temperature rise in the CrSi thin-film resistance at the time of the trimming as a result of the laser beam irradiation.

Further, while there is formed a refractory metal film on the top surface of the metal interconnection patterns used for the metal interconnection patterns 11, 37 and 59 in the foregoing embodiments, the present invention is by no means limited to such a construction and it is possible to use a metal pattern not carrying a refractory metal film thereon for the metal interconnection pattern. In the case an Al alloy is used for the metal pattern, there is formed a strong native oxide film on the surface of the metal pattern, and thus, it is preferable to remove the native oxide film from the surface of the metal pattern at the bottom of the contact hole after the formation of the contact hole but before the formation of the metal thin-film for the formation of the metal thin-film resistance. It should be noted that such native oxide film removal process may be conducted by way of the Ar reverse sputtering process conducted primarily for suppressing the aging of resistance value of the metal thin-film resistance. Further, the metal interconnection pattern is not limited to those containing an Al alloy but the metal interconnection patterns of other metals such as a Cu interconnection pattern formed by a so-called damascene process may also be used.

The metal thin-film resistance constituting the semiconductor device of the present invention can be used for example in a semiconductor device having an analog circuit. Hereinafter, an embodiment of the semiconductor device having an analog circuit that uses such a metal thin-film resistance will be explained.

Figure 35:
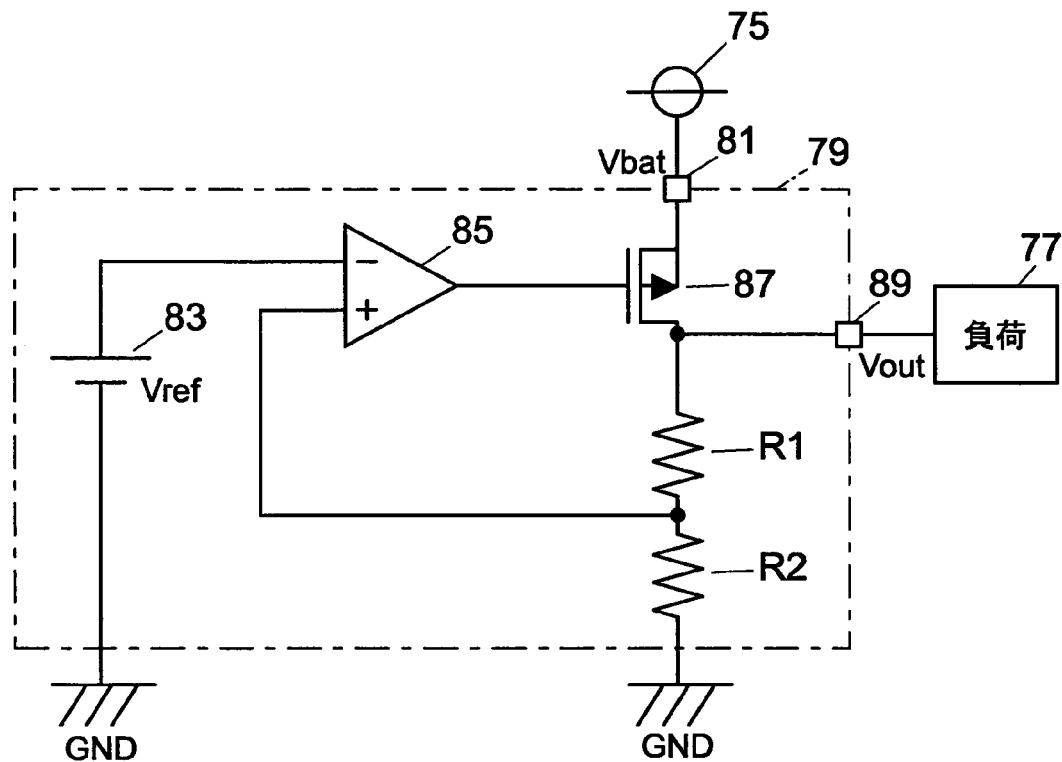
FIG. 35 is a circuit diagram showing an embodiment of the semiconductor device having an analog constant voltage generator circuit.

FIG. 35 is a circuit diagram showing an embodiment of the semiconductor device having an analog circuit that forms a constant voltage generator.

Referring to FIG. 35, there is provided a constant voltage generator 79 for supplying a stabilized power from a D.C. power supply 75 to a load 77. Thereby, it should be noted that the constant voltage generator 79 includes: an input terminal (Vbat) 81 to which the D.C. power supply 75 is connected; a reference voltage generator (Vref) 83; an operational amplifier (comparator) 85, a p-channel MOS transistor (designated hereinafter as PMOS) 87 constituting an output driver; voltage dividers R1 and R2; and an output terminal (Vout) 39.

In the operational amplifier 851 of the constant voltage generator 79, the output terminal thereof is connected to the gate electrode of the PMOS 87 and the reference voltage Vref of the reference voltage generator 83 is supplied to an inversion input terminal (−) thereof. Further, a voltage obtained by dividing the output voltage Vout by the resistance elements R1 and R2 is supplied to the non-inversion input terminal (+) thereof, and the voltage dividend out by the resistance elements R1 and R2 is controlled to be equal to the reference voltage Vref.

Figure 36:
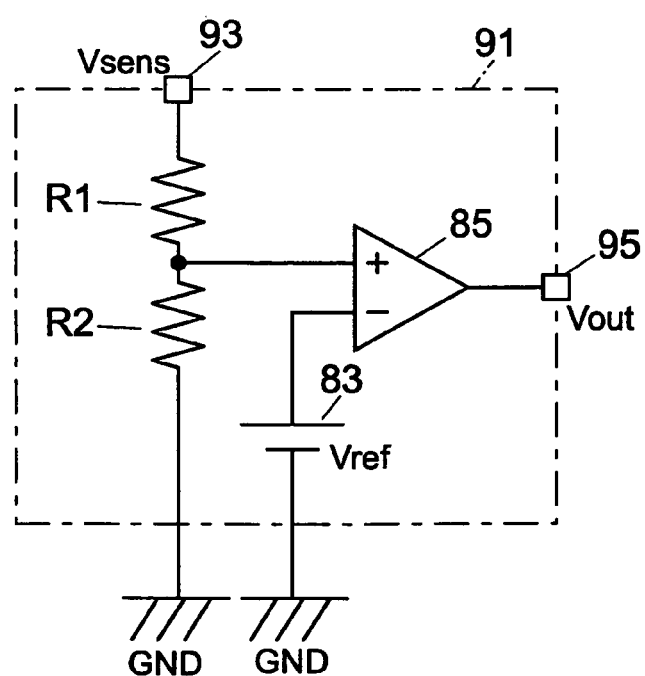
FIG. 36 is a circuit diagram showing an embodiment of the semiconductor device having an analog voltage detection circuit.

FIG. 36 is a circuit diagram showing an embodiment of the semiconductor device having an analog voltage detector.

Referring to FIG. 36, the voltage detector 91 includes an operational amplifier 85 having an inversion input terminal (−) connected to a reference voltage gubernator 83, wherein the inversion input terminal is supplied with a reference voltage Vref from the reference voltage generator 83. Further, the voltage of an input terminal 93 supplied for voltage detection is divided by the resistances R1 and R2 and the divided voltage is supplied to a non-inversion input terminal (+) of the operational amplifier 85. The output of the operational amplifier 85 is output via an output terminal (Vout) 95.

In such a voltage detector 91, it should be noted that the output of the operational amplifier 85 maintains a high level state (H) in the case the input voltage of the input terminal for voltage detection is high and the divided voltage divided out by the resistances R1 and R2 is higher than the reference voltage Vref. On the other hand, when the voltage to be measured has dropped and the voltage divided by the resistance elements R1 and R2 has decreased below the reference voltage Vref, the output of the operational amplifier 85 turns to the low level state (L).

Generally, the constant voltage generator of FIG. 35 or the voltage detector of FIG. 36 adjusts the resistance value of the resistance elements constituting the voltage divider by using an adjustable resistance circuit capable of changing the resistance value thereof by selectively disconnecting a fuse element for the resistance circuit (called voltage divider) or by using a voltage divider in which the resistance value is adjustable by irradiation of laser beam to the resistance elements, in view of variation of the reference voltage Vref of the reference voltage generator caused by the variation at the time of the fabrication process.

Figure 37:
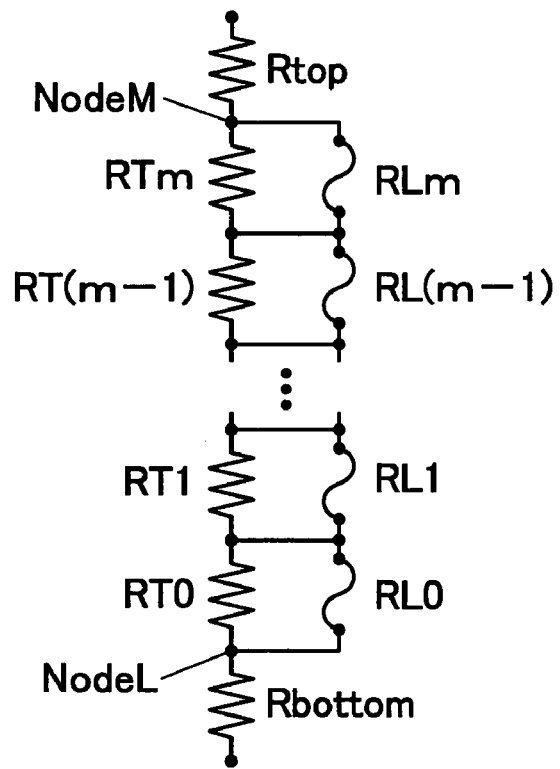
FIG. 37 is a circuit diagram showing an embodiment of the semiconductor device having an analog voltage divider circuit.
Figure 38:
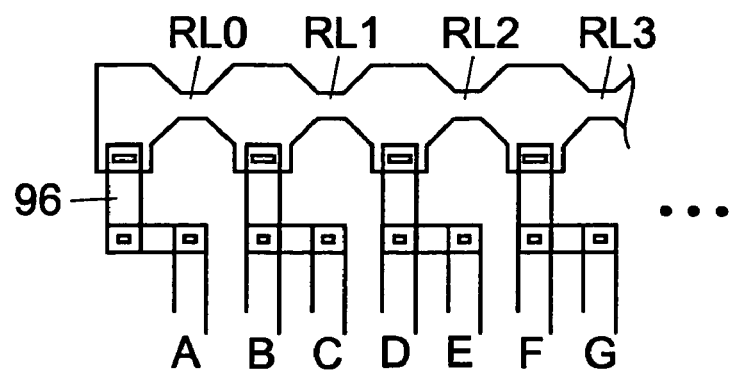
FIG. 38 is a layout diagram showing an example of the layout of the fuse element used in the voltage divider circuit.
Figure 39:
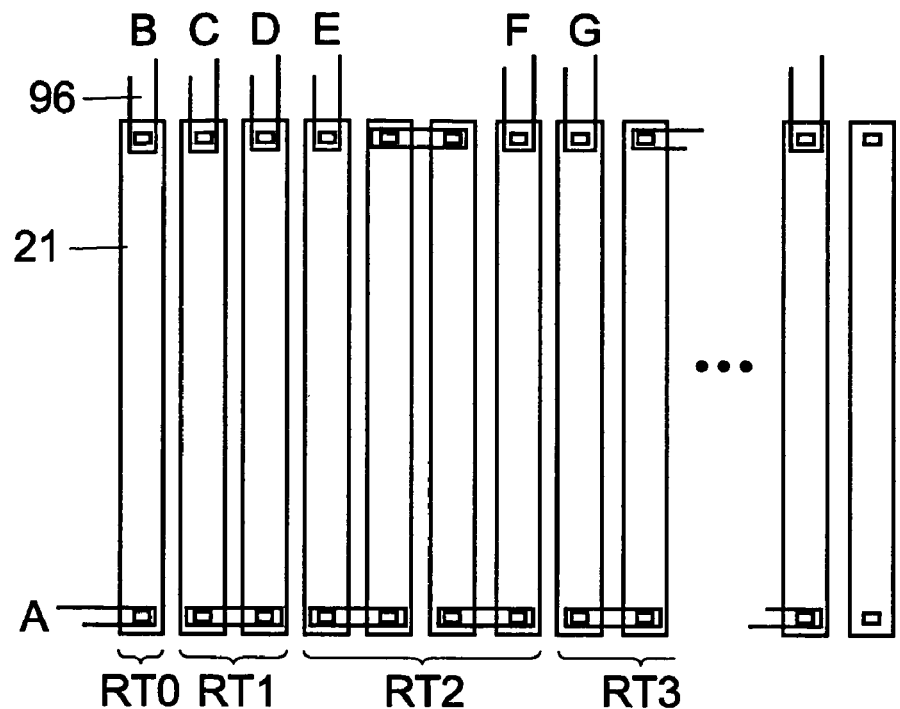
FIG. 39 is a layout diagram showing an example of the layout of the metal thin-film resistance forming the voltage divider circuit.

FIG. 37 is a circuit diagram showing an example of such an adjustable resistance circuit to which the metal thin-film resistance of the present invention is applied, while FIGS. 38 and 39 are layout diagrams showing the examples of layout of the adjustable resistance circuit. Thereby, FIG. 38 shows the layout of the part of the fuse element while FIG. 39 shows the layout of the part of the resistance element.

As shown in the circuit diagram of FIG. 37, the adjustable resistance circuit includes a serial connection of m+1 resistance elements RT0, RT1, . . . , RTm inserted between a resistance element Rbottom and a resistance element Rtop, wherein it will be noted that the resistance elements RT0, RT1, . . . , RTm are provided with respective fuse elements RL0, RL1, . . . , RLm in parallel therewith.

As shown in FIG. 38, each of the fuse elements RL0, RL1, . . . , RLm is formed of a polysilicon pattern having a sheet resistance of 20-40 Ω.

Thereby, the resistance value of the resistance elements RT0, RT1, . . . , RTm is set such that the resistance value thereof increases twice in element to element in the direction form the resistance element Rbottom to the resistance element Rtop. Thus, the resistance element RTn has a resistance value of 2n times as large as the resistance value of the resistance element RT0.

For example, as shown in FIG. 39, the resistance element R0 is formed of a single CrSi thin-film resistance element 21 of the CrSi thin-film. In this case, therefore, the resistance RTn is formed of 2n CrSi thin-film resistance elements 21. Reference should be made to FIG. 39. Further, while FIG. 39 describes a contact hole, it is also possible to apply the embodiments that use the CrSi thin-film resistance 21 capable of connecting to the metal interconnection patterns without using a contact hole. Further, while not illustrated, it is possible to dispose various constituting elements of the semiconductor integrated circuit such as transistors, capacitors metal interconnection patterns, polysilicon interconnection patterns, impurity diffusion regions, and the like, underneath the metal thin-film resistance.

In FIGS. 38 and 39, it should be noted that electrical connection is achieved by using respective metal interconnection patterns 96 between the numerals A and A, between the numerals B and B, between the numerals C and C, between the numerals D and D, between the numerals E and E, between the numerals F and F, and between the numerals G and G.

Thus, with the voltage divider in which the resistance ratio between different resistance elements is important, a number of unit resistance elements, each formed of a pair of resistance element and a fuse element, is connected in serried and are arranged in a ladder-like form to form the adjustable resistance circuit.

In such an adjustable resistance circuit, a desired serial resistance value is obtained by disconnecting one or more suitable fuse elements RL0, RL1, . . . , RLm by using a laser beam.

According to the semiconductor device of the present invention, at least a part of the constituting elements of the semiconductor integrated circuit other than the metal thin-film resistance is located in the region underneath the metal thin-film resistance, and it becomes possible to reduce the chip area. Thus, it becomes possible to reduce the chip area of the semiconductor device including the voltage divider shown in FIG. 37.

In the case of applying the voltage divider of FIG. 37 to the voltage dividers R1 and R2 of the constant voltage generator 79, an end of the resistance Rbottom is grounded and an end of the resistance Rtop is connected to the drain of PMOS 87. Further, the node NodeL between the resistance elements Rbottom and RT0 or the node NodeM between the resistance elements Rtop and RTm is connected to the non-inverting input terminal of the operational amplifier 85.

According to the metal thin-film resistance constituting the semiconductor device of the present invention, it becomes possible to reduce the chip area of the semiconductor device, and thus, it becomes possible to decrease the chip area of the semiconductor device including the constant voltage generator 79.

Further, when the voltage divider of FIG. 37 is to be used for the resistances R1 and R2 of the voltage detector of FIG. 36, the end of the resistance element Rbottom is grounded and the end of the resistance element Rtop is connected to the input terminal 77. Further, a node NodeL between the resistance elements Rbottom and RT0 or a node NodeM between the resistance elements Rtop and NnodeM is connected to the non-inverting input terminal of the operational amplifier 85.

Thus, with the voltage divider to which the present invention is applied, the chip area of the semiconductor device is reduced and it becomes possible to reduce the chip area of the semiconductor device including the voltage detector 91.

Figure 40:
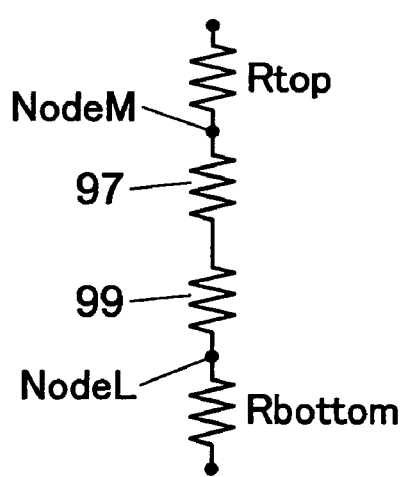
FIG. 40 is a circuit diagram showing another embodiment of the semiconductor device having an analog voltage divider circuit.
Figure 41:
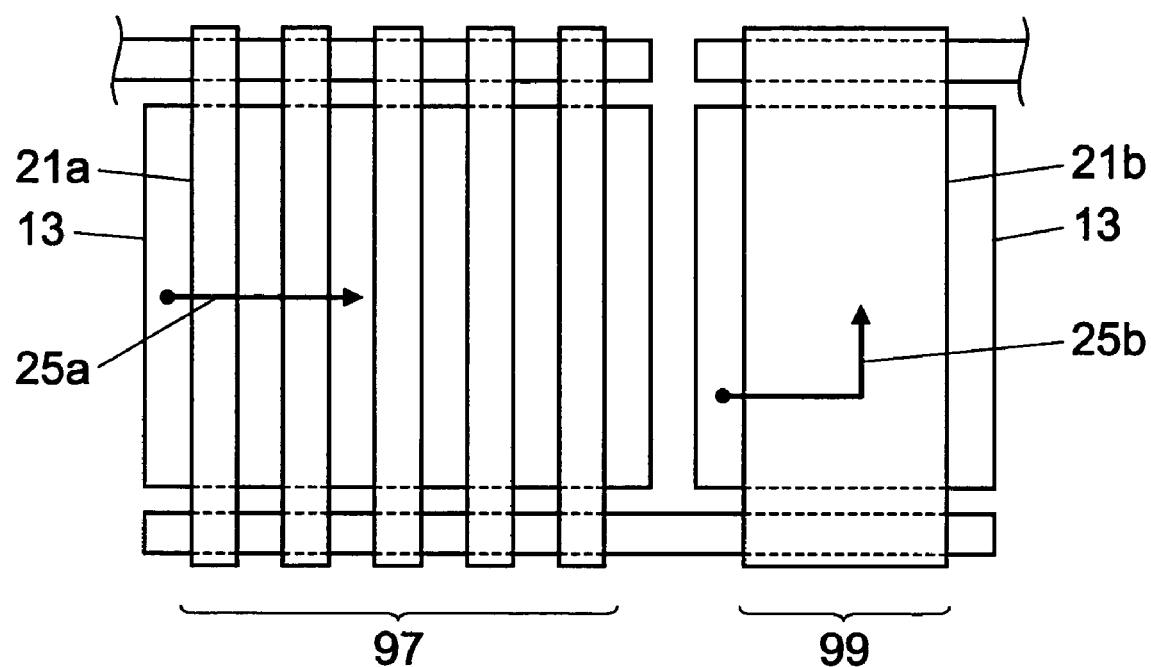
FIG. 41 is a layout diagram showing an example of the layout of the resistance element for coarse adjustment and the resistance element for fine adjustment used in the voltage divider circuit.
Figure 42:
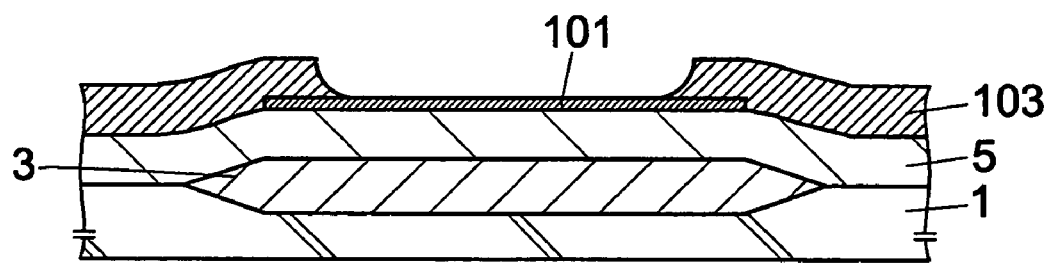
FIG. 42 is a cross-sectional diagram showing a conventional semiconductor device.
Figure 43:
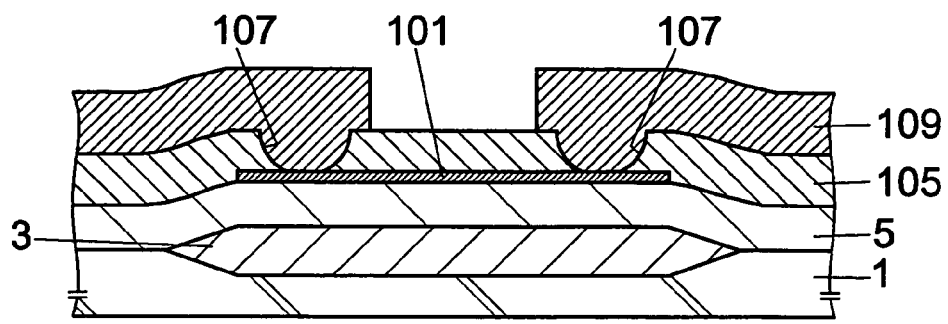
FIG. 43 is a cross-sectional diagram showing another conventional semiconductor device.
Figure 44:
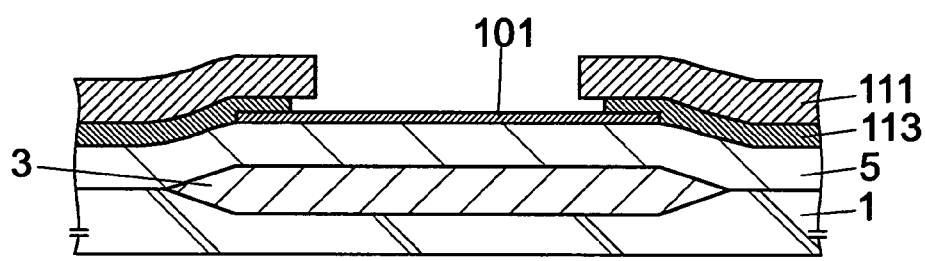
FIG. 44 is a cross-sectional view showing a further conventional semiconductor device.

FIG. 40 is a circuit diagram showing another example of the voltage divider to which the metal thin-film resistance of the present invention is used, while FIG. 41 is a layout diagram showing an example of the layout of the coarse adjustment resistance element and fine adjustment resistance element in the voltage divider circuit.

As shown in FIG. 40, the resistance element Rbottom, the coarse adjustment resistance element 97, the fine adjustment resistance element 99 and the resistance element Rtop are connected in series.

As shown in FIG. 41, the coarse adjustment resistance element 97 is formed of parallel connection of plural band-like metal thin-film resistances 21a, while the fine adjustment resistance element 99 is formed of a plate-like metal thin-film resistance 21a. Underneath the metal thin-film resistances 21a and 21b, the layer beam interruption film 41 is disposed via an insulation film not illustrated. For the metal thin-film resistances 21a and 21b, the metal thin-film constituting the present invention is used. While not illustrated, the constituting element of the semiconductor integrated circuit such as a transistor or capacitor, metal interconnection pattern, polysilicon interconnection pattern, impurity diffusion element, and the like, is disposed underneath the laser beam interruption film 41.

With such a voltage divider circuit, arbitrary number of metal thin-film resistances 21a are disconnected or modified by the laser beam 25a and a desired serial resistance value is achieved by modifying an arbitrary region of the metal thin-film resistance 21b by disconnection or modification by the laser beam 25b.

According to the metal thin-film resistance and the laser beam interruption film constituting the semiconductor device of the present invention, at least a part of the constituting elements of the semiconductor integrated circuit other than the metal thin-film resistance is disposed in the region underneath the metal thin-film resistance, and it becomes possible to reduce the chip area. Thus, it becomes possible to reduce the chip area of the semiconductor device including the voltage divider shown in FIG. 40.

Further, because the laser beam interruption film is disposed underneath the metal thin-film resistance, irradiation of laser beam upon the constituting elements of the semiconductor integrated circuit or the semiconductor substrate is prevented even when the laser beam is irradiated with the intensity sufficient for disconnecting or causing modification in the metal thin-film resistance, and it becomes possible to improve the precision of output voltage of the voltage divider circuit.

In the case of applying the voltage divider circuit of FIG. 40 to the resistor elements R1 and R2 of the constant voltage generator 79, an end of the resistance element Rbottom is grounded and an end of the resistance element Rtop is connected to the drain of the PMOS 87. Further, the node NodeL between the resistance element Rbottom and the fine adjustment resistance element 99 or the node NodeM between the resistance element Rtop and the coarse adjustment resistance element 97 is connected to the non-inverting input terminal of the operational amplifier 85.

Because the chip area of the semiconductor device is reduced and the precision of the output voltage of the voltage divider circuit shown in FIG. 40 is improved in the voltage divider circuit to which the metal thin-film resistance and the laser beam interruption film of the present invention are applied, it is possible to reduce the chip area of the semiconductor device including the constant voltage generator 79 and stabilize the output voltage of the constant voltage generator 79.

In the case of applying the voltage divider circuit of FIG. 40 to the resistor elements R1 and R2 of the voltage detector 91 shown in FIG. 36, an end of the resistance element Rbottom is grounded and an end of the resistance element Rtop is connected to the input terminal 93. Further, the node NodeL between the resistance element Rbottom and the fine adjustment resistance element 99 or the node NodeM between the resistance element Rtop and the coarse adjustment resistance element 97 is connected to the non-inverting input terminal of the operational amplifier 85.

Because the chip area of the semiconductor device is reduced and the precision of the output voltage of the voltage divider circuit shown in FIG. 40 is improved in the voltage divider circuit to which the metal thin-film resistance and the laser beam interruption film of the present invention are applied, it is possible to reduce the chip area of the semiconductor device including the voltage detector 91 and stabilize the output voltage of the voltage detector 91.

While description has been made with reference to FIGS. 35-41 with regard to the example of the semiconductor device having the voltage divider with the construction of disposing the constituting elements of the semiconductor integrated circuit underneath the metal thin-film resistance of the present invention or the construction of the semiconductor device of disposing the laser beam interruption film underneath the metal thin-film resistance, the semiconductor device applied with such a voltage divider circuit is not limited to the semiconductor device having a constant voltage generator or the semiconductor device having a voltage detector, but the present invention can be applied to any semiconductor device having a voltage divider circuit.

Further, the construction of the semiconductor device of disposing the constituting elements of the semiconductor integrated circuit underneath the metal thin-film resistance or disposing the additional laser beam interruption film underneath the metal thin-film resistance of the present invention is by no means limited to the semiconductor device having a voltage divider circuit, but the present invention is applicable to any semiconductor device having a metal thin-film resistance.

Further, the present invention is by no means limited to the embodiments described heretofore, but various variations and modifications may be made without departing from the scope of the invention. It should be noted that the size, shape, material and arrangement explained heretofore are merely for the purpose of example.

The present application is based on the Japanese priority application 2004-057115 filed on Mar. 2, 2004, the entire contents of which are incorporated herein as reference.

What is claimed is:

1. A semiconductor integrated circuit device, comprising:
   a lower insulation film formed over a semiconductor substrate;
   a metal interconnection pattern formed over said lower insulation film;
   an underlying insulation film formed over said metal interconnection pattern;
   a contact hole formed in said underlying insulation film; and
   a resistor formed of a metal thin-film over said underlying insulation film so as to extend from a top surface of said underlying insulation film into said contact hole,
   wherein said resistor formed of a metal thin-film is in electrical contact with said metal interconnection pattern in said contact hole,
   wherein at least a portion of said semiconductor integrated circuit device other than said resistor formed of a metal thin-film is disposed in a region underneath said resistor formed of a metal thin-film, and
   wherein said metal interconnection pattern comprises a metal pattern and a refractory metal film formed at least on a top surface of said metal pattern.

2. The semiconductor integrated circuit device as claimed in claim 1, wherein said metal interconnection pattern is an uppermost metal interconnection pattern.

3. The semiconductor device as claimed in claim 1, further comprising a laser beam interruption film formed of a metal material in said region underneath said resistor formed of a metal thin-film between said underlying insulation film and said portion of said semiconductor integrated circuit device.

4. The semiconductor integrated circuit device as claimed in claim 1, wherein said portion of said portion of said semiconductor integrated circuit device disposed in said region underneath said resistor formed of a metal thin-film comprises a transistor.

5. The semiconductor integrated circuit device as claimed in claim 1, wherein said portion of said semiconductor integrated circuit device disposed underneath said resistor formed of a metal thin-film comprises a capacitor.

6. The semiconductor integrated circuit device as claimed in claim 1, wherein said constituting elements of said semiconductor integrated circuit disposed underneath said resistor formed of a metal thin-film comprises a metal interconnection pattern.

7. The semiconductor integrated circuit device as claimed in claim 1, wherein said portion of said semiconductor integrated circuit device disposed underneath said resistor formed of a metal thin-film comprises a polysilicon interconnection pattern.

8. The semiconductor integrated circuit device as claimed in claim 1, wherein said portion of said semiconductor integrated circuit device disposed underneath said resistor formed of a metal thin-film comprises an impurity diffusion region.

9. The semiconductor integrated circuit device as claimed in claim 1, wherein said resistor formed of a metal thin-film has a thickness of 5-1000 Angstroms.

10. The semiconductor device as claimed in claim 1, wherein said underlying insulation film is planarized.

11. A semiconductor integrated circuit device, comprising:
- a lower insulation film formed over a semiconductor substrate;
- a metal interconnection pattern formed over said lower insulation film;
- an underlying insulation film formed over said metal interconnection pattern;
- a contact hole formed in said underlying insulation film; and
- a resistor formed of a metal thin-film over said underlying insulation film so as to extend from a top surface of said underlying insulation film into said contact hole;
- wherein said resistor formed of a metal thin-film is in electrical contact with said metal interconnection pattern in said contact hole,
- wherein at least a portion of said semiconductor integrated circuit device other than said resistor formed of a metal thin-film is disposed in a region underneath said resistor formed of a metal thin-film,
- wherein said contact hole has a tapered form at least at a top edge part thereof,
- wherein said contact hole further comprises a reverse sputtering residue on an inner wall surface of said contact hole, and
- wherein said reverse sputtering residue comprises materials of said metal interconnection pattern, materials of said underlying insulation film, and argon.

* * * * *